US012631970B2

(12) United States Patent
Baselmans et al.

(10) Patent No.: US 12,631,970 B2
(45) Date of Patent: *May 19, 2026

(54) IMAGING VIA ZEROTH ORDER SUPPRESSION

(71) Applicant: ASML NETHERLANDS B.V., Veldhoven (NL)

(72) Inventors: Johannes Jacobus Matheus Baselmans, Oirschot (NL); Duan-Fu Stephen Hsu, Fremont, CA (US); Willem Jan Bouman, Moergestel (NL); Frank Jan Timmermans, Eindhoven (NL); Marie-Claire Van Lare, Utrecht (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/532,977

(22) Filed: Dec. 7, 2023

(65) Prior Publication Data

US 2024/0219843 A1 Jul. 4, 2024

Related U.S. Application Data

(63) Continuation of application No. 17/415,101, filed as application No. PCT/EP2019/084825 on Dec. 12, 2019, now Pat. No. 11,892,776.

(Continued)

(51) Int. Cl.
*G03F 7/00* (2006.01)

(52) U.S. Cl.
CPC ................................. *G03F 7/70308* (2013.01)

(58) Field of Classification Search
CPC ........... G03F 7/70308; G03F 7/70408; H04N 23/00; H04N 23/60; G03B 17/12;
(Continued)

(56) References Cited

U.S. PATENT DOCUMENTS 4,947,413 A * 8/1990 Jewell ................. G03F 7/70308
378/34
5,773,171 A 6/1998 Lee et al.
(Continued)

FOREIGN PATENT DOCUMENTS

EP 0806707 11/1997
TW 200725191 7/2007
(Continued)

OTHER PUBLICATIONS

International Search Report and Written Opinion issued in corresponding PCT Patent Application No. PCT/EP2019/084825, dated Apr. 1, 2020.

*Primary Examiner* — Deoram Persaud
(74) *Attorney, Agent, or Firm* — Pillsbury Winthrop Shaw Pittman LLP

(57) ABSTRACT

Apparatuses and techniques for suppressing a zeroth order portion of a configured radiation beam. In some embodiments, an extreme ultraviolet (EUV) lithographic apparatus for forming an image on a substrate by use of an EUV radiation beam that is configured by a patterning device comprising a pattern of reflective regions and partially reflective regions, wherein the partially reflective regions are configured to suppress and apply a phase shift to a portion of the EUV radiation beam, may include a projection system. The projection system may be configured to suppress a zeroth order portion of a configured EUV radiation beam, and direct an unsuppressed portion of a configured EUV radiation beam towards a substrate to form an image on the substrate.

20 Claims, 41 Drawing Sheets

Related U.S. Application Data

(60) Provisional application No. 62/895,631, filed on Sep. 4, 2019, provisional application No. 62/787,010, filed on Dec. 31, 2018.

(58) Field of Classification Search
CPC ............ G03B 17/55; G03B 2205/0084; G03B 3/10; G03B 30/00; G02B 26/004; G02B 3/14; G02B 3/12
See application file for complete search history.

(56) References Cited

U.S. PATENT DOCUMENTS

| | | | |
|---|---|---|---|
| 7,751,030 B2 | 7/2010 | Markoya et al. | |
| 2002/0030802 A1* | 3/2002 | Sugita ................. | G03F 7/70216 355/67 |
| 2005/0046846 A1 | 3/2005 | Chandhok | |
| 2006/0170896 A1 | 8/2006 | Markoya et al. | |
| 2007/0121090 A1 | 5/2007 | Chen et al. | |
| 2007/0177123 A1* | 8/2007 | Tel .......................... | G03F 7/701 355/69 |
| 2007/0252968 A1* | 11/2007 | Ohkubo .............. | G03F 7/70141 355/68 |
| 2007/0263269 A1* | 11/2007 | Flagello .............. | G03F 7/70341 430/394 |
| 2011/0027704 A1 | 2/2011 | Cramer et al. | |
| 2011/0032499 A1* | 2/2011 | Kawashima ........... | G03B 27/42 355/53 |
| 2011/0043791 A1 | 2/2011 | Smilde et al. | |
| 2012/0242970 A1 | 9/2012 | Smilde et al. | |
| 2013/0044302 A1 | 2/2013 | Mulder et al. | |
| 2015/0109624 A1* | 4/2015 | Kreuzer ................ | F25D 11/003 356/508 |
| 2016/0025480 A1* | 1/2016 | Goodwin ........... | G01B 9/02097 356/498 |
| 2016/0033328 A1 | 2/2016 | Walters | |
| 2020/0073251 A1* | 3/2020 | Smith ..................... | G03F 7/702 |
| 2020/0209608 A1* | 7/2020 | Beukman ............ | G03F 7/70633 |
| 2020/0264522 A1* | 8/2020 | De Winter ......... | G03F 7/70641 |

FOREIGN PATENT DOCUMENTS

| | | |
|---|---|---|
| TW | 201403255 | 1/2014 |
| WO | 2009078708 | 6/2009 |
| WO | 2009106279 | 9/2009 |
| WO | 2014001071 | 1/2014 |
| WO | 2020221547 | 11/2020 |

* cited by examiner

610

614a

614b

612

$$\frac{\lambda}{\frac{1}{2}\sqrt{3} \cdot P_o} = (1 - \sigma) \cdot NA$$

$$\frac{\lambda}{\frac{3}{2} \cdot P_i} = (1 - \sigma) \cdot NA$$

1102a

1104d

1104a

1100

1102d

1106

1102b

1104c

1104b

1102c

1122d

1124a

1124a

1120

1124d

1126

1122c

1124b

1122b

1124c 1242a
1244a
1244c
1246
1242b
1242c
1244b
1240

1264a
1262a
1262c
1266
1264c
1264b
1262b
1260

1300

1302

1304

1306

2000

IMAGING VIA ZEROTH ORDER SUPPRESSION

This application is a continuation of U.S. patent application Ser. No. 17/415,101, filed on Jun. 17, 2021, which is the U.S. national phase entry of PCT Patent Application No. PCT/EP2019/084825, filed Dec. 12, 2019, which claims the benefit of priority of U.S. Patent Application No. 62/787,010, filed on Dec. 31, 2018, and of U.S. Patent Application No. 62/895,631, filed on Sep. 4, 2019, each of the foregoing applications is incorporated herein in its entirety by reference.

FIELD

The present disclosure relates to techniques and systems of improving a resolution for imaging of features on a target. The present disclosure further related to techniques and systems of improving imaging by suppressing a zeroth diffraction order. The techniques and systems may be used in connection with a lithographic apparatus.

BACKGROUND

A lithography apparatus is a machine that applies a desired pattern onto a target portion of a substrate. Lithography apparatuses can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., including part of or all of one or several dies) on a substrate (e.g., a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Features and advantages of the invention, as well as the structure and operation of various embodiments are described in detail below with reference to the accompanying drawings. It is noted that the invention is not limited to the specific embodiments described herein. Such embodiments are presented herein for illustrative purposes only. Additional embodiments will be apparent to persons skill in the skilled in the relevant art(s) based on the teachings contained herein.

In an aspect, a lithographic apparatus including a patterning device and a projection system is described. The patterning device may include one or more two-dimensional (2D) features. The patterning device may be configured to shape a radiation beam output from a source. The projection system may be configured to suppress at least a zeroth order portion of the shaped radiation beam. The projection system may also be configured to direct an unsuppressed portion of the shaped radiation beam towards a substrate to form an image on the substrate according to the one or more 2D features.

In another aspect, a method is provided. The method may include causing a radiation beam, output by a source, to be shaped by a patterning device including one or more two-dimensional (2D) features; causing, via a projection system, at least a zeroth order portion of the shaped radiation beam to be suppressed; and directing, via the projection system, an unsuppressed portion of the shaped radiation beam towards a substrate to form an image on the substrate according to the one or more 2D features.

In yet another aspect, a projection system included within an extreme ultraviolet (EUV) lithographic apparatus is provided. The projection system may include a filter configured to suppress at least a zeroth order portion of an EUV shaped radiation beam, where an EUV radiation beam output from a source is shaped via one or more two-dimensional (2D) features of a patterning device to form the shaped EUV radiation beam. The projection system may further include one or more reflective elements configured to direct an unsuppressed portion of the shaped EUV radiation beam towards a substrate to form an image on the substrate according to the one or more 2D features.

In an aspect, a lithographic apparatus configured to project, via a radiation beam, a pattern of a patterning device onto a substrate, wherein the patterning device is configured to shape the radiation beam in accordance with the pattern, is provided. The lithographic apparatus may include a projection system. The projection system may be configured to suppress a zeroth order portion of a shaped radiation beam, and direct an unsuppressed portion of the shaped radiation beam to a substrate.

In another aspect, a method for projecting, via a radiation beam, a pattern of a patterning device onto a substrate, wherein the patterning device is configured to shape the radiation beam in accordance with the pattern, is provided. The method may include causing, via a projection system, a zeroth order portion of a shaped radiation beam to be suppressed; and directing, via the projection system, an unsuppressed portion of the shaped radiation beam towards a substrate to form an image on the substrate.

In yet another aspect, a projection system incorporated within a lithographic apparatus configured to project, via a radiation beam, a pattern of a patterning device onto a substrate, wherein the patterning device is configured to shape the radiation beam in accordance with the pattern, is provided. The projection system may include a filter configured to suppress a zeroth order portion of a shaped radiation beam, wherein an unsuppressed portion of the shaped radiation beam is directed towards a substrate to form an image on the substrate.

In an aspect, an extreme ultraviolet (EUV) lithographic apparatus for forming an image on a substrate by use of an EUV radiation beam that is configured by a patterning device comprising a pattern of reflective regions and partially reflective regions, wherein the partially reflective regions are configured to suppress and apply a phase shift to a portion of the EUV radiation beam, is provided. The EUV lithographic apparatus may include a projection system. The projection system may be configured to suppress a zeroth order portion of a configured EUV radiation beam, and direct an unsuppressed portion of the configured EUV radiation beam towards a substrate to form an image on the substrate.

In another aspect, an extreme ultraviolet (EUV) lithographic apparatus is provided. The EUV lithographic apparatus may include a patterning device support structure configured to support a patterning device comprising a pattern of reflective regions and partially reflective regions, wherein the patterning device is configured to shape an EUV radiation beam to form a shaped EUV radiation beam, and wherein the partially reflective regions are configured to suppress and apply a phase shift to a portion of the shaped EUV radiation beam. The EUV lithographic apparatus may also include a projection system configured to suppress a zeroth order portion of the shaped EUV radiation beam, and direct an unsuppressed portion of the shaped EUV radiation beam towards a substrate to form an image on the substrate.

In yet another aspect, a method is provided. The method may include generating an extreme ultraviolet (EUV) radiation beam; applying a phase shift to a portion of the EUV radiation beam; suppressing a zeroth order portion of the phase shifted EUV radiation beam; and directing, via a projection system, an unsuppressed portion of the phase shifted EUV radiation beam towards a substrate to form an image on the substrate.

BRIEF DESCRIPTION OF THE DRAWINGS

Embodiments of the invention will now be described, by way of example, with reference to the accompanying drawings in which.

DETAILED DESCRIPTION

Figure 1:
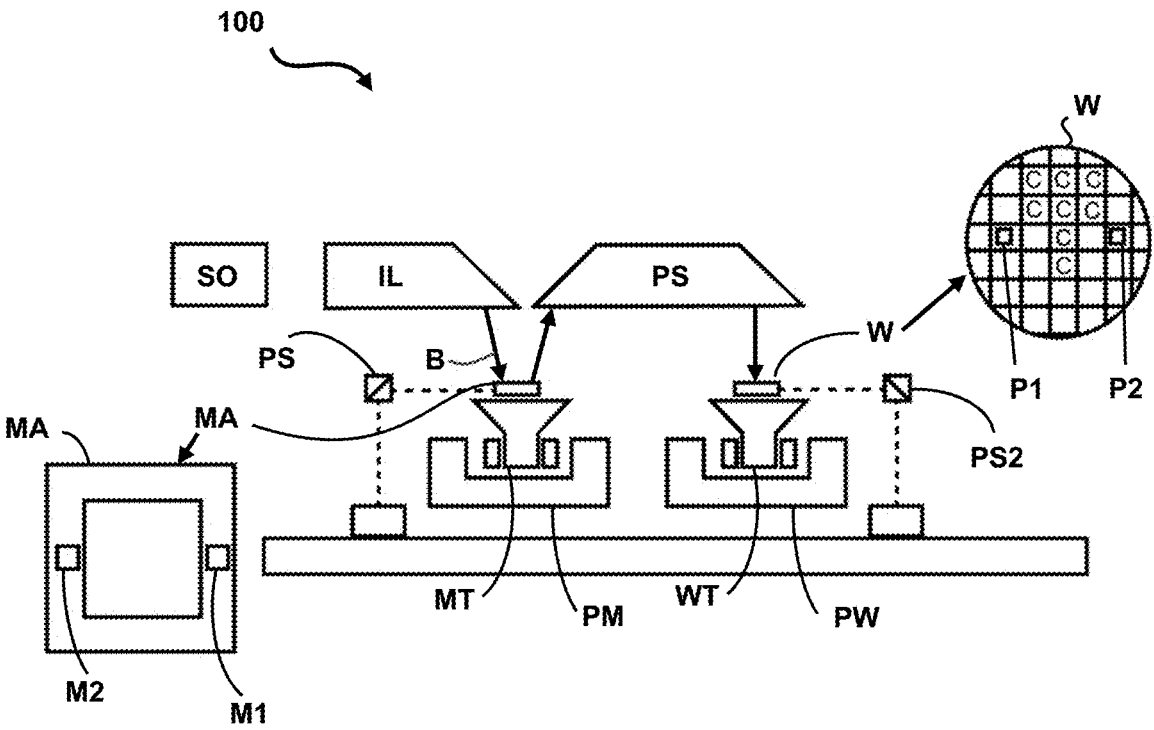
FIG. 1 is a schematic illustration of an extreme ultraviolet (EUV) lithographic projection apparatus, in accordance with various embodiments.

Lithography apparatuses, also referred to as lithographic apparatuses, can be used, for example, to print patterns onto substrates. In some embodiments, lithographic apparatuses may be used to print multiple patterns. Furthermore, in some embodiments, lithographic apparatus may be configured to perform interferometric printing. Such lithographic apparatuses, which may be referred to as interferometric printers, may be used to form features and patterns of features, such as lines, holes, etc., on a substrate, typically with high contrast. Examples of lithographic apparatuses that perform interferometric printing are described in commonly assigned U.S. Pat. No. 7,751,030, filed on Feb. 1, 2005, and which issued on Jul. 6, 2010, the disclosure of which is incorporated herein by reference in its entirety. The features and patterns formed using such lithography apparatus are typically one-dimensional (1D). The 1D patterns formed by such lithography apparatuses are made using two diffraction orders (e.g., +/−1 order), however in two-dimensional (2D) interferometric printing additional diffraction orders may be present (e.g., +/−1, +/−1 orders), which increases the complexity of the printing.

As mentioned above, in interferometric printing, contrast can be important. This is particularly the case when working with extreme ultra-violet (EUV) radiation (e.g., having a wavelength in the range of 5-20 nm). Contrast can be a limiting factor in printing features, such as 2D features, onto substrates. By improving contrast, a variety of benefits can be achieved, such as increasing the yield of IC output.

Techniques are therefore needed to create low contrast, high depth of focus, low mask error factor, and high resolution in the setting of EUV interferometric printing.

In some embodiments of the present disclosure, a projection system of a lithographic apparatus may include a filter to suppress a zeroth order portion of a radiation beam after diffraction from a patterning device. By removing the zeroth order portion, the first order portions (+/−1, +/−1) of the radiation, used to print on a substrate, may be increased without requiring the overall power input to the lithographic apparatus be increased. In some embodiments, the projection system may further include blocking elements configured to suppress interference between first order portions as well as, or alternative, suppress higher order portions (e.g., non-zeroth order portions) from reducing the intensity of the first order portions. In some embodiments, a patterning device (e.g., a mask or reticle) may be of a phase shift type, referred to commonly as a phase shift mask, which is configured to apply a phase shift to an incident radiation beam. The phase shift applied by such a phase shift mask may suppress a zeroth order portion of a diffracted beam so that interferometric printing may be performed using the first order portions. For example, the phase shift mask may include 2D features, and may apply a 0 and 180-degree phase shift, or a 0-degree, 120-degree, and −120-degree phase shift to the incident radiation beam. The phase shift mask may suppress the zeroth order portion of the incident radiation beam as a result of destructive interference of the radiation beam, while constructive interference of the incident radiation beam may increase the intensity of the first order portions. In some embodiments, a phase shift mask including 2D features that is configured to apply a 0-degree and 180-degree phase shift may result in a factor of four intensity increase of the first order portions at a same input power level for a lithographic apparatus. In some embodiments, a phase shift mask including 2D features that is configured to apply a 0-degree, 120-degree, and −120-degree phase shifts may result in a factor of eight intensity increase of the first order portions at for a same input power for a lithographic apparatus.

FIG. 1 schematically depicts another exemplary lithographic projection apparatus 100 that includes:

a source collector module SO to provide radiation.

an illumination system (illuminator) IL configured to condition a radiation beam B (e.g. EUV radiation) from the source collector module SO.

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the lithographic apparatus 100 is of a reflective type (e.g. employing a reflective mask). It is to be noted that because most materials are absorptive within the EUV wavelength range, the patterning device may have multilayer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 1, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted lithographic apparatus 100 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2:
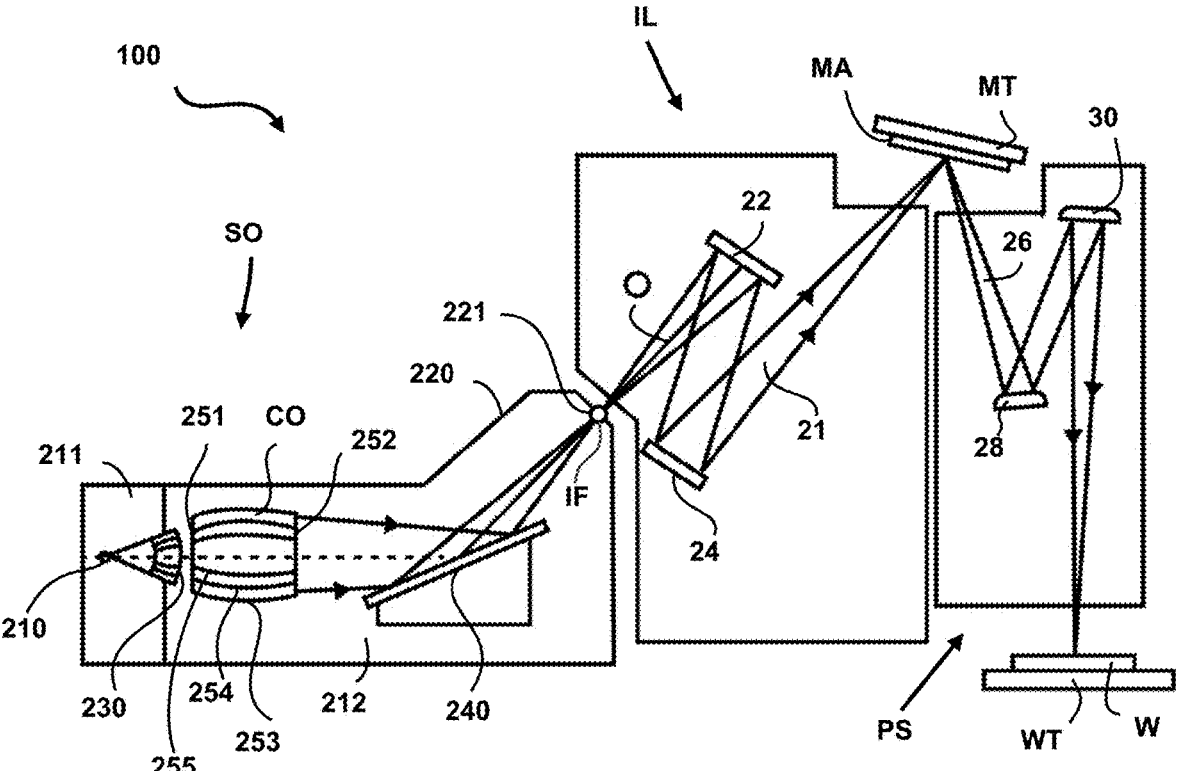
FIG. 2 is a more detailed view of the apparatus in FIG. 1, in accordance with various embodiments.

FIG. 2 shows the lithographic apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 3:
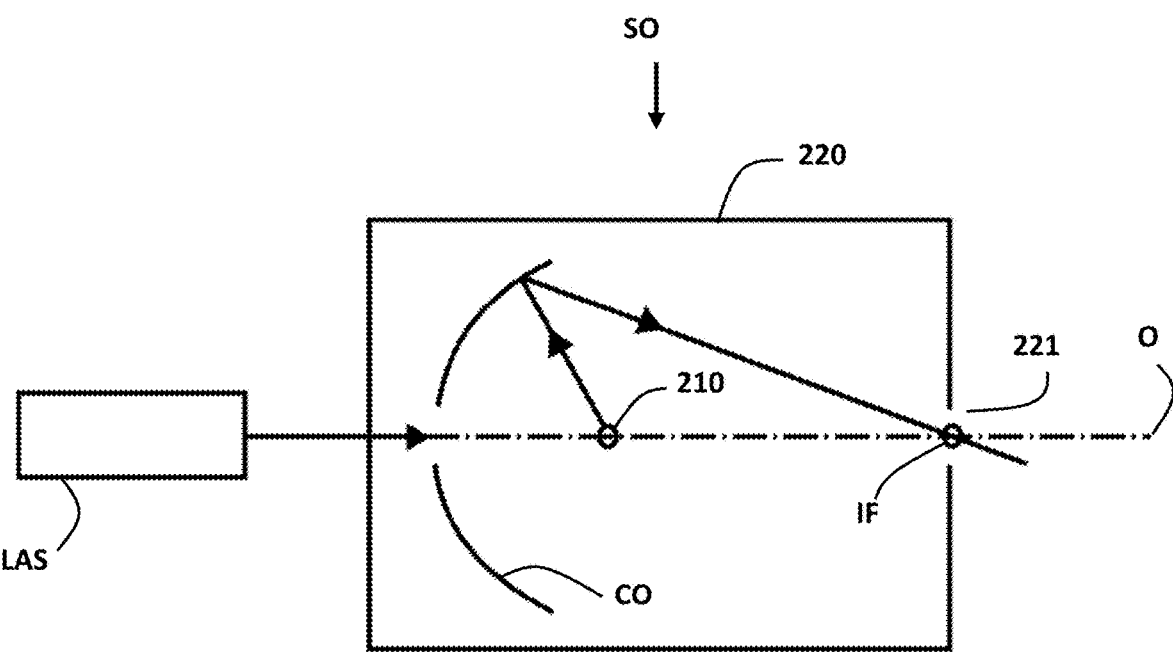
FIG. 3 is a more detailed view of a source collector module of the lithographic apparatus of FIGS. 1 and 2, in accordance with various embodiments.

Alternatively, the source collector module SO may be part of an LPP radiation system as shown in FIG. 3. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

While the foregoing description generally relates to EUV lithographic apparatuses and techniques, non-EUV lithographic apparatuses are also known. Examples of such lithographic apparatuses may be described in greater detail within commonly-assigned PCT Patent Application Publication No. WO 2009/078708, which was filed on Dec. 9, 2008; PCT Patent Application Publication No. WO 2009/106279, which was filed on Feb. 23, 2009; U.S. Patent Application Publication No. 2011/0027704, which was filed on Jun. 29, 2010; U.S. Patent Application Publication No. 2011/0043791, which was filed on Aug. 12, 2010; and U.S. Patent Application Publication No. 2012/0242970, which was filed on Sep. 19, 2011, the disclosures of which are hereby incorporated herein by reference in their entireties.

Figure 4A:
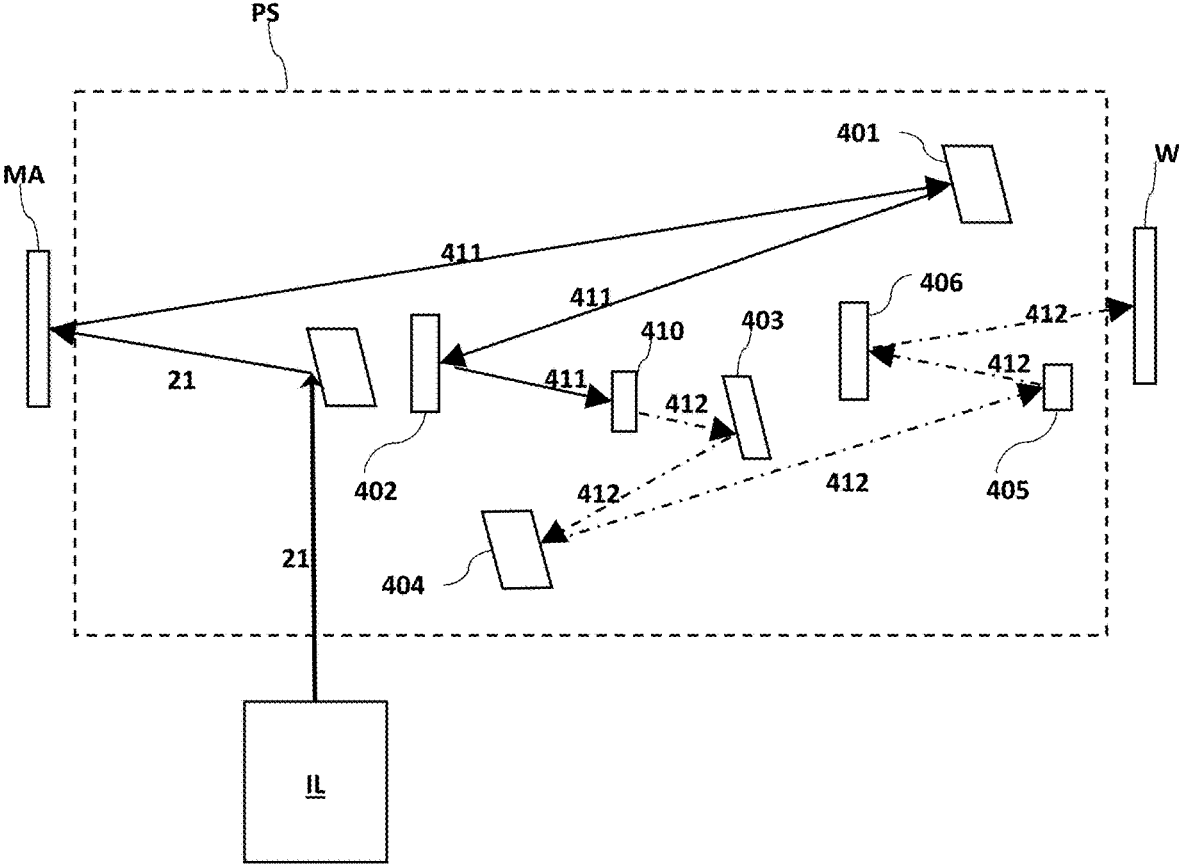
FIGS. 4A and 4B are more detailed views of a projection system of the lithographic apparatus of FIGS. 1 and 2, in accordance with various embodiments.
Figure 4B:
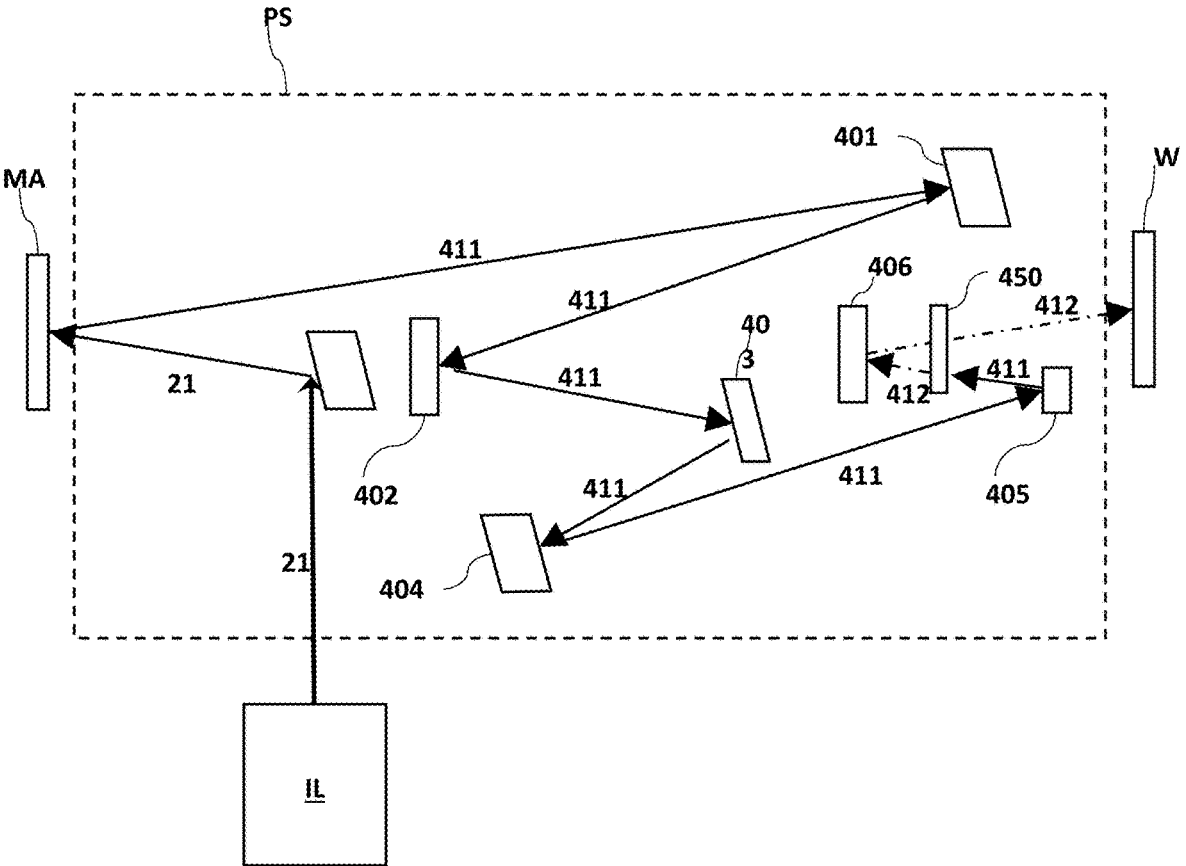

FIGS. 4A and 4B are more detailed views of a projection system of the lithographic apparatus of FIGS. 1 and 2, in accordance with various embodiments. Referring to FIG. 4A, projection system PS is an illustrative example of the projection system used within an EUV lithographic apparatus, such as lithographic apparatus 100. As described herein, lithographic apparatus 100 may be referred to interchangeably as EUV lithographic apparatus 100. In some embodiments, illumination system IL may output radiation beam 21, which may be directed towards patterning device MA. Upon incidence with patterning device MA, radiation beam 21 may be shaped in accordance with features present on patterning device MA. In some embodiments, the features may be arranged in a pattern. For example, the features may be periodic and repeating about patterning device MA. In some embodiments, the features may be 1D, e.g., lines, however additionally or alternatively, the features may be 2D, e.g., diamond-like in shape, or arranged so as to form a particular pattern, e.g., honeycomb-like pattern.

Upon incidence with patterning device MA, shaped radiation beam 411 may enter projection system PS, and may be directed via one or more optical components towards substrate W. At substrate W, the radiation beam may form the pattern of patterning device MA onto a portion or portions of substrate W. In some embodiments, the one or more optical components may include reflective elements, transmissive elements, absorptive elements, beam splitting elements, filtering elements, or any combination thereof. For instance, projection system PS may include reflective elements 401-406, e.g., mirrors. While six reflective elements are present within projection system PS, this is merely illustrative, and more reflective elements or fewer reflective elements may be included. Shaped radiation beam 411 may be directed towards a first reflective element 401, and may reflect off first reflective element 401 such that shaped radiation beam 411 is directed towards a second reflective element 402. Shaped radiation beam 411 may reflect off of second reflective element 402 and may be directed toward a third reflective element 403.

In some embodiments, a filter 410 may be included within projection system PS at a location interposed between second reflective element 402 and third reflective element 403. For instance, filter 410 may reside in a pupil plane of projection system PS. Filter 410 may be configured to suppress a zeroth order portion of shaped radiation beam 411, while first order portions of shaped radiation beam 411 may remain unsuppressed. In some embodiments, filter 410 may further be configured to suppress some of the higher order portions of shaped radiation beam 411 and/or interference between some of the first order portions of shaped radiation beam 411.

In FIG. 4A, filtered radiation beam 412 may represent the radiation beam after being filtered, e.g., via filter 410. For example, the zeroth order portion may be suppressed in filtered radiation beam 412. As a result, filtered radiation beam 412, may be allowed to propagate through projection system PS, and be directed toward substrate W to print an image according to the features present on patterning device MA. For example, filtered radiation beam 412 may reflect off of third, fourth, fifth, and sixth reflective elements 403, 404, 405, and 406, respectively. In some embodiments, by adding filter 410 to projection system PS, lithographic apparatus 100 may function as a 2D interferometric printer and perform interferometric printing. Furthermore, by suppressing the zeroth order portion of shaped radiation beam 411, lithographic apparatus 100 enables dark field imaging.

In some embodiments, filter 410 may include a central obscuration that suppresses the zeroth order portion of shaped radiation beam 411. For example, the central obscuration of filter 410 may correspond to an absorber or blocker that collects or otherwise prevents the zeroth order portion from transmitting, and therefore is further prevented from continuing to propagate within projection system PS. In this scenario, filter 410 may be of a transmissive type. As another example, the central obscuration of filter 410 may correspond to an aperture that allows the zeroth order portion to pass through and that reflects the first order portions of shaped radiation beam 411. For example, filter 410 may be a central aperture located along a central axis of shaped radiation beam 411 so as to suppress the zeroth order portion. In this scenario, filter 410 may be of a reflective type, (e.g., a reflective filter). Furthermore, if filter 410 is of the reflective type and includes an aperture that allows the zeroth order portion through and reflects the first order portion, a collection unit may be located on one side of filter 410 in order to collect the zeroth order portion and prevent the zeroth order portion from interfering with filtered radiation beam 412. Examples of a filter including a central obscuration corresponding to an absorber or blocker are described below with reference to FIGS. 11A-D. Examples of a filter including a central obscuration corresponding to an aperture are described below with reference to FIGS. 12A-D. As described herein, filter 410 of the reflective type may be referred to as reflective filter 410.

In some embodiments, a distribution of blocking elements, e.g., blades, apertures, absorbers, reflectors, may be used in addition to filter 410 or filter 410 may include the distribution of blocking elements. The distribution of blocking elements may be configured to suppress interference between some of the first order portions and/or suppress higher order portions of shaped radiation beam 411. An example of a distribution of blocking elements for suppressing interference between first order portions is described below with respect to FIG. 7E.

Referring to FIG. 4B, projection system PS may include a filter 450 as placed in the conjugate pupil plane as compared to filter 410 of FIG. 4A, which is placed in the pupil plane. Projection system PS of FIG. 4B may be substantially similar to projection system PS of FIG. 4A, with the exception that filter 450 is placed at the conjugate pupil plane. In some embodiments, filter 450 may be disposed between fifth reflective element 405 and sixth reflective element 406. As seen in FIG. 4B, shaped radiation beam 411 reflects off of first reflective element 401, second reflective element 402, third reflective element 403, fourth reflective element 404, and fifth reflective element 405. After reflecting off fifth reflective element 405, shaped radiation beam 411 is directed toward sixth reflect element 406 and is incident on filter 450. In some embodiments, filter 450 may suppress the zeroth order portion of shaped radiation beam 411, as a result, filtered radiation beam 412 continues on to reflect off of sixth reflective element 406, and then may incident on substrate W to print an image thereon.

In some embodiments, projection system PS may include a phase shifting mask configured to apply a phase shift to radiation beam 21. For example, patterning device (e.g., mask) MA may apply a 0-degree and 180-degree phase shift or a 0-degree, 120-degree, and –120-degree phase shift to incident radiation beam 21. A phase shifting or phase shift mask may employ destructive interference to suppress a zeroth order portion of incident light. Phase shift masks may include an additional layer that applies the desired phase shift to the incident radiation (e.g., light). The phase of the incident radiation may be "shifted" by the desired phase shift (e.g., a fraction of the incident light's period) and, as a result, may destructively interfere with light passing through adjacent portions of the phase shift mask. In some embodiments, with proper phase shift tuning, the phase shift mask may suppress the zeroth order portion of the incident light leaving only the first order portions. Furthermore, as a result of constructive interference between different parts of the incident light passing through the phase shift mask, an intensity of the first order portions may be increased. As opposed to the embodiments employing a filter, the zeroth order portion is not thrown away, but instead is "repurposed" so as to enhance the intensity of the first order portions.

In some embodiments, shaped radiation beam 411 may have the desired phase shift applied by the phase shift mask. In some embodiments, the application of the phase shift to radiation beam 21 by a phase shift mask may cause suppression of the zeroth order portion of radiation beam 21. For example, at least some of the zeroth order portion may be shifted into the first order portion resulting in an increased intensity of the first order portion and a reduction of the zeroth order portion. The reduction in the zeroth order portion may be a certain percentage of zeroth order portion that would otherwise incident substrate W. For example, the suppression of the zeroth order portion may result in a 50-100% reduction of the zeroth order portion. The average electric field of the zeroth order portion may be zero or close to zero. The first order portions, however, may correspond to a first harmonic of the diffracted beam's electric field pattern. Therefore, by applying the phase shift, the intensity of the first order portions of the radiation that will incident on substrate W may be greater. In some embodiments, use of a phase shift mask for pattering device MA may allow for projection system PS to be configured such that filter 410, 450 may not be needed to suppress the zeroth order portion. However, filter 410, 450 may be configured, in some embodiments, to suppress higher order portions and/or interference between first order portions.

Figure 5:
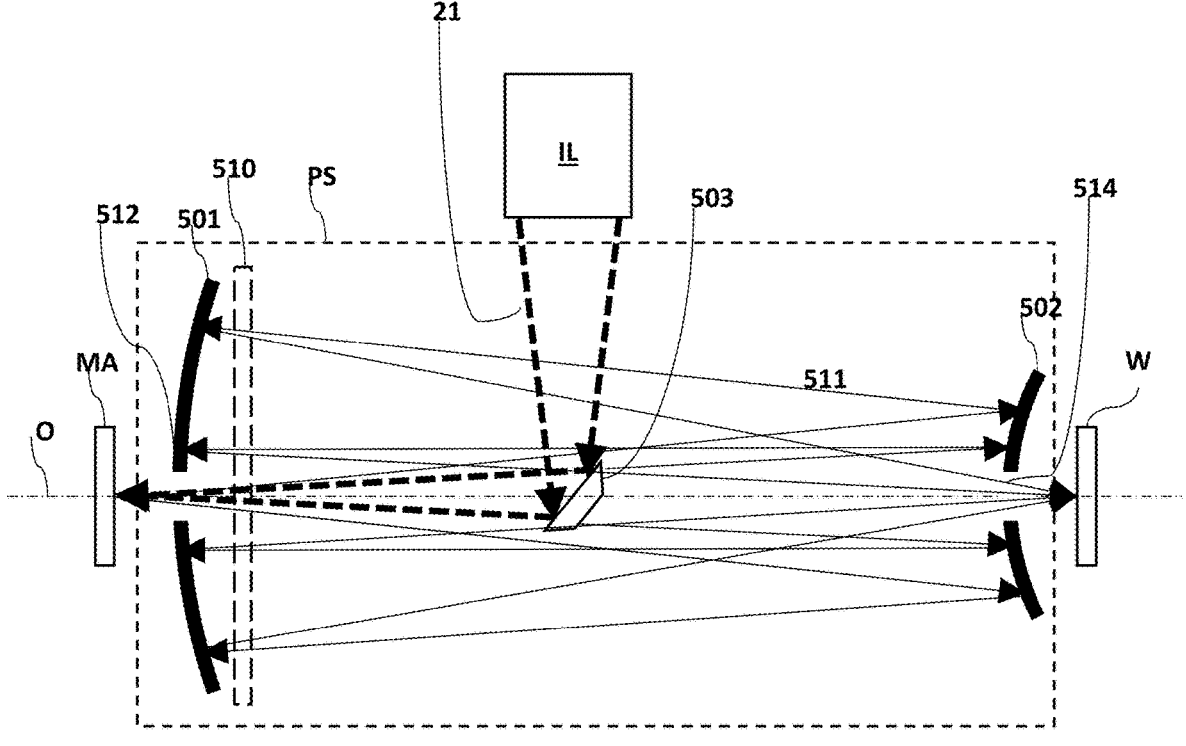
FIG. 5 is a more detailed view of a projection system of a lithographic apparatus in a Schwarzschild-like optical design, in accordance with various embodiments.

FIG. 5 is a more detailed view of a projection system of a lithographic apparatus in a Schwarzschild-like optical design, in accordance with various embodiments. In some embodiments, illumination system IL may output a radiation beam 21 from a location perpendicular to an optical axis O of patterning device MA and substrate W. Radiation beam 21 may first reflect off of a first reflective element 503. For example, first reflective element 503 may correspond to a bending mirror. For illustrative purposes, the radiation beam is shown as darkened dashed lines. After reflecting off of first reflective element 503, radiation beam 21 may be directed towards patterning device MA. Prior to being incident on patterning device MA, portions of radiation beam 21 may pass through an opening 512 in curved reflective element 501. Upon passing through opening 512 of curved reflective element 501, radiation beam 21 may incident patterning device MA. As mentioned previously with respect to FIGS. 4A and 4B, patterning device MA may be of a reflective type (e.g., a reflective filter) that reflects a shaped radiation beam 511 after being incident by radiation beam 21. For example, pattern device MA may be a reflective patterning device. In some embodiments, patterning device MA may include 2D features, which may be arranged in a periodic pattern. For example, the features may be diamond-like in shape, or may be arranged in to form a honeycomb-like pattern.

Upon reflecting from patterning device MA, shaped radiation beam 511 may pass back through curved reflective element 501. A zeroth order portion of shaped radiation beam 511 may be suppressed by a central obscuration. For example, first reflective element 503 may serve as the central obscuration to suppress the zeroth order portion of shaped radiation beam. In some embodiments, first reflective element 503 may be dual-purposed, as mentioned above, in that first reflective element 503 reflects radiation beam 21 towards patterning device MA, as well as suppresses the zeroth order portion of shaped radiation beam 511. As first reflective element 503 is located along central axis O within projection system PS, first reflective element 503 may also be capable of suppressing the zeroth order portion. For example, first reflective element 503 may be formed to reflect radiation beam 21 and direct it towards patterning device MA, and subsequently may reflect the zeroth order portion of shaped radiation beam 511 toward illuminator IL and thus away from substrate W.

In some embodiments, curved reflective element 501 may also serve as the central obscuration. For example, opening 512 may allow the zeroth order portion of shaped radiation beam 511 to pass through and the first order portions may reflect off of curved reflective element 501. In this scenario, a collection unit may be included proximate opening 512 to collect the zeroth order portion and to prevent the zeroth order portion from interfering with the image being printed on substrate W. Furthermore, one or more additional reflective elements may be included within projection system PS to direct the first order portions towards substrate W.

In some embodiments, first order portions of shaped radiation beam 511 may continue to propagate within projection system PS after the zeroth order portion has been suppressed. For instance, shaped radiation beam 511 may be illustrated as a thin, solid line for illustrative purposes. The first order portions of shaped radiation beam 511 may be directed towards another curved reflective element 502, located proximate to substrate W, which may cause the first order portions to be reflected towards curved reflective element 501, and then subsequently back towards curved reflective element 502. In some embodiments, upon reflecting off of curved reflective element 501, the first order portions may be directed to an opening 514 in curved reflective element 502. Opening 514 in curved reflective element 502 may allow the first order portions of shaped radiation beam 511 to incident substrate W to print an image in accordance with the one or more features of patterning device MA on one or more portions of substrate W.

In some embodiments, a filter 510 may be disposed proximate to curved reflective element 501. Filter 510 may be configured to suppress some of the higher order portions of shaped radiation beam 511 so as to allow the remaining first order portions to have an increased intensity when incident on substrate W. Alternatively, filter 510 may be configured to suppress interference between some of the first order portions of shaped radiation beam 511.

In some embodiments, projection system PS of FIG. 5 may include a phase shift mask. As mentioned above with respect to FIGS. 4A and 4B, a phase shift mask for patterning device (e.g., mask) MA may be used instead of a central obscuration to suppress the zeroth order portion of shaped radiation beam 511. In some embodiments, use of a phase shift mask for patterning device MA may allow first reflective element 503 to serve only a single function (e.g., directing radiation beam 21 to incident patterning device MA). However, in some embodiments, filter 510 may be used within projection system PS of FIG. 5 including a phase shift mask to suppress some of the higher order portions of shaped radiation beam 511 or suppress interference between some of the first order portions prior to being incident on substrate W, as detailed above with reference to FIGS. 4A and 4B.

Figure 6A:
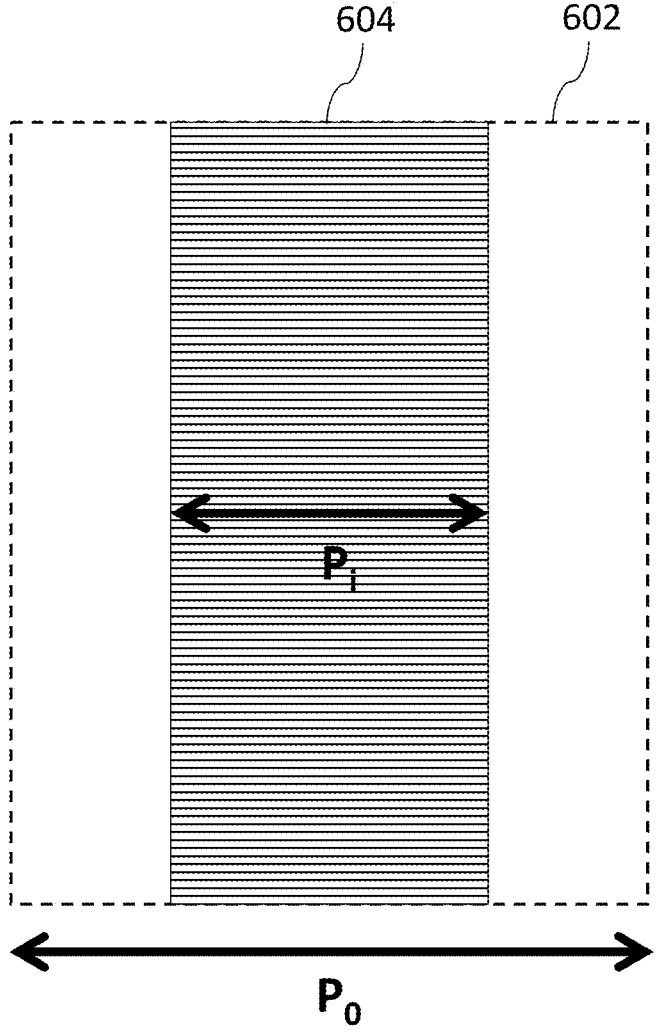
FIG. 6A is a schematic illustration of a portion of a mask including a one dimensional (1D) feature, in accordance with various embodiments.

FIG. 6A is a schematic illustration of a portion of a mask including a one dimensional (1D) feature, in accordance with various embodiments. In some embodiments, feature 604 may correspond to a 1D feature present on patterning device MA. Feature 604 may represent a portion of the features present on patterning device MA. For example, feature 604 may be a small section of a line on a mask including a plurality of equally spaced parallel lines. In some embodiments, feature 604 may be periodic about unit cell 602 and may be arranged to form a pattern (e.g., parallel lines). As an example, feature 604 may have a period or periodicity $P_0$, which may be between 33 nm and 49 nm in size. Furthermore, feature 604 may have a dimension $P_1$ (e.g., a line width) equal to half of the period $P_0$.

In some embodiments, a filter, such as filter 410 and 450, may be used to suppress a zeroth order portion of shaped radiation beam 411 diffracted by patterning device MA including feature 604, as seen in FIGS. 4A and 4B. Alternatively, in some embodiments, a central obscuration (e.g., opening 512 or first reflective element 503) may be used to suppress a zeroth order portion of shaped radiation beam 511 after reflecting off patterning device MA including feature 604, as seen in FIG. 5. As an example, if opening 512 is the central obscuration, opening 512 may be referred to as a central aperture. In some embodiments, as mentioned above, radiation beam 21 may be directed towards features on patterning device (e.g., a mask) MA, and may be diffracted thereby. The radiation beam 21 may have a small sigma $\sigma$, and may illuminate feature 604 perpendicularly. For example, a may be less than or equal to 0.25, and may have a wavelength $\lambda = 13.5$ nm. Furthermore, in some embodiments, lithographic apparatus 100 may include a numerical aperture NA, where NA may be equal to 0.55.

Figure 6B:
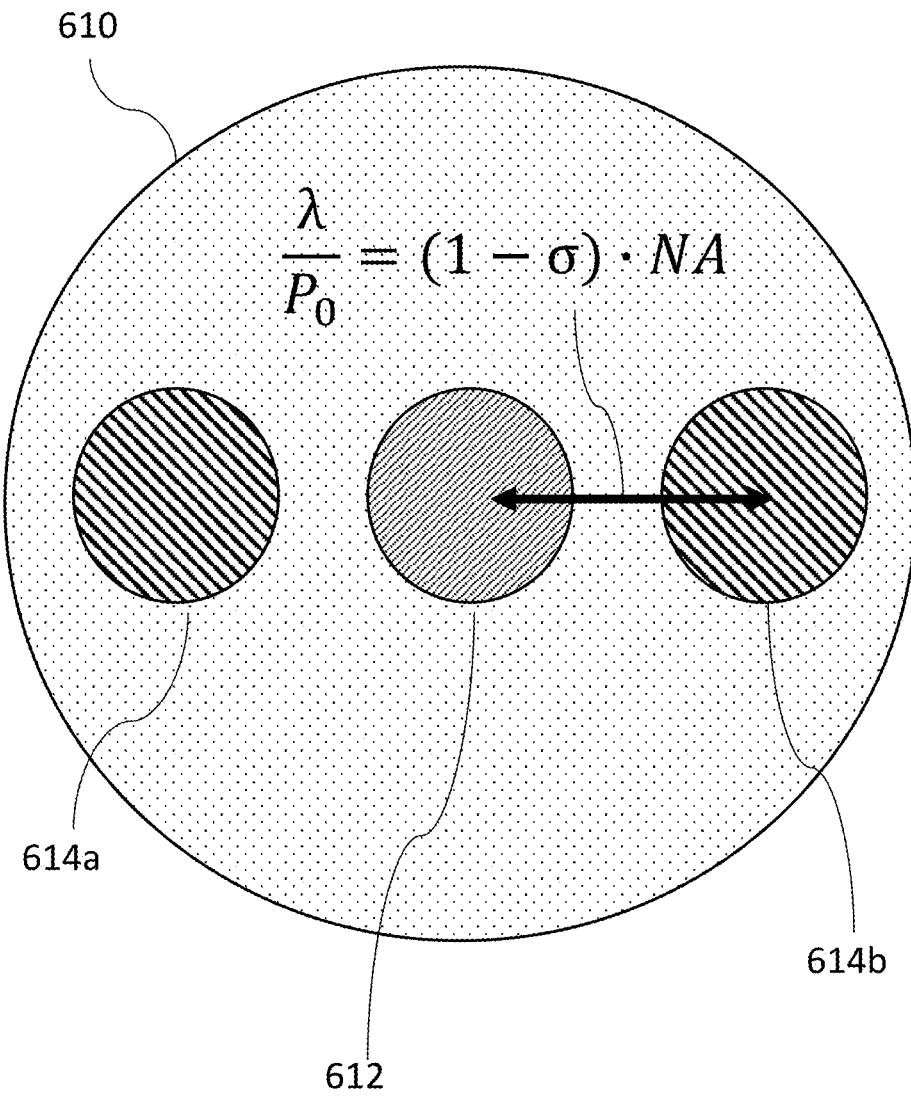
FIG. 6B is a schematic illustration of a pupil plane image of a beam shaped by the mask of FIG. 6A after a filter is used to suppress a zeroth order portion, in accordance with various embodiments.

FIG. 6B is a schematic illustration of a pupil plane image of a radiation beam shaped by the mask of FIG. 6A after a filter is used to suppress a zeroth order portion, in accordance with various embodiments. In FIG. 6B, a pupil plane image 610 may include a zeroth order intensity 612 in the middle of pupil plane image 610, and two first order intensities 614a and 614b, corresponding to the first order portions (e.g., +/−1), on either side of zeroth order intensity 612. The distance between the centroid of zeroth order intensity 612 and a centroid of either of first order intensities 614a or 614b (e.g., +/−1) may be proportional to the wavelength $\lambda$ over the period $P_0$, which may be related to a and the NA. For example, the period $P_0$ may range between:

$$\frac{\lambda}{(1 - \sigma) \cdot NA} \leq P_0 \leq \frac{\lambda}{2\sigma \cdot NA}$$

In some embodiments, filter 410, 450 of FIGS. 4A, 4B includes a central obscuration configured to suppress a zeroth order portion of shaped radiation beam 411 (e.g., see FIG. 11A-D or 12A-D), and thus the first order portions (e.g., +/−1 order) may pass through filter 410, 450. Alternatively, in some embodiments, first reflective element 503 or opening 512 may serve to suppress the zeroth order portion, as described in FIG. 5, and thus first order portions (e.g., +/−1 order) may be used to image substrate W. For example, first reflective element 503 may reflect the zeroth order portion of shaped radiation beam 511 so that the zeroth order portion does not image substrate W. In some embodiment, first reflective element 503 may reflect the zeroth order portion of shaped radiation beam 511 towards illuminator IL. The suppressed portion may be represented by zeroth order intensity 612 within pupil plane image 610. As a result, pupil plane image 610 may be realized by use of the first order diffraction portions (e.g., +/−1 order), as seen by first order intensities 614a and 614b.

Figure 6C:
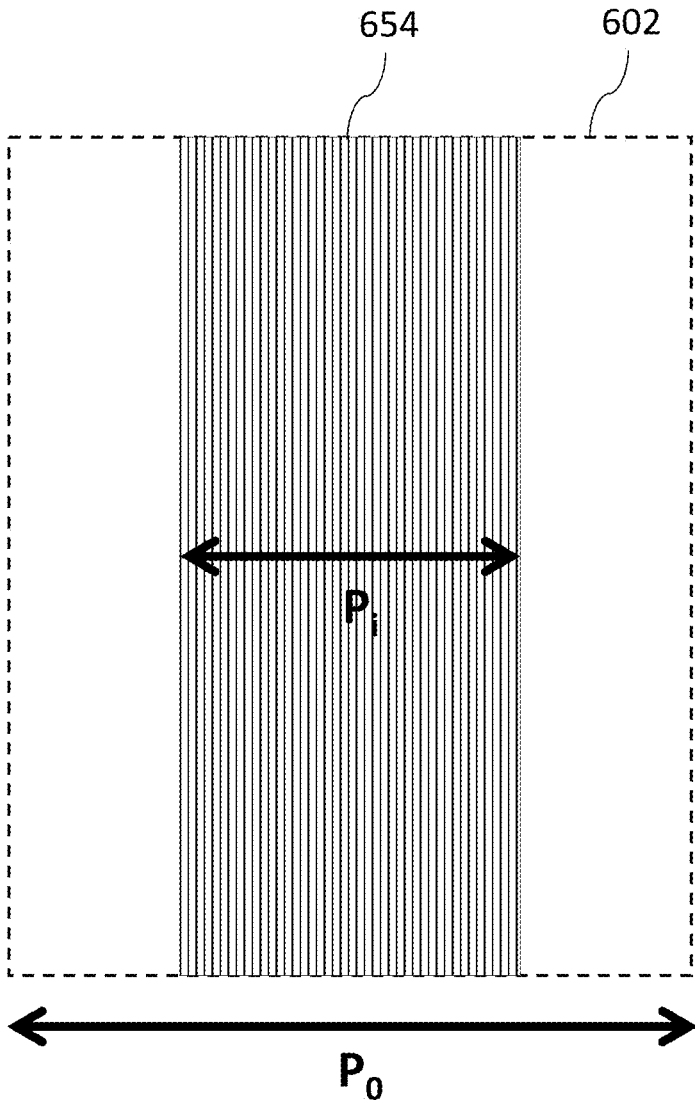
FIG. 6C is a schematic illustration of a portion of a phase shift mask including a 1D feature, in accordance with various embodiments.

FIG. 6C is a schematic illustration of a portion of a phase shift mask including a 1D feature, in accordance with various embodiments. In FIG. 6C, unit cell 602 may include feature 654 having periodicity $P_0$. However, whereas in FIG. 6A the zeroth order portion of shaped radiation beam 411 was suppressed via filter 410, 450, e.g., FIG. 4A, 4B, or the zeroth order portion was suppressed via opening 512 or first reflective element 503, e.g., FIG. 5, in FIG. 6B patterning device MA applies a phase shift that causes the zeroth order portion to be suppressed. In some embodiments, patterning device (e.g., a mask) MA may apply a 0-degree and 180-degree phase shift when shaping the incoming radiation beam 21 via features 654, which may cause the zeroth order portion of radiation beam 21 to be shifted. Thus, shaped radiation beam 411 of FIG. 4A, 4B, or shaped radiation beam 511 of FIG. 5, would have the zeroth order portion suppressed. For instance, the phase shift applied by patterning device MA may cause destructive interference between adjacent portions of radiation beam 21 diffracted by patterning device MA, which may suppress the zeroth order portion. Furthermore, the first order portions' intensity at substrate W when printing may be increased.

Figure 6D:
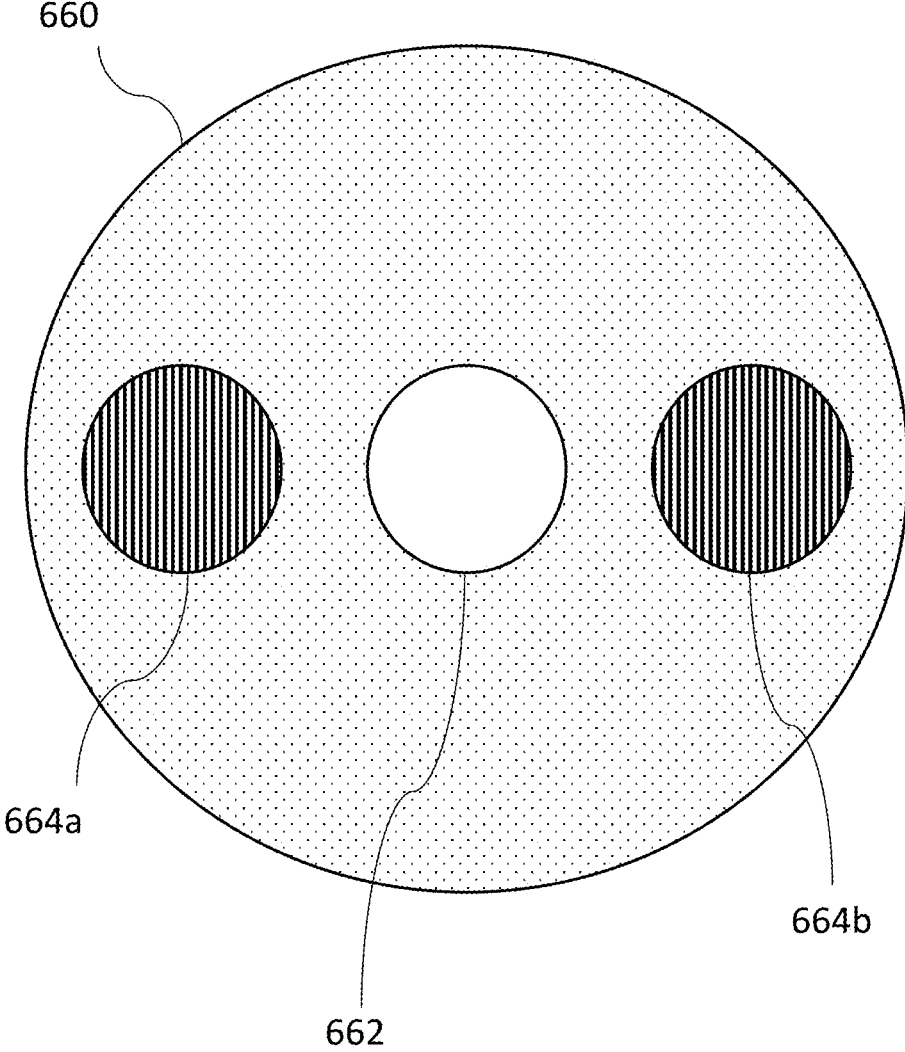
FIG. 6D is a schematic illustration of a pupil plane image of a beam shaped by the phase shift mask of FIG. 6C to suppress a zeroth order portion, in accordance with various embodiments.

FIG. 6D is a schematic illustration of a pupil plane image of a beam shaped by the phase shift mask of FIG. 6C to suppress a zeroth order portion, in accordance with various embodiments. For instance, pupil plane image 660 of FIG. 6D may include a zeroth order intensity 662 and first order intensities 664a and 664b. While the locations of zeroth order intensity 662 may be substantially similar to that of zeroth order intensity 612, intensity 662 may be reduced as compared to intensity 612 as a result of the application of the phase shift to the zeroth order portion by patterning device MA. For example, the intensity of zeroth order intensity 662 may be zero, or substantially zero (e.g., the zeroth order is suppressed). Furthermore, first order intensities 664a and 664b corresponding to the +/−1 portions, which may also have a substantially similar location within pupil plane image 660 as those of first order intensities 614a and 614b of pupil plane image 610, may have an increased amount of intensity when printing at substrate W as a result of the application of the phase shift to the zeroth order portion by patterning device MA.

In some embodiments, use of a phase shift mask to suppress the zeroth order portion may result in an increased intensity of the first order portions at substrate W as compared to use of filter 410, 450, where the increase may be approximately four times greater. In other words, because the phase shift mask may shift some of the zeroth order portion to the first order portions, via constructive interference of the diffracted beam, as opposed to blocking the zeroth order portion, the intensity of the beam that images on substrate W may be increased by a factor of four. One reason for this may relate to filter 410, 450, which may include an absorber to block out the zeroth order portion or an aperture to collect the zeroth order portion, "throwing away" the zeroth order light. On the other hand, for the phase shift mask, the zeroth order portion is not "thrown away" but instead may be shifted to the first order portions. Another reason for this is that patterning device MA may reflect all of radiation beam 21 in the case of a phase shift mask, whereas for a non-phase shift mask, approximately half of the incoming light, e.g., radiation beam 21, may be absorbed.

In FIG. 6D, the zeroth order intensity 662 may correspond to an average electric field over unit cell 602. In the phase shifting mask scenario, for example, the average electric field may be zero or substantially zero (e.g., the portions associated with feature 654 may correspond to a negative electric field while the portions unassociated with feature 654 within unit cell 602 may correspond to a positive electric field of equal magnitude). The first order intensities 664a and 664b (e.g., +/−1 order) may, for example, correspond to a first harmonic of the diffracted beam's electric field. For instance, the left and right sides of the unit cell may have a positive electric field, whereas the middle may have a negative electric field, and therefore may be of a stronger intensity for the first order portions.

In some embodiments, the first order portions of filtered radiation beam 412 or shaped radiation beam 511 may be used to print a feature on substrate W. In order to print the feature, e.g., a 2D feature, a particular exposure dose may be needed. To model this process, an intensity distribution as a function of position at substrate W is calculated. The non-linear response of the resist, which is used to image substrate W, is modeled by thresholding this intensity. In some embodiments, the threshold level is inversely proportional to the exposure dose. The threshold levels depend on a way that the printing occurs. For example, the threshold level may be between 0.1 and 0.5 if a normal patterning device (e.g., mask) is used. As another example, the threshold level may be between 0.5 and 1.5 if a phase shifting mask is used. The threshold level is in units of $1/E_0$, where $E_0$ equals an "energy to clear" (e.g., the energy of the first order portions needed to clear the resist). In some embodiments, $E_0$ is the minimum exposure dose needed to remove the resist within a positive tone resist, for a fully reflective pattern (e.g., where no feature(s) is/are present). In some embodiments, $E_0$ is the minimum exposure dose needed for the resist to remain for a negative tone resist. For a negative tone resist, a lower exposure dose is preferred because less time is needed to expose, and therefore as a result, the throughput (wafers per hour) may be increased.

Figure 7A:
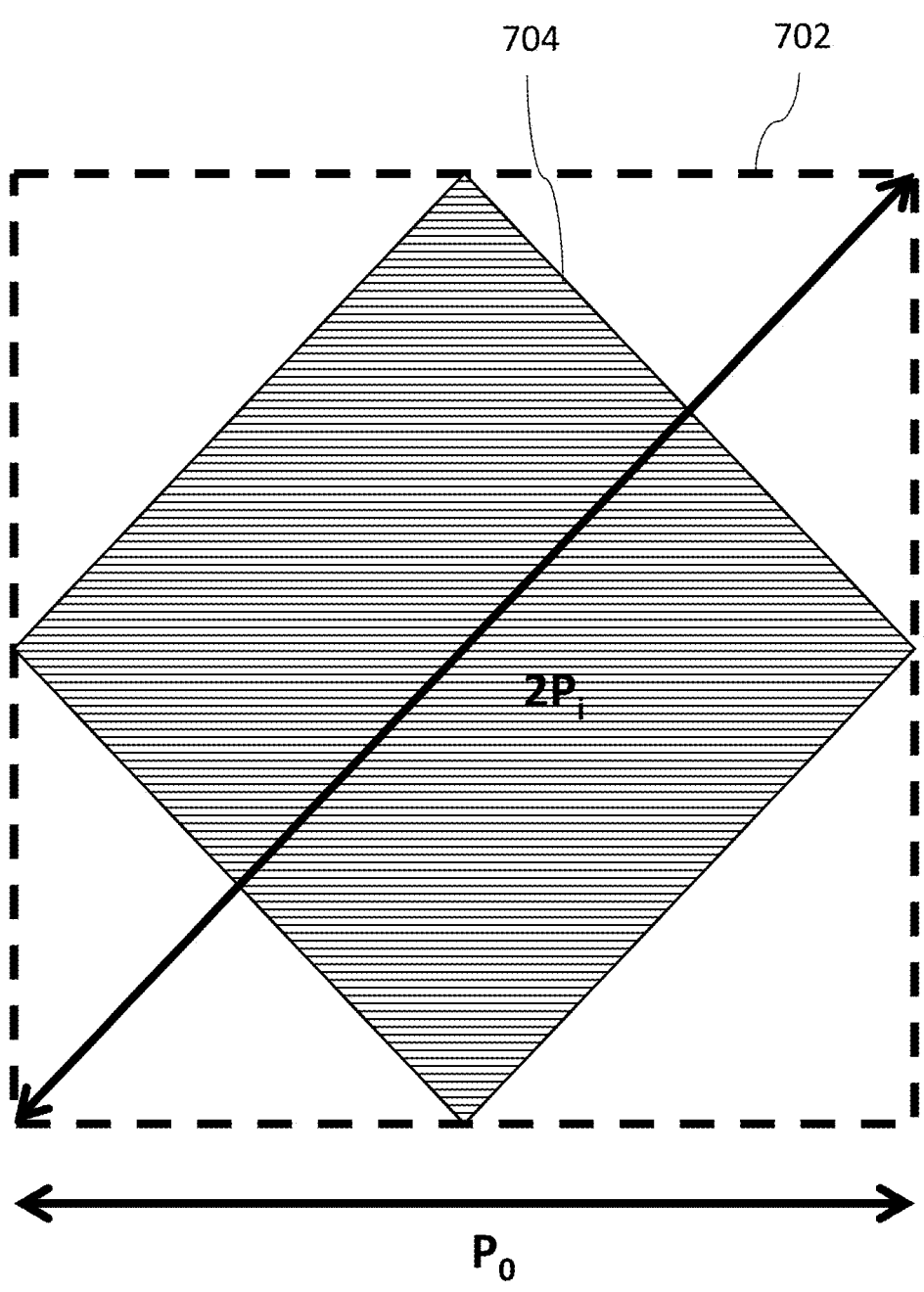
FIG. 7A is a schematic illustration of a portion of a mask including a two-dimensional (2D), in accordance with various embodiments.

FIG. 7A is a schematic illustration of a portion of a mask including a two-dimensional (2D), in accordance with various embodiments. In FIG. 7A, a two-dimensional (2D) feature 704 is illustrated within a unit cell 702. Unit cell 702 may represent a portion of patterning device MA including 2D feature 704, however patterning device MA may include a plurality of 2D features 704 arranged in a pattern to form a desired image on substrate W. In some embodiments, 2D feature 704 may be periodic within unit cell 702, and may have a periodicity or period $P_0$. In some embodiments, 2D feature 704 may be periodic and may be arranged to form a pattern. As an example, 2D feature 704 may have a period or periodicity $P_0$, which may be between 33 nm and 49 nm in size. Furthermore, 2D feature 704 may have a dimension $P_i$ (e.g., a diagonal of unit cell 702) equal to twice the period of the image $P_i$, and $\sqrt{2}$ the period of the object $P_0$. In some embodiments, 2D feature 704 may be diamond-like in shape, and may maximize diffraction efficiency. As described herein, 2D feature 704 being diamond-like in shape may correspond to a feature having four sides and four corners. Each of the corners of 2D feature 704 may be at 90-degree angles, however in some embodiments the corners may be at different angles, rounded, or a combination thereof. In some embodiments, 2D feature 704 may be a different 2D shape, such as a square, a rectangle, a circle, an oval, or any other geometric entity. Furthermore, patterning device MA may include a plurality of 2D features 704 arranged in a pattern. In some embodiments, 2D features 704 may be distributed in an array about patterning device MA such that there are rows and columns of 2D features 704 evenly spaced.

Figure 7B:
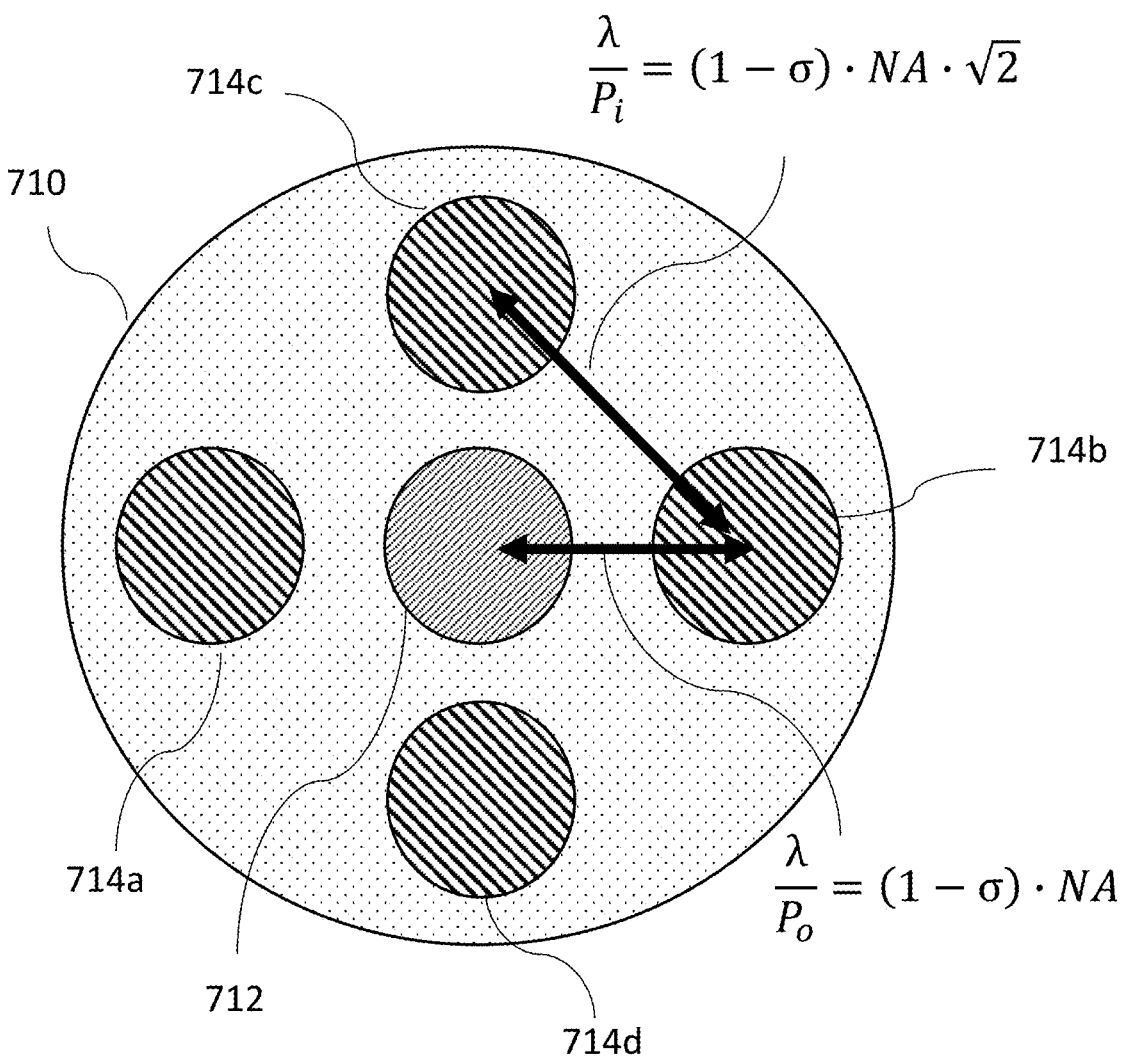
FIG. 7B is a schematic illustration of a pupil plane image of a beam shaped by the mask of FIG. 7A after a filter is used to suppress a zeroth order portion, in accordance with various embodiments.

FIG. 7B is a schematic illustration of a pupil plane image of a beam shaped by the mask of FIG. 7A after a filter is used to suppress a zeroth order portion, in accordance with various embodiments. In FIG. 7B, a pupil plane image 710 is illustrated including zeroth order intensity 712 and first order intensities 714a-d (e.g., +/−1, +/−1 order). The four first order intensities may result from the first order portions (e.g., +/−1, +/−1 order) of radiation beam 21 reflecting off of patterning device MA, which includes 2D features 704. In some embodiments, a distance between a centroid of zeroth order intensity 712 and a centroid of any of first order intensities 714*a-d* may be proportional to lambda λ (e.g., a wavelength of the illumination) over the period $P_0$, which may be related to σ and the NA. For example, the period $P_0$ may range between:

$$\frac{\lambda}{(1-\sigma)\cdot NA} \le P_0 \le \frac{\lambda}{2\sigma\cdot NA}$$

Furthermore, a distance between a first order intensity (e.g., one of first order intensities 714*a-d*) and an adjacent first order intensity may be proportional to lambda λ over $P_1$, or:

$$\frac{\lambda}{(1-\sigma)\cdot NA\cdot\sqrt{2}} \le P_i \le \frac{\lambda}{2\sigma\cdot NA\cdot\sqrt{2}}$$

The period of the image is $\sqrt{2}$ smaller than the period of the object, or:

$$P_i = \frac{P_o}{\sqrt{2}}$$

In some embodiments, filter 410, 450 may be configured to suppress the zeroth order portion of shaped radiation beam 411. In some embodiments, if filter 410, 450 includes a central obscuration configured to suppress a zeroth order portion of shaped radiation beam 411, and thus the first order portions (e.g., +/−1, +/−1 order) may pass through filter 410, 450. The blocked light may suppress the zeroth order intensity 712 within pupil plane image 710. As a result, pupil plane image 710 may be realized by use of the first order diffraction portions, as seen by first order intensities 714*a-d*. In some embodiments, zeroth order intensity 712 may be non-zero, as not all of the zeroth order portion may be suppressed by filter 410, 450.

If patterning device MA includes 2D features 704, then in some embodiments, filter 410, 450 of FIGS. 4A, 4B may include an absorber or stop that absorbs or blocks the zeroth order portion of shaped radiation beam 411 from passing through filter 410, 450 and continuing within projection system PS. For example, filters 1100-1160 of FIGS. 11A-D illustrate filters including a central obscuration that may be configured to absorb or block the zeroth order portion.

Alternatively, for patterning device MA including 2D features 704, in some embodiments, filter 410, 450 of FIG. 4A, 4B may include an aperture that allows the zeroth order portion of shaped radiation beam 411 to pass through while reflecting the first order portions. For example, filters 1200-1260 of FIGS. 12A-D may include a hole in a middle of the filter which allows the zeroth order portion to pass through. In this example, a collection unit may be located at an opposite side of the filter to collect the zeroth order portion thereby preventing the zeroth order portion from interacting with other aspects of projection system PS. Furthermore, in this example, filter 410, 450 may be of a reflective type (e.g., filter 410, 450 may be referred to as reflective filter 410, 450), and therefore additional or fewer reflective elements may be included within projection system to direct the first order portions towards substrate W. As an example, referring to FIG. 4B, if filter 450 includes a central hole, the zeroth order portion of shaped radiation beam 411 may pass through and be collected by a collection unit located where reflective element 406 is located. In this example, reflective element 406 may not be included, as the first order portion, i.e., filtered radiation beam 412, may be directed toward substrate W via the reflective portions of filter 450. Furthermore, in this example, filter 450 including a central hole may correspond to a central aperture of filter 450.

In some embodiments, if the lithographic apparatus includes patterning device MA including 2D features 704 and a projection system PS of a Schwarzschild-like optical design, e.g., as illustrated in FIG. 5, the zeroth order portion may be suppressed by first reflective element 503 or opening 512. For example, reflective element 503 may function as a central obscuration to suppress the zeroth order portion. In this example, reflective element 503 may reflect the zeroth order portion of shaped radiation beam 511 away from substrate W (e.g., towards illuminator IL). As another example, opening 512 may function as a central obscuration to suppress the zeroth order portion.

Figure 7C:
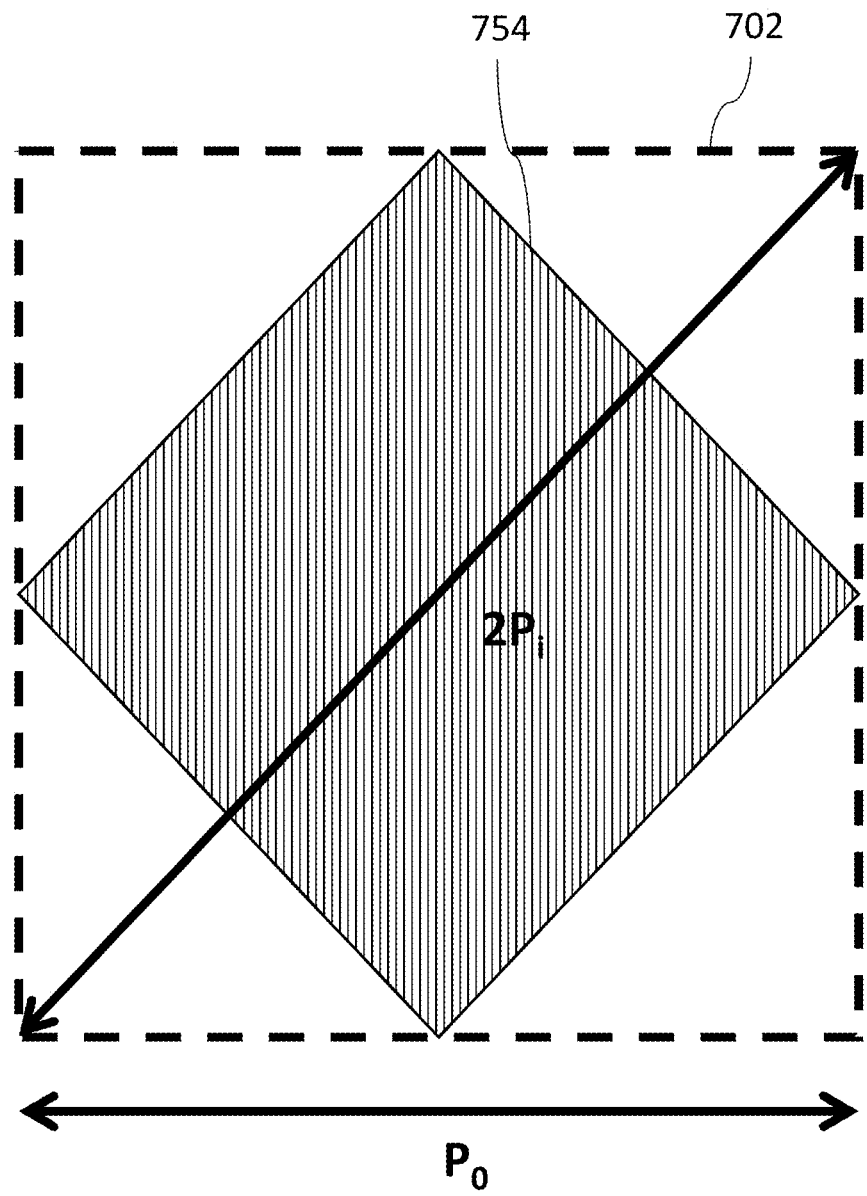
FIG. 7C is a schematic illustration of a portion of a phase shift mask including a 2D feature, in accordance with various embodiments.

FIG. 7C is a schematic illustration of a portion of a phase shift mask including a 2D feature, in accordance with various embodiments. In FIG. 7C, unit cell 702 may include 2D feature 754 having periodicity $P_0$. However, whereas in FIG. 7A a central obscuration (e.g., reflective element 503 or opening 512 of FIG. 5) or a filter including a central obscuration (e.g., filters 410, 450 of FIGS. 4A, 4B) were configured to suppress the zeroth order portion of shaped radiation beam 411 or 511, in FIG. 7C patterning device MA is a phase shift mask configured to apply a phase shift that causes the zeroth order portion to be suppressed. In some embodiments, patterning device (e.g., a mask) MA may apply a 0-degree and 180-degree phase shift when shaping the incoming radiation beam (e.g., radiation beam 21), which may cause the zeroth order portion of shaped radiation beam 411 or 511 to be shifted, and thus the zeroth order portion would be suppressed. For example, as mentioned above, the phase shift mask may cause destructive interference of light that suppresses the zeroth order portion, and may further cause constructive interference increasing the intensity of the resulting beam printing an image on substrate W.

Figure 7D:
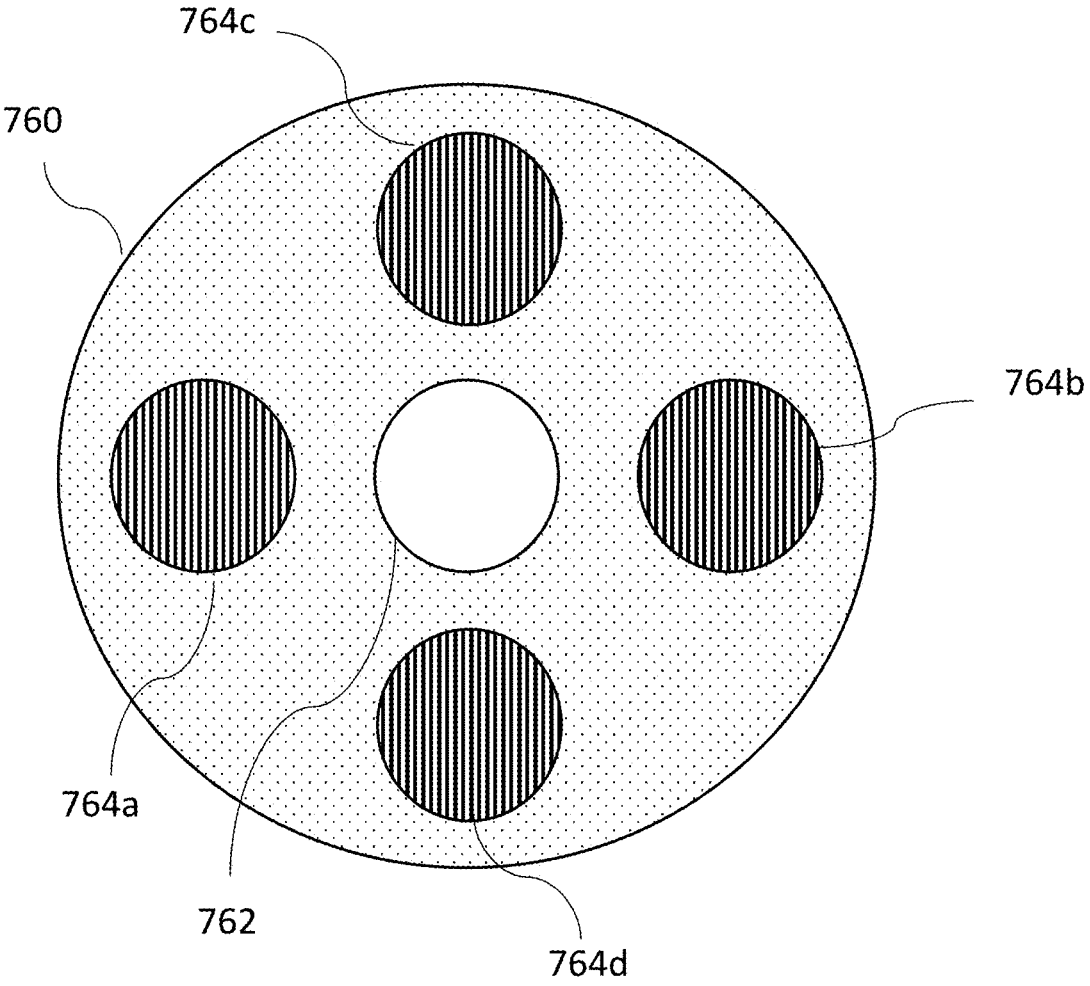
FIG. 7D is a schematic illustration of a pupil plane image of a beam shaped by the phase shift mask of FIG. 7C to suppress a zeroth order portion, in accordance with various embodiments.

FIG. 7D is a schematic illustration of a pupil plane image of a beam shaped by the phase shift mask of FIG. 7C to suppress a zeroth order portion, in accordance with various embodiments. In FIG. 7D, pupil plane image 760 may include a zeroth order intensity 762 and first order intensities 764*a-d* (e.g., corresponding to the +/−1, +/−1 orders). While the locations of zeroth order intensity 762 may be substantially similar to that of zeroth order intensity 712, intensity 762 may be reduced as compared to zeroth order intensity 712 as a result of the application of the phase shift to the zeroth order portion by patterning device MA. For example, the zeroth order portion may be suppressed such that the intensity is approximately 0 as a result of destructive interference caused by the phase shift applied by patterning device MA. Furthermore, first order intensities 764*a-d*, which may also have a substantially similar location within pupil plane image 760 as those of first order intensities 714*a-d* of pupil plane image 710 discussed above, may have an increased intensity when imaging substrate W as a result of the application of the phase shift to the zeroth order portion by patterning device MA. In some embodiments, a difference in intensity of the first order portion when imaging substrate W may increase by a factor of four when using a phase shift mask.

Figure 7E:
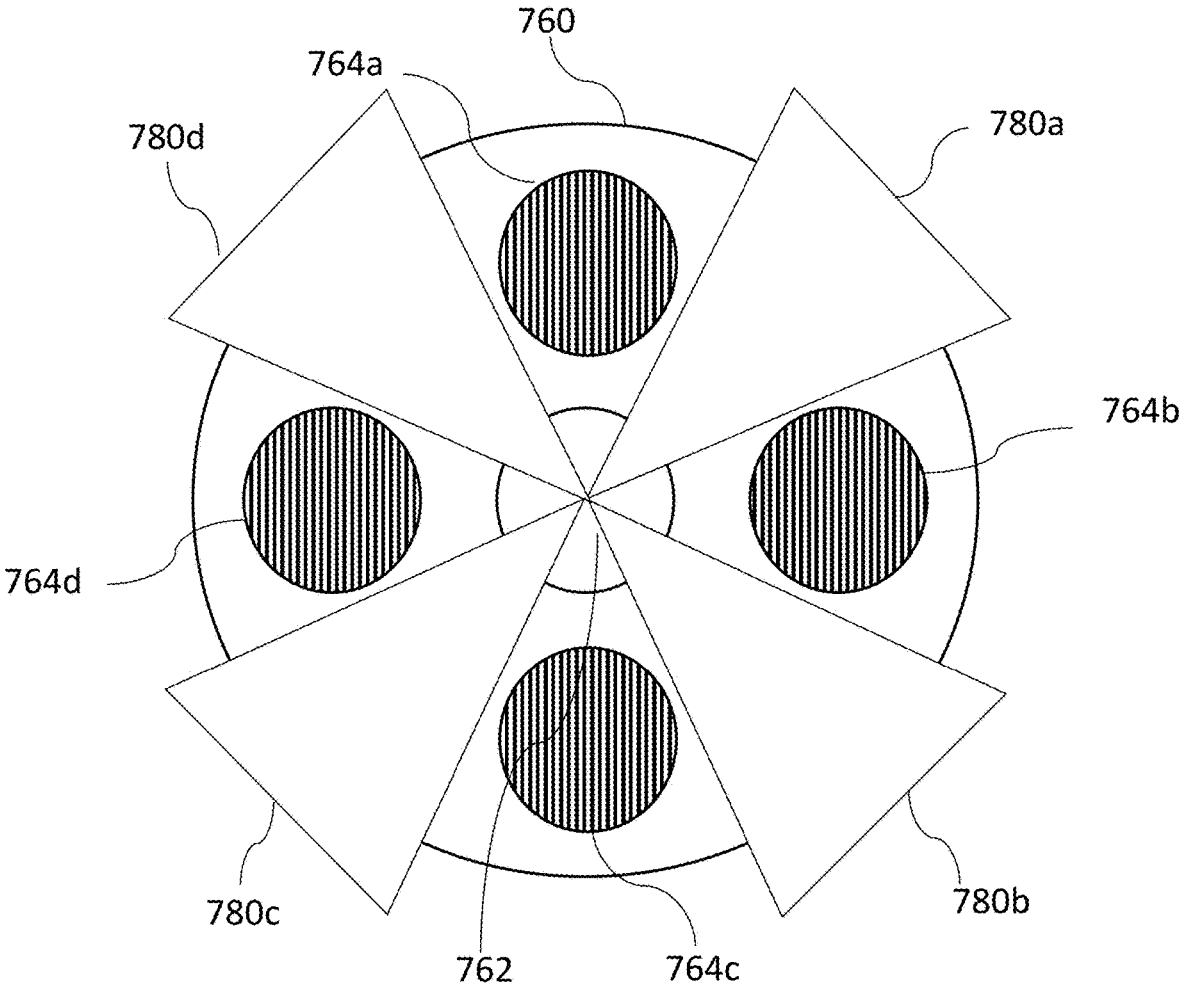
FIG. 7E is a schematic illustration of a pupil plane image of a beam that is filtered using additional blocking elements to suppress interference between first order portions, in accordance with various embodiments.

FIG. 7E is a schematic illustration of a pupil plane image of a beam that is filtered using additional blocking elements to suppress higher order portions suppress interference between some of the first order portions, in accordance with various embodiments. In FIG. 7E, a distribution of blocking elements 780a-d is included. In some embodiments, distribution of blocking elements 780a-d may be used in addition to filter 410, 450. For example, projection system PS of FIG. 4A or 4B may include blocking elements 780a-d in addition to filter 410 or 450. In some embodiments, filter 410, 450, or 510 may incorporate blocking elements 780a-d therein. For example, filters 10A-D are illustrative examples of filters that include blocking elements 780a-d.

Figure 8A:
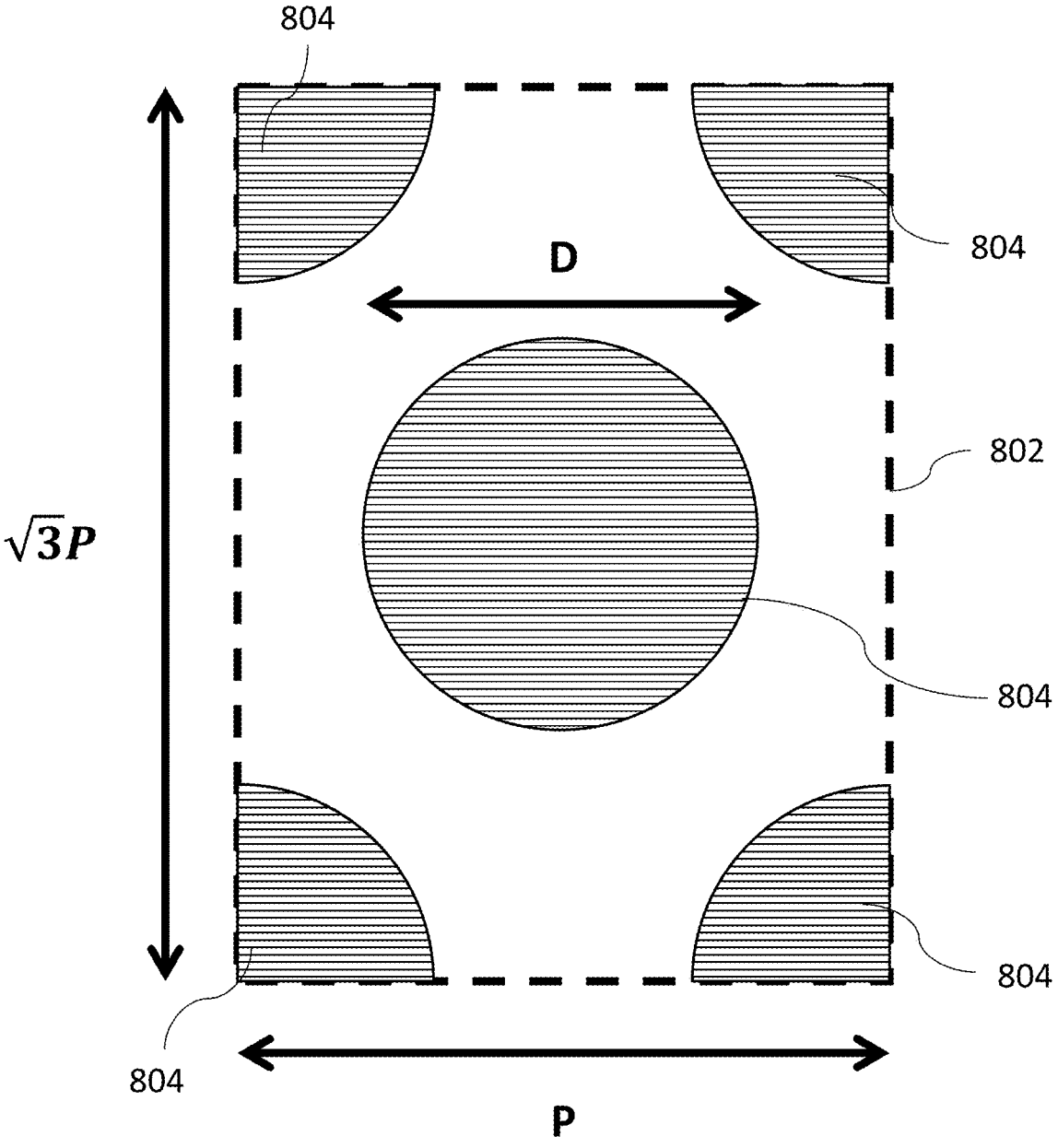
FIG. 8A is a schematic illustration of a portion of a mask including a 2D feature arranged in an offset pattern, in accordance with various embodiments.

In some embodiments, blocking elements 780a-d may be configured to suppress higher order portions or suppress interference between some of the first order portions from destructively interfering with the first order portions. For example, blocking elements 780a-d may be blades protruding into an area between each of first order intensities 764a-d (and similarly intensities 716a-d). Each blade may be operable to block some or all of the higher order portions and/or first order portions of the incoming radiation beam from interfering with the first order portions, thereby increasing improving a consistency of the image being printed on substrate W. For 2D features, such as features 704, 754, 804, 854, and 904a-c, the pattern of these features on patterning device MA is periodic. In some embodiments, the pattern is periodic in two different direction. For example, 2D feature 704 is periodic in both a horizontal direction (e.g., x-direction) and in a vertical direction (e.g., y-direction). As another example, the pattern is periodic in the vertical direction and in a direction +/−60-degrees (e.g., as seen in FIG. 8A). Each periodicity creates different diffraction order, and therefore with 2D features, combined diffraction order may be created.

In FIGS. 7A and 7C, the first order intensities 714a-d and 764a-d, respectively, represent the 0/+1, 0/−1, −1/0, and +1/0 orders. There are first diffraction orders in one direction and the zeroth diffraction order in the other direction. However, there additionally may exist "higher orders," e.g., +1/+1, −1/+1, −1/−1, and +1/−1 orders. In this example, there is first order diffraction in both directions. In some embodiments, due to the diamond-like shape of 2D features 704 and 754, the higher orders, e.g., +1/+1, −1/+1, −1/−1, and +1/−1 orders, may be suppressed or absent. Therefore, interfering diffraction orders, e.g., the higher order, are to be suppressed, and thus in the example embodiments, a separation distance between the interfering diffraction orders is larger than a distance of each diffraction order with respect to the zeroth order portion. For example, the distance between where the higher order portions would exist in pupil plane image 710, 760 is to be larger than the distance between zeroth order intensity 712 and those higher order portions.

By blocking diffraction from higher order portions, interference from the higher order portions with the first order portions (e.g., +/−1, +/−1) may be suppressed so as to not introduce an unwanted periodicity in the pattern being imaged to substrate W. Furthermore, in some embodiments by suppressing interference between first order portions (e.g., +/−1, +/−1), unwanted periodicity in the pattern being imaged to substrate W may also occur. Thus, use of the distribution of blocking elements 780a-d in conjunction with filter 410, 450 in FIG. 4A, 4B, or via filter 510 in FIG. 5, may improve the consistency and contrast of the image. In some embodiments, blocking elements 780a-d may also be used within projection system PS of FIG. 4A, 4B, or 5 when using a phase shift mask.

FIG. 8A is a schematic illustration of a portion of a mask including a 2D feature arranged in an offset pattern, in accordance with various embodiments. In FIG. 8A, a two-dimensional (2D) feature 804 is illustrated within a unit cell 802. Unit cell 802 may represent a portion of patterning device MA including 2D feature 804, however patterning device MA may include a plurality of 2D features 804 arranged in a pattern to form a desired image on substrate W. In some embodiments, 2D feature 804 may be periodic within unit cell 802, and may have a periodicity or period P along a first axis, e.g., an x-axis, and a periodicity or periodicity $\sqrt{3}P$ along a second axis, e.g., a y-axis. In some embodiments, 2D feature 804 may be periodic and arranged to form a pattern. As an example, periodicity or period P may be between 33 nm and 49 nm in size. Furthermore, 2D feature 804 may have a dimension D (e.g., a diameter of 2D feature 804 or half of period P). For example, diameter D may be between 22 nm and 29 nm in size.

In some embodiments, 2D feature 804 may be arranged to form an alternating feature pattern, and may maximize diffraction efficiency. As described herein, patterning device MA may include 2D features 804 arranged in alternating offset configurations. The shape of 2D feature 804 may be circular, oval, square, rectangular, triangular, or any other geometric shape. Further, each 2D feature 804 may slightly differ from another 2D feature 804 in the sense that perfect circles, ovals, squares, etc., may not be present. As mentioned above, patterning device MA may include an arrangement of 2D features 804 forming an array where each column and row is slightly offset from its adjacent column/row. For example, a first row may include a plurality of 2D features 804 arranged in a line, with each 2D feature 804 evenly spaced apart. A second row including a plurality of features may also be arranged in a line, with each 2D feature 804 evenly spaced apart, however the central axis of each feature may be a half a dimension D offset from an adjacent 2D feature 804 in the first row. A third row including a plurality of 2D features 804 may also be arranged similarly to that of the first row, and each subsequent row on patterning device MA may repeat in this manner.

Figure 8B:
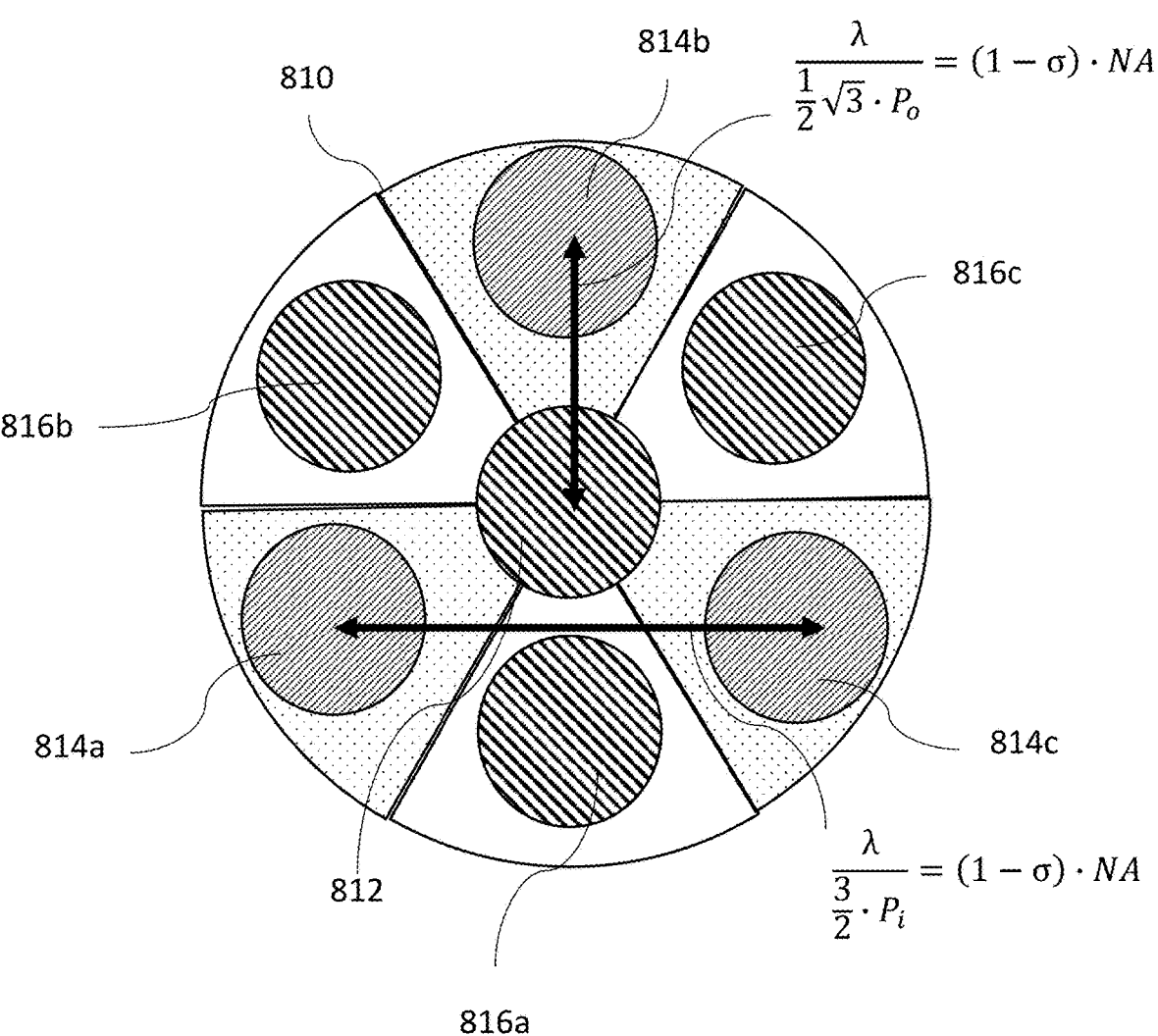
FIG. 8B is a schematic illustration of a pupil plane image of a beam shaped by the mask of FIG. 8A after a filter is used to suppress a zeroth order portion, in accordance with various embodiments.

FIG. 8B is a schematic illustration of a pupil plane image of a beam shaped by the mask of FIG. 8A after a filter is used to suppress a zeroth order portion, in accordance with various embodiments. FIG. 8B may include a representation of a pupil plane image 810. In some embodiments, pupil plane image 810 may include zeroth order intensity 812 and first order intensities 814a-c and 816a-c. The zeroth order intensity 812 may result from the zeroth order portion of the shaped radiation beam 411 being suppressed via filter 410, 450 of FIG. 4A, 4B, or via reflective element 503 or opening 512 of FIG. 5. The six first order intensities 814a-c and 816a-c may result from the first order portions (e.g., +/−1, +/−1, +/−1).

In some embodiments, filter 410, 450, or 510 of FIGS. 4A, 4B, and 5 may further be configured to suppress some of the first order portions. For instance, three first order intensities 816a-c may be suppressed via a filter. By suppressing the three first order portions, interference between neighboring first order portions may be prevented, and thus a resolution of the beam when imaging wafer W may be increased. As an example, suppressing the three first order portions associated with first order intensities 816a-c may result in a resolution doubling.

In some embodiments, a distance between a centroid of zeroth order intensity 812 and a centroid of any of first order intensities 814a-c and 816a-c may be proportional to lambda λ (e.g., a wavelength of the illumination) over the period $P_0$, for instance by a factor of $2/\sqrt{3}$, or:

$$\frac{\lambda}{(1-\sigma)\cdot NA} \le \frac{\sqrt{3}}{2}P_0 \le \frac{\lambda}{2\sigma\cdot NA}$$

Furthermore, a distance between first order intensities 814a and 814b, 814b and 814c, and 814a and 814c, as well as 816a and 816b, 816b and 816c, and 816a and 816c, may be proportional to lambda $\lambda$ over $P_i$, for instance by a factor of 2/3, or:

$$\frac{\lambda}{(1-\sigma)\cdot NA} \le \frac{3}{2}P_i \le \frac{\lambda}{2\sigma\cdot NA}$$

Therefore, the relationship between $P_i$ and $P_0$ is $$P_i = \frac{P_0}{\sqrt{3}}$$

The surface of the unit cell is $\sqrt{3}\ P^2$. In some embodiments, half of this area is covered by 2D feature 804, with an area $$\frac{\pi\cdot D^2}{2}, P^2 = \pi\cdot D^2.$$

Therefore, D is:

$$D = P\cdot\sqrt{\frac{\sqrt{3}}{\pi}}$$

In some embodiments, the aforementioned relationship results in a largest diffraction efficiency for the first order portions. However, other dimensions and sizes for the features may be used, and in these instance, a higher exposure dose may be needed.

In some embodiments, filter 410, 450 of FIG. 4A, 4B may be configured to suppress the zeroth order portion of shaped radiation beam 411 diffracting off patterning device MA including 2D features 804. Furthermore, in some embodiments, filter 410, 450 of FIG. 4A, 4B or filter 510 of FIG. 5 may be configured to suppress some of the first order portions of shaped radiation beam 411 diffracting off patterning device MA including 2D features 804. If filter 410, 450 includes a central obscuration configured to suppress a zeroth order portion of shaped radiation beam 411, some of the first order portions (e.g., +/−1, +/−1, +/−1 order) may pass through filter 410, 450. The blocked light may suppress the zeroth order intensity 812 within pupil plane image 810. Further, the blocked light may also suppress some of the first order portions, corresponding to first order intensities 816a-c within pupil plane image 810. As a result, pupil plane image 810 may be realized by use of some of the first order portions, as seen by first order intensities 814a-c. In some embodiments, zeroth order intensity 812 and/or first order intensities 816a-c may be non-zero, as not all of the zeroth order portion and not all of the three first order portions may be suppressed by filter 410, 450, or 510.

Similar to FIG. 7A, if patterning device MA includes 2D features 804, then filter 410, 450 of FIG. 4A, 4B may include an absorber or stop to block the zeroth order portion, or an aperture to allow the zeroth order portion to pass while reflecting the first order portions. Furthermore, for a lithographic apparatus 100 including a projection system configured in a Schwarzschild-like optical design, e.g., FIG. 5, if patterning device MA includes 2D features 804, then reflective element 503 or opening 512 may be used to suppress the zeroth order portion. For example, filter 510 may include a central aperture (e.g., opening 512) to suppress the zeroth order portion. To suppress the first order portions, filter 410, 450, 510 may include an absorber or stop to block some of the first order portions, or apertures to allow the some of the first order portions to pass while reflecting the other first order portions.

Figure 8C:
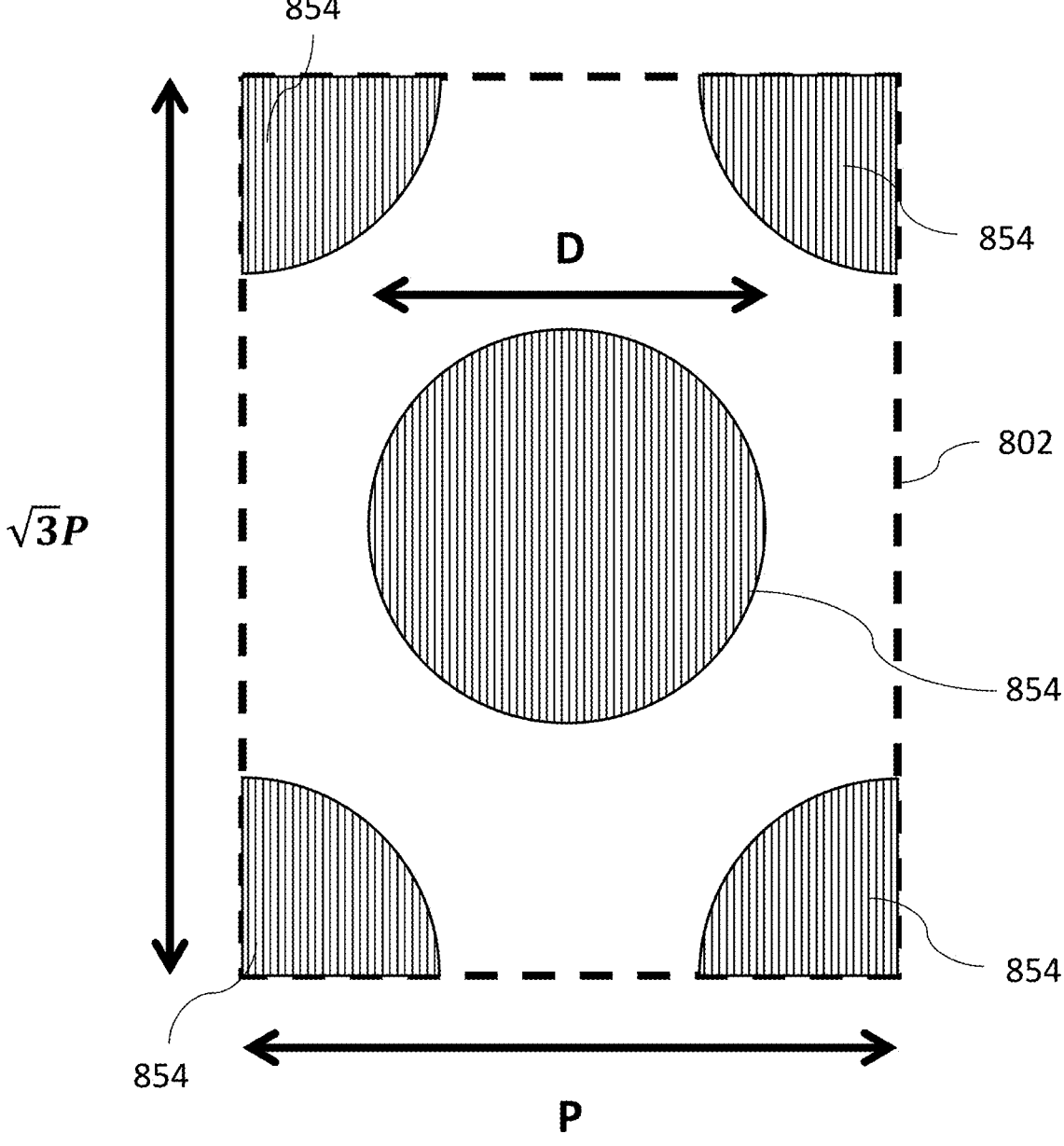
FIG. 8C is a schematic illustration of a portion of a phase shift mask including a 2D feature arranged in the offset pattern, in accordance with various embodiments.

FIG. 8C is a schematic illustration of a portion of a phase shift mask including a 2D feature arranged in the offset pattern, in accordance with various embodiments. In FIG. 8C, unit cell 802 may include 2D feature 854 having period $P_0$. However, whereas in FIG. 8A a central obscuration (e.g., reflective element 503 or opening 512 of FIG. 5) or a filter including a central obscuration (e.g., filters 410, 450 of FIGS. 4A, 4B) were configured to suppress the zeroth order portion of shaped radiation beam 411 or 511, in FIG. 8C patterning device MA is a phase shift mask configured to apply a phase shift that causes the zeroth order portion to be suppressed. In some embodiments, patterning device (e.g., a mask) MA may apply a 0-degree and 180-degree phase shift when shaping the incoming radiation beam (e.g., radiation beam 21), which may cause the zeroth order portion of shaped radiation beam 411 or 511 to be shifted, and thus the zeroth order portion may be suppressed. For example, as mentioned above, the phase shift mask may cause destructive interference of light that suppresses the zeroth order portion, and may further cause constructive interference increasing the intensity of the resulting beam printing an image on substrate W.

Figure 8D:
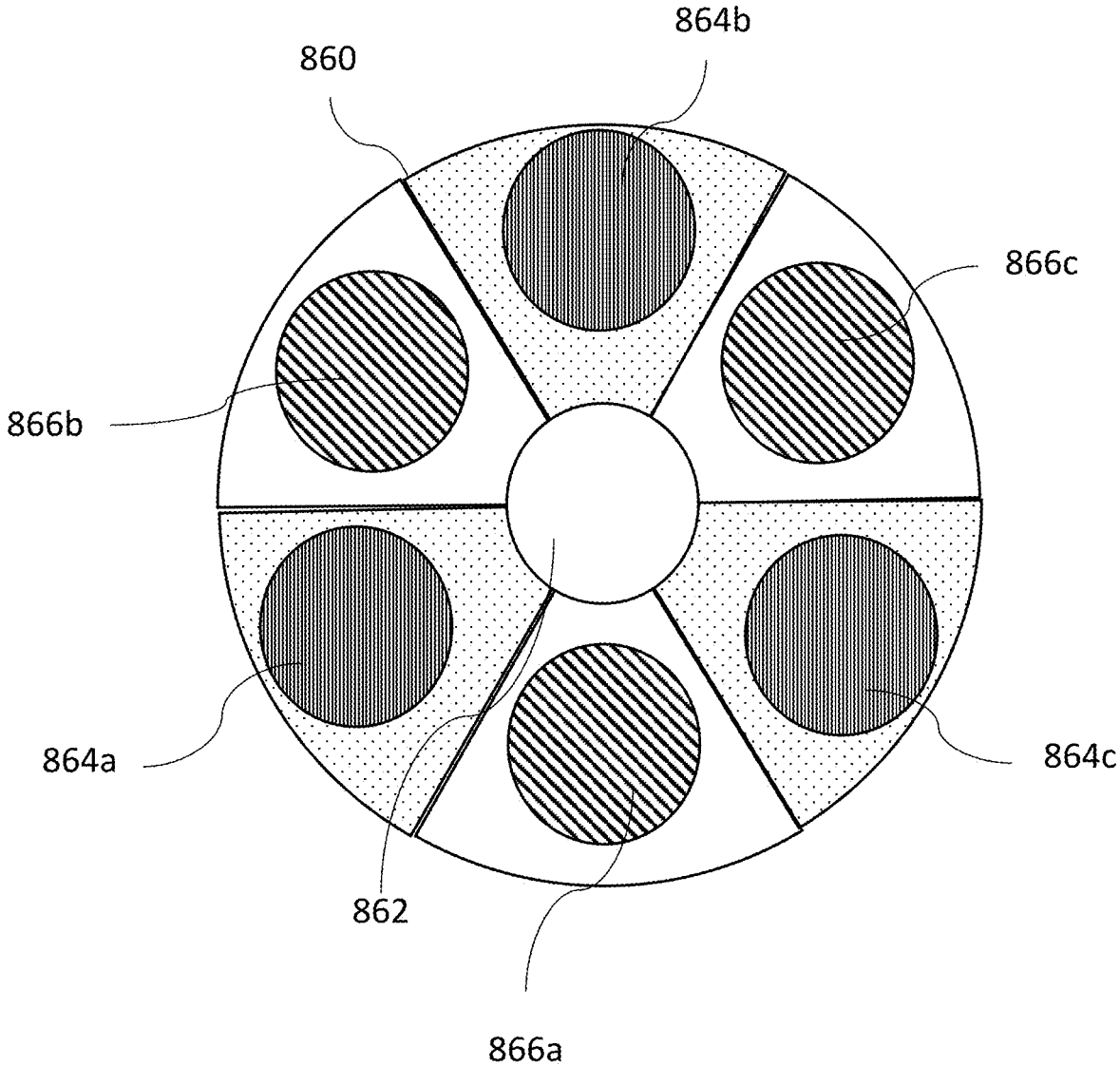
FIG. 8D is a schematic illustration of a pupil plane image of a beam shaped by the phase shift mask of FIG. 8C to suppress a zeroth order portion, in accordance with various embodiments.

FIG. 8D is a schematic illustration of a pupil plane image of a beam shaped by the phase shift mask of FIG. 8C to suppress a zeroth order portion, in accordance with various embodiments. In FIG. 8D, pupil plane image 860 may include a zeroth order intensity 862 and first order intensities 864a-c and 866a-c (e.g., corresponding to the +/−1, +/−1, +/−1 orders). Furthermore, first order intensities 864a-c and 866a-c and zeroth order intensity 862 may have a substantially similar location within pupil plane image 860 as those of first order intensities 814a-c, 816a-c, and 812 of pupil plane image 810. In some embodiments, as a result of 0 and 180-degree phase shift applied via patterning device MA, zeroth order intensity 862 may be suppressed. Furthermore, in some embodiments a filter (e.g., filter 410, 450, 510 of FIGS. 4A, 4B, 5, respectively) may additionally be used to suppress some (e.g., three) of the first order portions so that first order intensities 866a-c may also be suppressed. As a result, the intensity of the beam printing the image on substrate W may be increased by a factor of four. The increased intensity may be due to the filter suppressing some of the first order portions, as well as due to the phase shift suppressing the zeroth order portion by shifting the zeroth order portion to the first order portions. Although some of the first order portions are suppressed, the unsuppressed first order portions gain intensity from the shifted zeroth order portion.

As seen in both FIGS. 8A and 8B, from the configuration of 2D features 804 and 854, there is a three-fold symmetry. Thus, in pupil plane images 810 and 860, there are six first order intensities. To image, three of the six first orders are to be suppressed so that three of the six first orders are used to image.

Figure 9A:
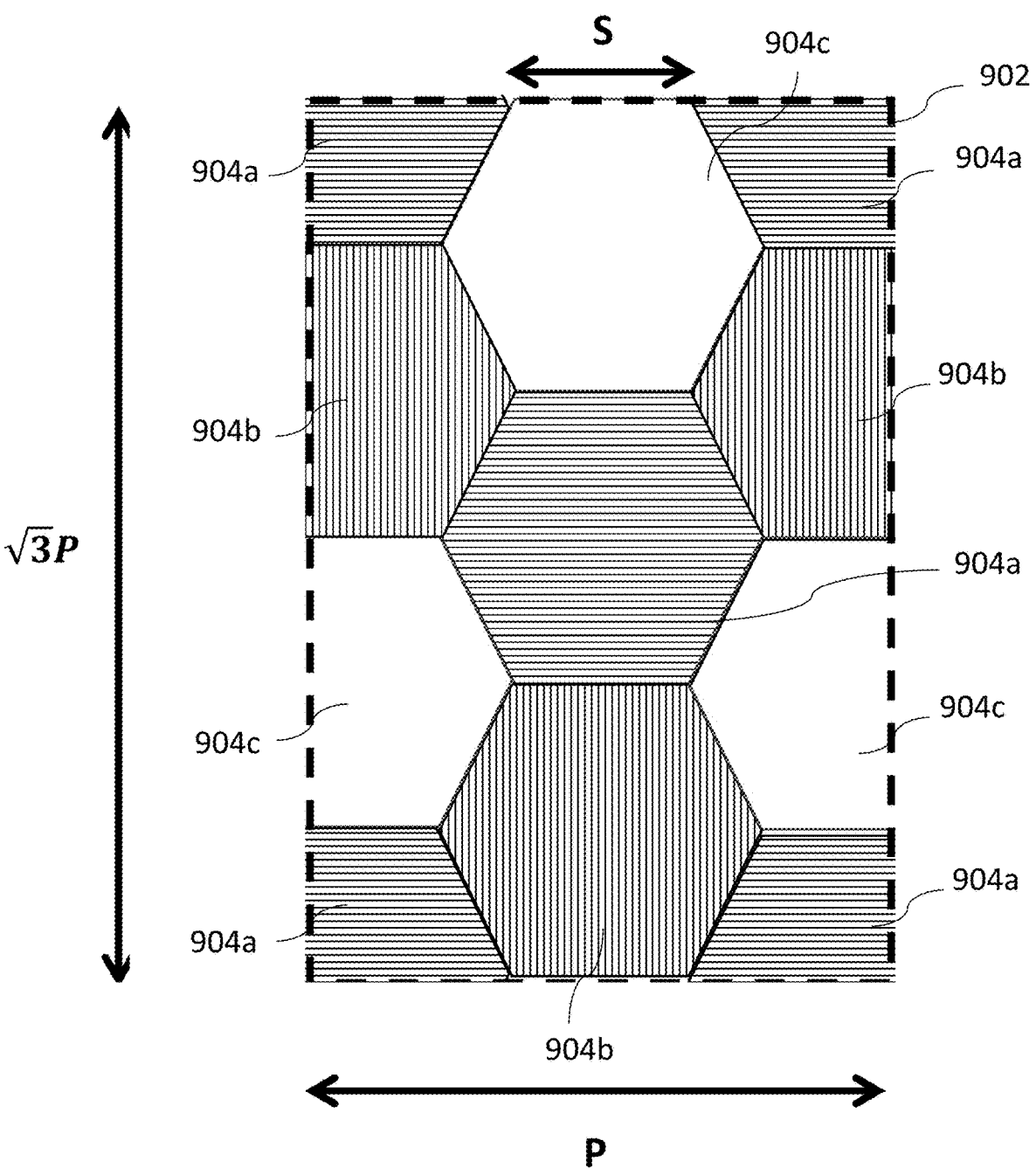
FIG. 9A is a schematic illustration of a portion of a phase shift mask including a 2D feature arranged in a hexagonal pattern, in accordance with various embodiments.

FIG. 9A is a schematic illustration of a portion of a phase shift mask including a 2D feature arranged in a hexagonal pattern, in accordance with various embodiments. In FIG. 9A, a portion of a three-tone phase shift mask, also referred to herein as a tri-tone phase shift mask, is illustrated within a unit cell 902. In some embodiments, the tri-tone phase shift mask illustrated within unit cell 902 may include three different phase shift regions arranged to form an offset honeycomb-like pattern. In some embodiments, the tri-tone phase shift mask may include a first phase shift region 904a, a second phase shift region 904b, and a third phase shift region 904c. In some embodiments, first phase shift region 904a may apply a 0-degree phase shift; second phase shift region 904b may apply a 120-degree phase shift; and third phase shift region 904c may apply a −120-degree phase shift. However, while different "degree" values may be used, the relative values with respect to regions 904a-c are to be +/−120-degree with respect to one another. Regions 904a-c may form a periodic pattern such that, within unit cell 902, each of regions 904a-c repeat, and adjacent columns of regions 904a-c are offset by half a height of the regions. Similarly, to FIGS. 8A and 8B, regions 904a-c may be periodic within unit cell 902, and may have a period P along a first axis, e.g., an x-axis, and a period of $\sqrt{3}$P along a second axis, e.g., a y-axis.

Regions 904a-c may be arranged to form a honeycomb-like or hexagonal pattern. For example, first phase shift region 904a, second phase shift region 904b, and third phase shift region 904c may be formed as hexagonal shapes on patterning device (e.g., phase shift mask) MA. Each side of the hexagonal shapes may be of a dimension S, and a maximal diameter corresponds to $\sqrt{3}$ S. As an example, S may have a value between 15 nm and 33 nm. In some embodiments, regions 904a, 904b, and 904c may be arranged to be located in a column such that a topmost side of region 904a contacts a bottommost side of region 904c, a bottommost side of region 904a contacts a topmost side of region 904b, and a topmost side of region 904c contacts a bottommost side of region 904b. Each adjacent column may also include regions 904a-c arranged in a similar pattern however each of regions 904a-c may be slightly offset from the adjacent column of regions 904a-c. For instance, a bottom half of first phase shift region 904a may contact third phase shift region 904c of each adjacent column and a top half of second phase shift region 904b may contact a bottom half of third phase shift region 904c of each adjacent column. The resulting offset hexagonal placements results in a patterning device MA arranged in a pattern that looks like a honeycomb. Alternative geometric shapes may be used instead of hexagons, and the offset configuration may also be changed. For example, pentagons, octagons, decagons, or other shapes may be used. Furthermore, each of regions 904a-c may be hexagonal, however the corners may not be identical to one another and may have some curvature to them. In some embodiments, absorbers or reflectors may be placed between each hexagonal region. By placing absorbers between the hexagonal regions, the phase shift area's definition and boundary may be improved.

In some embodiments, a filter including three different components that filter three different portions of the shaped beam may also be used instead of a phase shift mask. For example, the filter may be configured such that one part filters a first portion (e.g., related to a 0 degree portion), a second portion (e.g., related to a 120 portion), and a third portion (e.g., −120 degree portion), and therefore suppress the zeroth order portion as well.

Figure 9B:
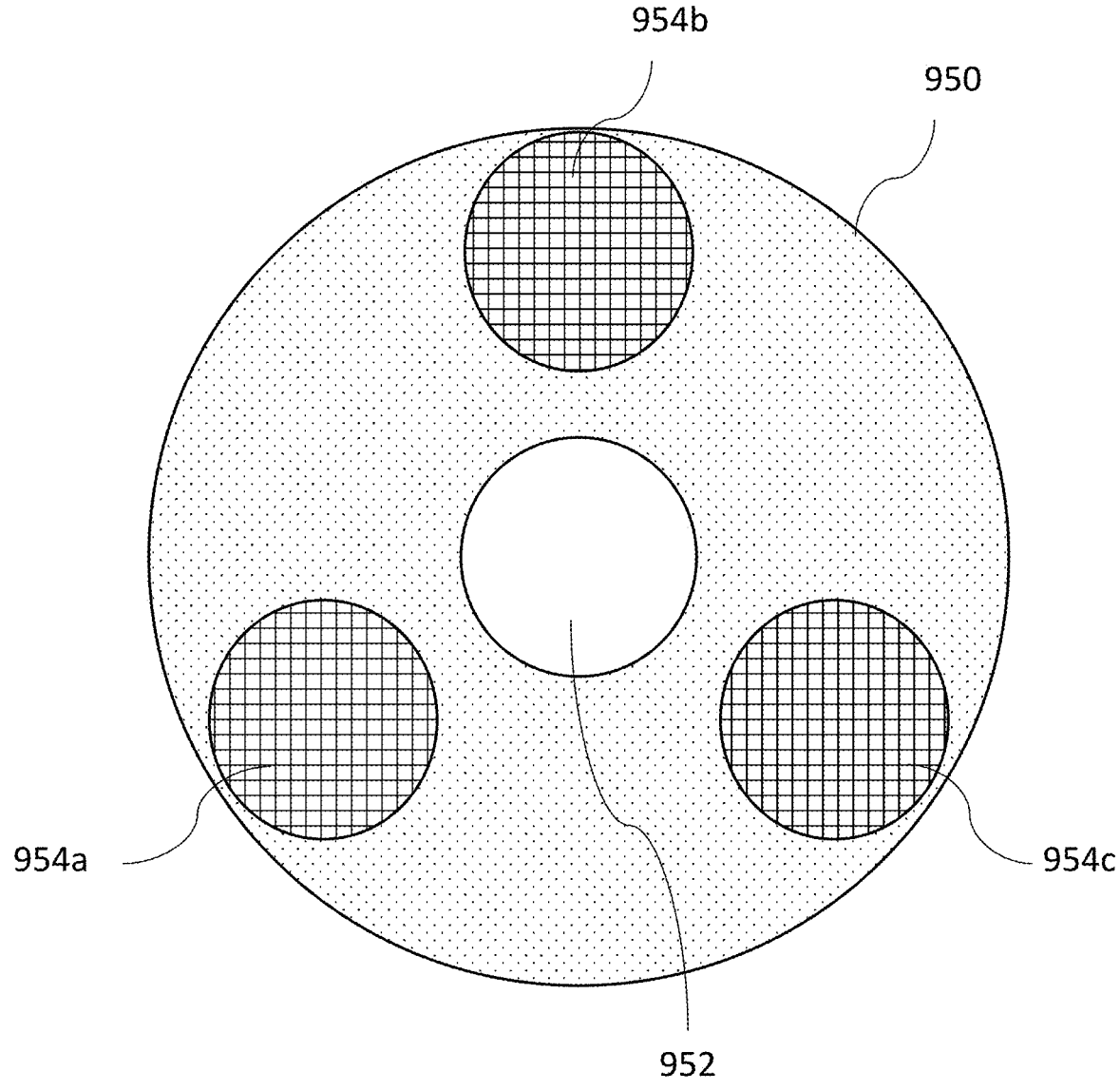
FIG. 9B is a schematic illustration of the pupil plane image of a beam shaped by the phase shift mask of FIG. 9A to suppress a zeroth order portion and some of the first order portions, in accordance with various embodiments of the present teaching.

FIG. 9B is a schematic illustration of the pupil plane image of a beam shaped by the phase shift mask of FIG. 9A to suppress a zeroth order portion and some of the first order portions, in accordance with various embodiments of the present teaching. In some embodiments, pupil plane image 950 may also include zeroth order intensity 952 and first order intensities 954a-c. While the locations of zeroth order intensity 952 may be substantially similar to that of zeroth order intensity 862 of FIG. 8C, zeroth order intensity 952 may be a reduced as a result of the application of the phase shift to the incident radiation beam (e.g., radiation beam 21). For example, as mentioned above, the phase shift mask may cause destructive interference of light that suppress the zeroth order portion, and may further cause constructive interference increasing the intensity of the first order portions. Therefore, in some embodiments, the zeroth order intensity 952 may be approximately 0, as all of the zeroth order portion that would otherwise pass through the pupil and be represented at a location of zeroth order intensity 952 has been shifted to the first order portions.

Furthermore, first order intensities 954a-c may also have a substantially similar location within pupil plane image 950 as those of first order intensities 814a-c of pupil plane image 810. However, differing from pupil plane images 810 and 860, pupil plane image 950 includes three first order intensities 954a-c, as opposed to pupil plane images 810 and 860, which each include six. In some embodiments, as a result of patterning device MA (e.g., a phase shift mask) applying a 0, 120, and −120-degree phase shift, some of the first order portions (e.g., corresponding to first order intensities 816a-c or 866a-c) may be suppressed. For instance, these first order portions (e.g., the first order portions where first order intensities 866a-c would otherwise appear) may be shifted to the other first order portions corresponding to intensities 864a-c. Therefore, intensities 864a-c may have an increased intensity when imaging substrate W as compared to the intensity of the beam imaging substrate W as described in FIG. 8A. For example, a factor of eight increase in intensity of first order intensities 954a-c may be obtained by using a phase shift mask applying a 0, 120, and −120-degree phase shift. For instance, increased first order intensities 954a-c, and subsequently the diminishment of any other first order intensities being present within pupil plane image 950, may be due to shifting of some of the first order portions towards other first order portions, resulting in an increased flux of those first order portions as represented by first order intensities 954a-c. In other words, the intensities associated with those first order portions (e.g., corresponding to first order intensities 866a-c) may be prevented from interacting with adjacent first order portions (e.g., corresponding to first order intensities 954a-c) via a phase shift from the tri-tone phase shift mask. Additionally, additional filters may not be needed as the three of the six first order portions may be suppressed via the tri-tone phase shift mask of FIG. 9A. Any destructive interference between adjacent first order portions may be suppressed, and constructive interference between adjacent first order portions may instead occur. In comparison, for a patterning device not using a tri-tone phase shift mask, filter 410, 450, or 510 may suppress those first order portions, in addition to suppress to the zeroth order portion (e.g., via phase shifting or obscuration). The resulting resolution increase may be approximately three times greater. Furthermore, as a result of the tri-tone phase shift mask, because the intensity of the first order diffracted beams increases, less focus may be realized for the image (e.g., such as within EUV lithographic apparatus 100), and a lower exposure dose may be needed. By decreasing the exposure dose needed, the overall throughput of an EUV system may be increased as short times are needed for exposure and/or scanning. Furthermore, the overall power input to the lithographic apparatus may be maintained while also achieving an increased intensity of the beam imaging substrate W.

Figure 10A:
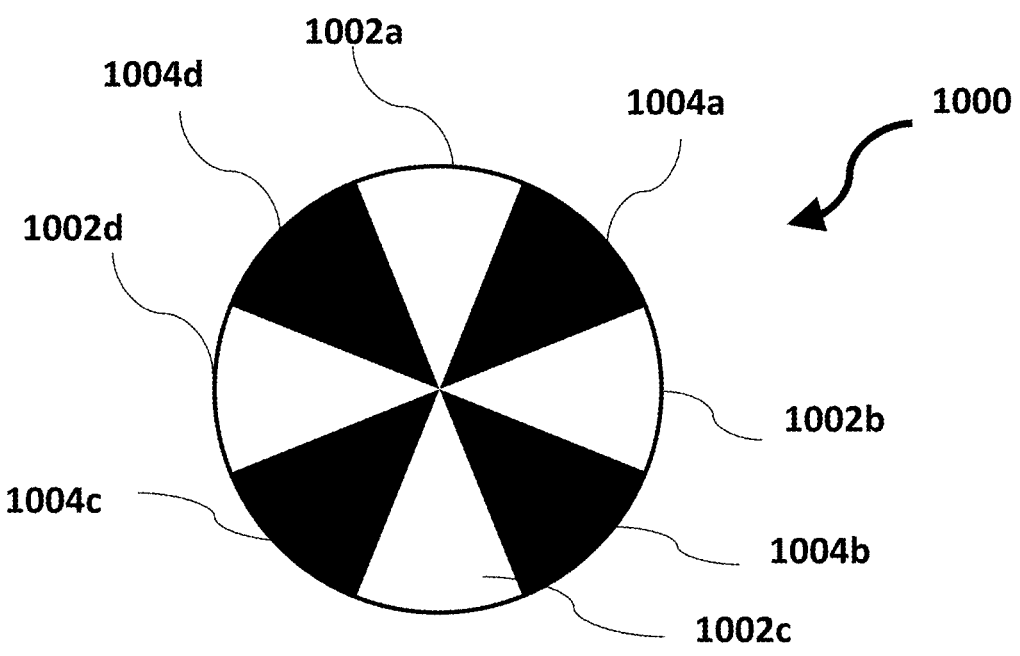
FIGS. 10A-10D are schematic illustrations of various filters without a central obscuration, in accordance with various embodiments.
Figure 10B:
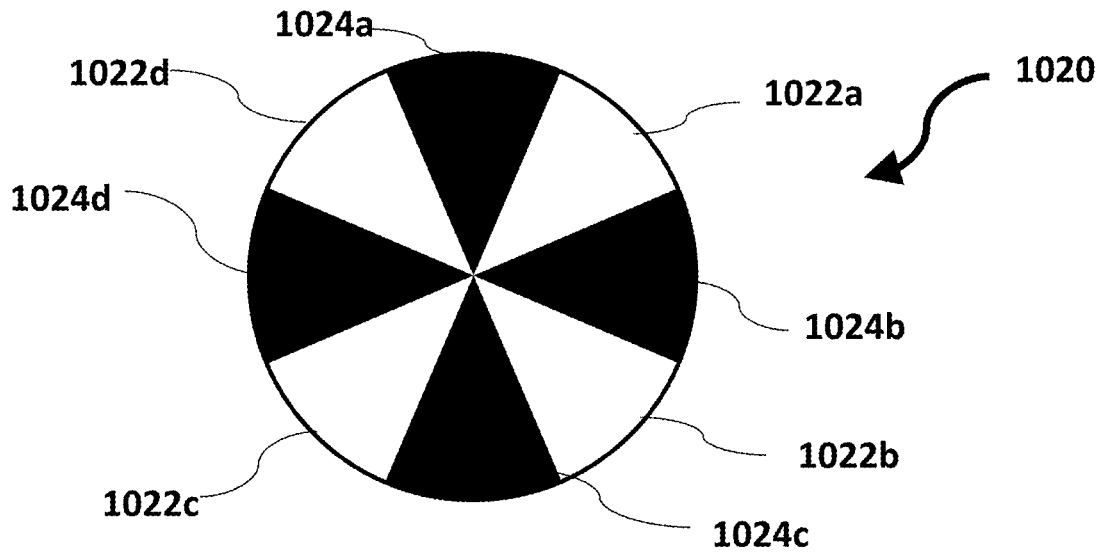
Figure 10C:
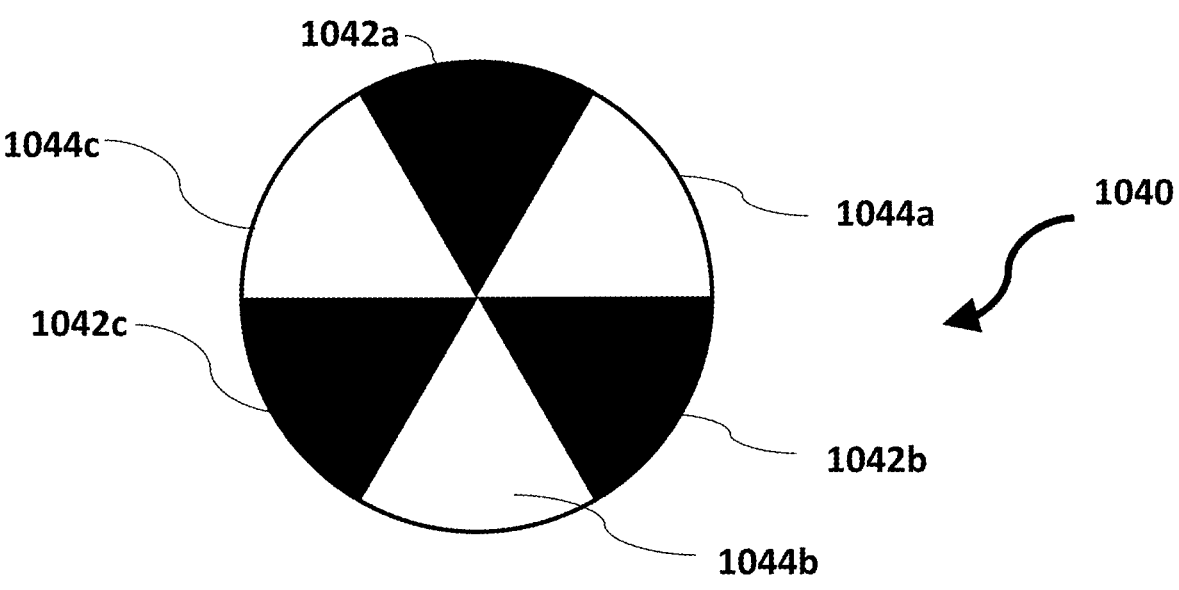
Figure 10D:
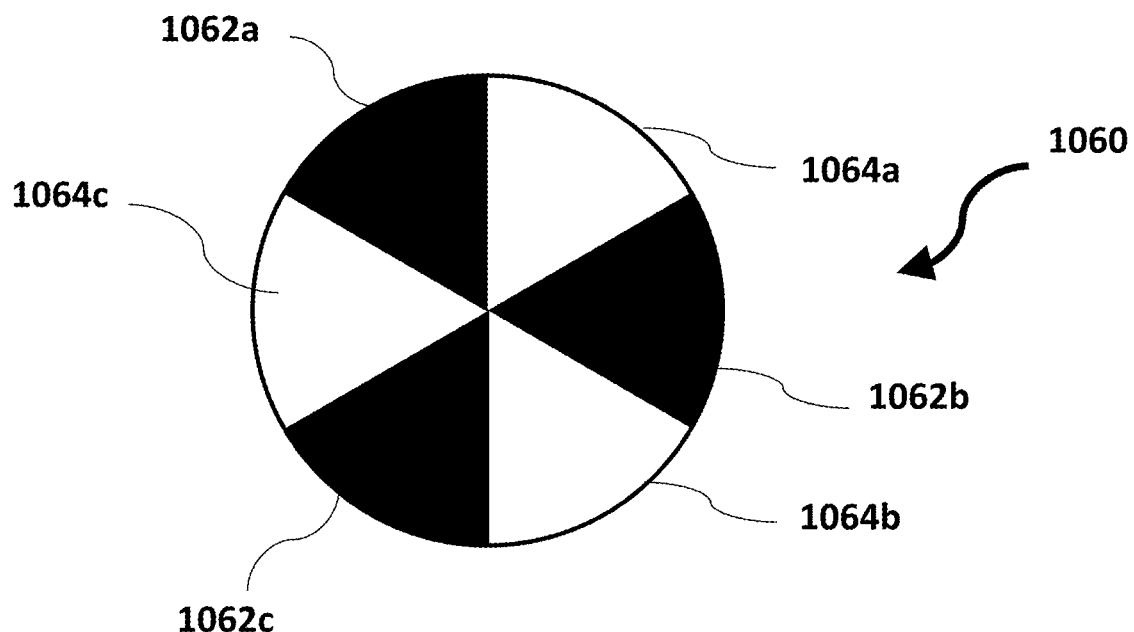

FIGS. 10A-D are schematic illustrations of various filters that do not include a central obscuration that may be used within the lithographic apparatus, in accordance with various embodiments. FIG. 10A is an illustrative example of a filter 1000 including elements 1002*a-d* and 1004*a-d*. FIG. 10B is an illustrative example of filter 1020 including elements 1022*a-d* and 1024*a-d*. FIG. 10C is an illustrative example of filter 1040 including elements 1042*a-d* and 1044*a-d*. FIG. 10D is an illustrative example of filter 1060 including elements 1062*a-d* and 1064*a-d*. In some embodiments, each of filters 1000, 1020, 1040, and 1060 may not include a central obscuration element. For example, filter 1000 may be used in a projection system PS arranged in a Schwarzschild-like optical design, such as in FIG. 5. In this example, reflective element 503 may suppress the zeroth order component, while filter 1000 may be included as filter 510.

In some embodiments, first elements 1002*a-d* may be configured to be transmissive elements that allow incoming radiation to pass through. For example, first elements 1002*a-d* may allow first order portions to pass through and subsequently be directed by projection system PS to substrate W. In some embodiments, elements 1004*a-d* may be configured to be absorbing or reflecting elements that suppress interference between first order portions. For example, if elements 1004*a-d* are absorbing elements, interference of neighboring first order portions and/or higher order portions may be prevented by elements 1004*a-d* absorbing light and prevented the light from propagating through projection system PS and imaging substrate W. In some embodiments, elements 1004*a-d* may be configured as reflecting elements for suppressing interference between some of the first order portions and/or suppressing higher order portions from interfering with the first order portions. For example, if elements 1004*a-d* are reflecting elements, interference of neighboring first order portions and/or higher order portions may be prevented from continuing through projection system PS to incident substrate W. In some embodiments, one or more collecting units may further be included within projection system PS proximate to filter 1000, e.g., including a reflecting elements, so as to collect the reflected radiation.

Filters 1000 and 1020 may each include eight evenly distributed portions. For example, filters 1000 and 1020 may be circular in shape (although not required), and may be divided in eight equally sized portions. For instance, each of elements 1002*a-d* and 1004*a-d* may cover 45-degrees of filter 1000, or ⅛$^{th}$ of the area. Filters 1000 and 1020 may be employed when patterning device MA includes features such as 2D features 704 or 754. For example, 2D features 704 may result diffraction of four first order portions, and thus blocking interference between the first order portions may be accomplished via elements 1004*a-d* of filter 1000 or elements 1024*a-d* of filter 1020. As an illustrative example, blocking elements 780*a-d* may be represented by a filter having a configuration similar to that of filters 1000 and/or 1020. Filters 1000 and 1020 may be substantially similar with the exception that filter 1020 may be rotated by an angle of +/−π/8.

Filters 1040 and 1060 may each include six evenly distributed portions. For example, filters 1040 and 1060 may be circular in shape (although not required), and may be divided in six equally sized portions. For instance, each of elements 1042*a-d* and 1044*a-d* may cover 60-degrees of filter 1040, or ⅙$^{th}$ of the area. Filters 1040 and 1060 may be employed when patterning device MA includes features such as 2D features 804 or 854. For example, 2D features 804 may result in six first order portions (e.g., +/−1, +/−1, +/−1), and thus suppressing some, e.g., three, of these six first order portions may be accomplished via elements 1044*a-d* of filter 1040 or elements 1064*a-d* of filter 1060. In some embodiments, filters 1040 and 1060 of FIGS. 10C and 10D, respectively, may be used to suppress interference between adjacent first order portions for a patterning device MA including 2D features 804 or 854 of FIGS. 8A and 8C, respectively. Filters 1040 and 1060 may be substantially similar with the exception that filter 1060 may be rotated by an angle of +/−π/6.

Figure 11A:
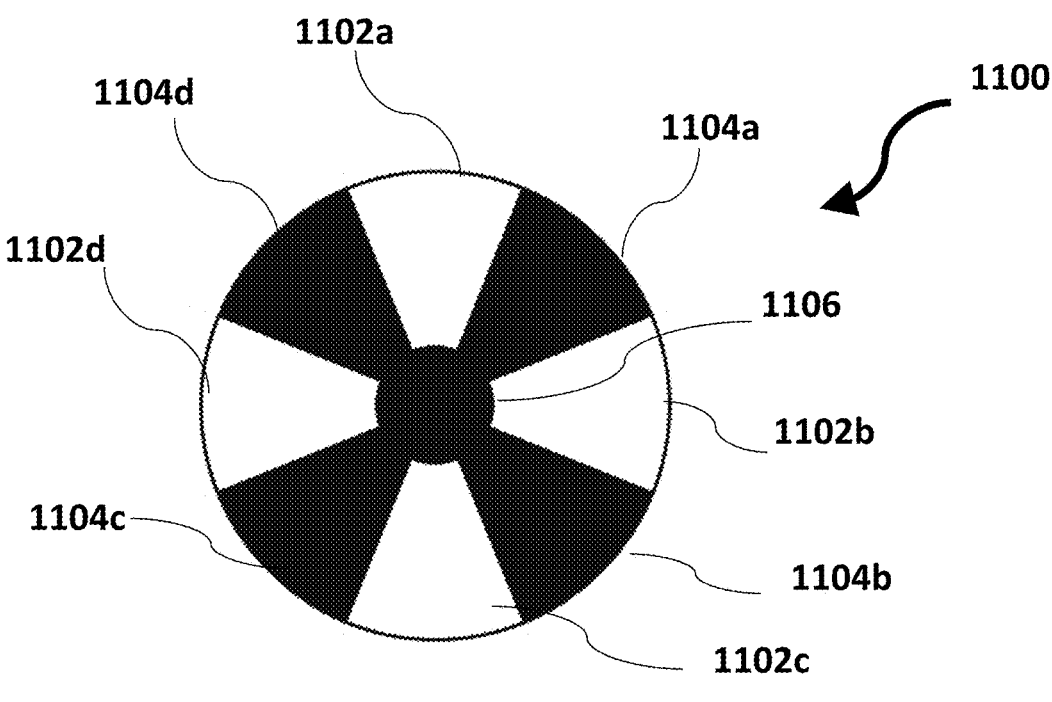
FIGS. 11A-11D are schematic illustrations of various filters including a central obscuration to suppress a zeroth order portion, in accordance with various embodiments.
Figure 11B:
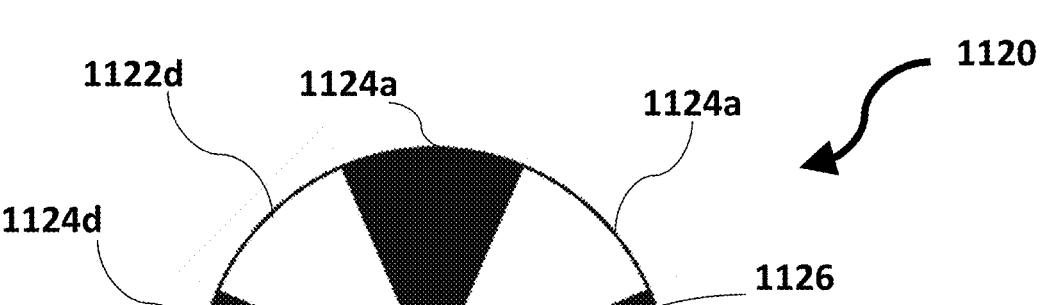
Figure 11B:
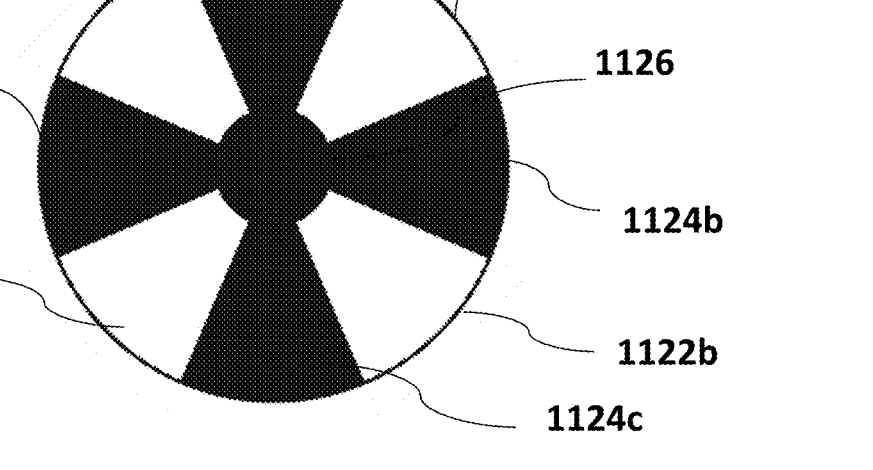
Figure 11C:
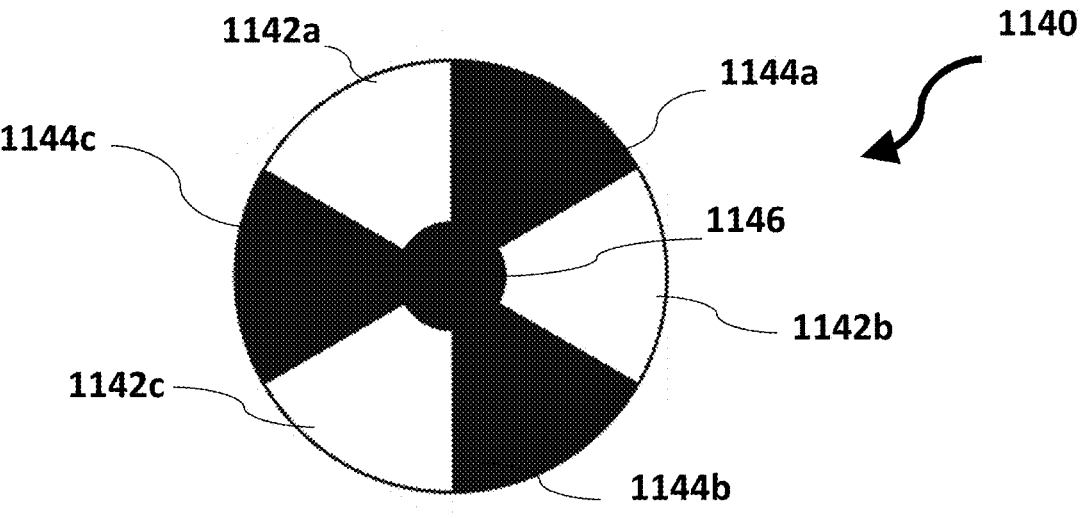
Figure 11D:
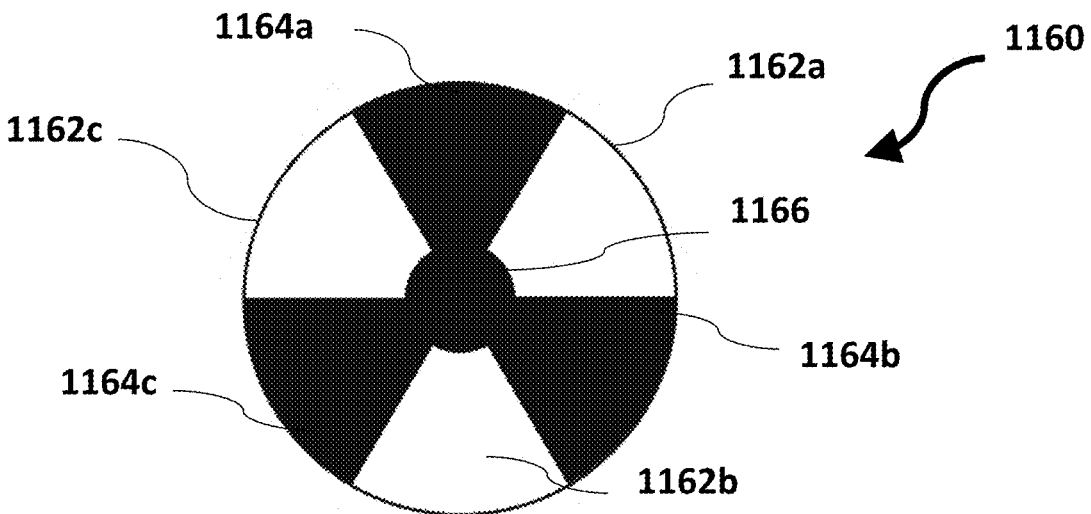

FIGS. 11A-D are schematic illustrations of various filters including a central obscuration that may be used within the lithographic apparatus, in accordance with various embodiments. FIG. 11A is an illustrative example of a filter 1100 including elements 1102*a-d* and 1104*a-d*. FIG. 11B is an illustrative example of filter 1120 including elements 1122*a-d* and 1124*a-d*. FIG. 11C is an illustrative example of filter 1140 including elements 1142*a-d* and 1144*a-d*. FIG. 11D is an illustrative example of filter 1160 including elements 1162*a-d* and 1164*a-d*. In some embodiments, each of filters 1100, 1120, 1140, and 1160 may include a central obscuration element. For example, filter 1100 may be used in a projection system PS of a lithographic apparatus, such as in FIG. 4A and/or 4B.

In some embodiments, elements 1102*a-d* of filter 1100 and elements 1122*a-d* of filter 1120 may be configured to be transmissive elements that allow incoming radiation to pass through. For example, first elements 1102*a-d* may allow first order portions to pass through and subsequently be directed by projection system PS to substrate W. In some embodiments, for a patterning device MA including 2D features 704 of FIG. 7A or 754 of FIG. 7B, elements 1104*a-d* of filter 1100 and elements 1124*a-d* of filter 1120 may be configured to be absorbing or reflecting elements that suppress interference between first order portions. For example, if elements 1104*a-d* are absorbing elements, interference of neighboring first order portions and/or higher order portions may be prevented by elements 1104*a-d* or 1124*a-d* absorbing light and preventing the light from propagating through projecting system PS and imaging substrate W. In some embodiments, elements 1104*a-d* may be configured as reflecting elements for suppressing interference between some of the first order portions and/or suppressing higher order portions form interfering with the first order portion. For example, if elements 1104*a-d* are reflecting elements, interference of the first order portions and/or higher order portions may be prevented from continuing through projection system PS to incident substrate W. In some embodiments, one or more collecting units may further be included within projection system PS proximate to filter 1100, e.g., including a reflecting elements, so as to collect the reflected radiation.

Filters 1100 and 1120 may each include eight evenly distributed portions. For example, filters 1100 and 1120 may be circular in shape (although not required), and may be divided in eight equally sized portions. For instance, each of elements 1102*a-d* and 1104*a-d* may cover 45-degrees of filter 1100, or ⅛$^{th}$ of the area. Filters 1100 and 1120 may be employed when patterning device MA includes features such as 2D features 704 or 754. For example, 2D features 704 may result diffraction of four first order portions, and thus blocking interference between some of the four first order portions may be accomplished via elements 1104*a*-*d* of filter 1100 or elements 1124*a*-*d* of filter 1120. As an illustrative example, blocking elements 780*a*-*d* may be represented by a filter having a configuration similar to that of filters 1100 and/or 1120. Filters 1100 and 1120 may be substantially similar with the exception that filter 1120 may be rotated by an angle of $+/-\pi/8$.

Filters 1100 and 1120 may, in some embodiments, further include central obscuration elements 1106 and 1126, respectively. Central obscuration elements 1106 and 1126 may be included a center of filters 1100 and 1120, and may be configured to suppress a zeroth order portion of radiation incident thereon. For example, filter 1100 may be configured to suppress, e.g., block, a zeroth order portion of shaped radiation beam 411 such that first order portions are allowed to continue through projection system PS toward substrate W for imaging. In some embodiments, central obscuration elements 1106 and 1126 may be configured in a similar manner as those of elements 1104*a*-*d* and 1124*a*-*d*. For example, central obscuration elements 1106 and 1126 may be absorbing elements or reflecting elements that allow for the zeroth order portion to be absorbed or reflected. However, in some embodiments, central obscuration elements 1106 and 1126 may differ in suppression technique from those of elements 1104*a*-*d* and 1124*a*-*d*, respectively. For example, central obscuration elements 1106 and 1126 may be absorbing elements, whereas elements 1104*a*-*d* and 1124*a*-*d* may be reflective elements.

Filters 1140 and 1160 may each include six evenly distributed portions. For example, filters 1140 and 1160 may be circular in shape (although not required), and may be divided in six equally sized portions. For instance, each of elements 1142*a*-*d* and 1144*a*-*d* may cover 60-degrees of filter 1140, or $\frac{1}{6}^{th}$ of the area. Filters 1140 and 1160 may be employed when patterning device MA includes features such as 2D features 804 or 854. For example, 2D features 804 may result diffraction of six first order portions, and thus blocking of some, e.g., three, of these six first order portions (e.g., $+/-1$, $+/-1$, $+/-1$), and thus suppressing some, e.g., three, of these six first order portions may be accomplished via elements 1144*a*-*d* of filter 1140 or elements 1164*a*-*d* of filter 1160. Filters 1140 and 1160 may be substantially similar with the exception that filter 1160 may be rotated by an angle of $+/-\pi/6$.

Similar to filters 1100 and 1120, filters 1140 and 1160 may, in some embodiments, further include central obscuration elements 1146 and 1166, respectively. Central obscuration elements 1146 and 1166 may be included a center of filters 1140 and 1160, and may be configured to suppress a zeroth order portion of radiation incident thereon. For example, filter 1140 may be configured to suppress, e.g., block, a zeroth order portion of shaped radiation beam 411 such that first order portions are allowed to continue through projection system PS toward substrate W for imaging. In some embodiments, central obscuration elements 1146 and 1166 may be configured in a similar manner as those of elements 1144*a*-*c* and 1164*a*-*c*. For example, central obscuration elements 1146 and 1166 may be absorbing elements or reflecting elements that allow for the zeroth order portion to be absorbed or reflected. However, in some embodiments, central obscuration elements 1146 and 1166 may differ in suppression technique from those of elements 1144*a*-*c* and 1164*a*-*c*, respectively. For example, central obscuration elements 1146 and 1166 may be absorbing elements, whereas elements 1144*a*-*c* and 1164*a*-*c* may be reflective elements.

Figure 12A:
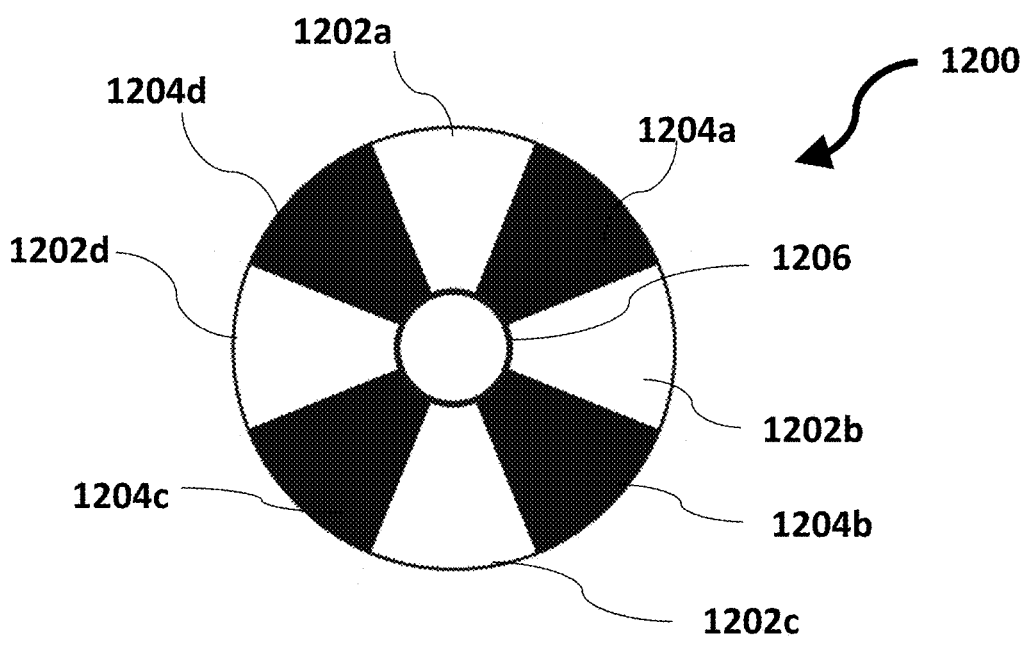
FIGS. 12A-12D are schematic illustrations of various filters including an aperture to suppress a zeroth order portion, in accordance with various embodiments.
Figure 12B:
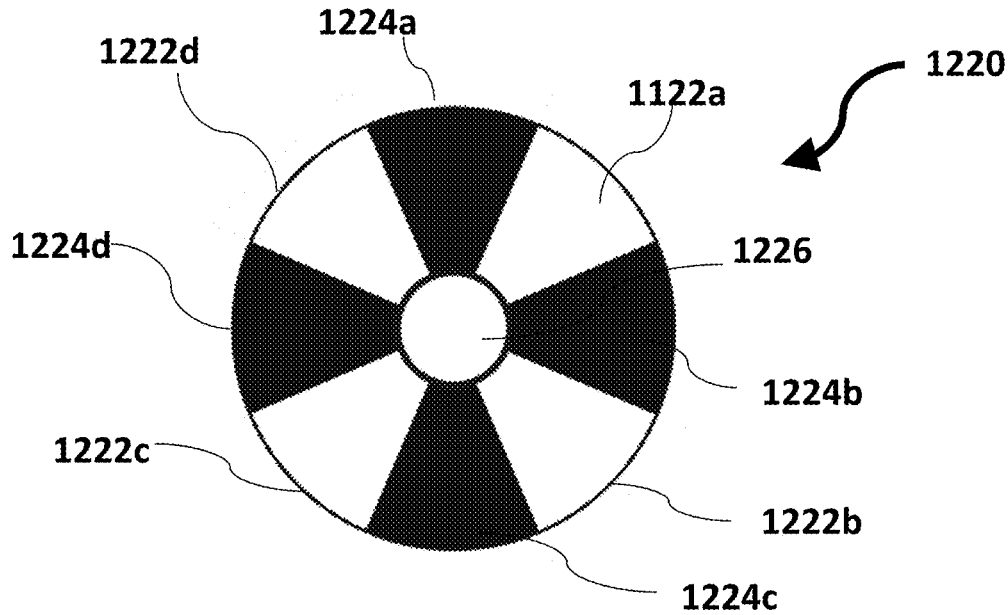
Figure 12C:
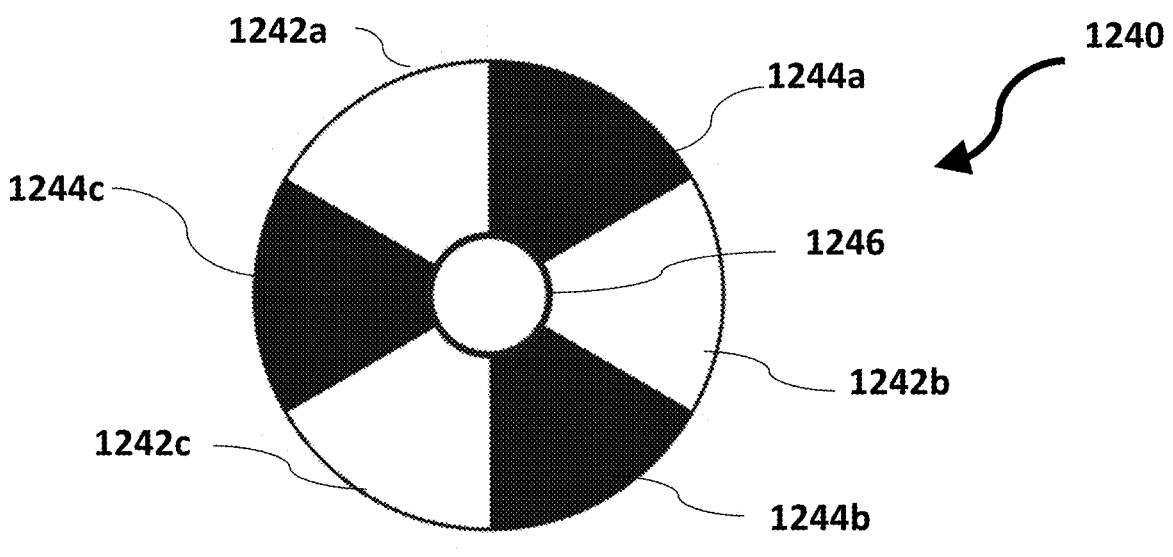
Figure 12D:
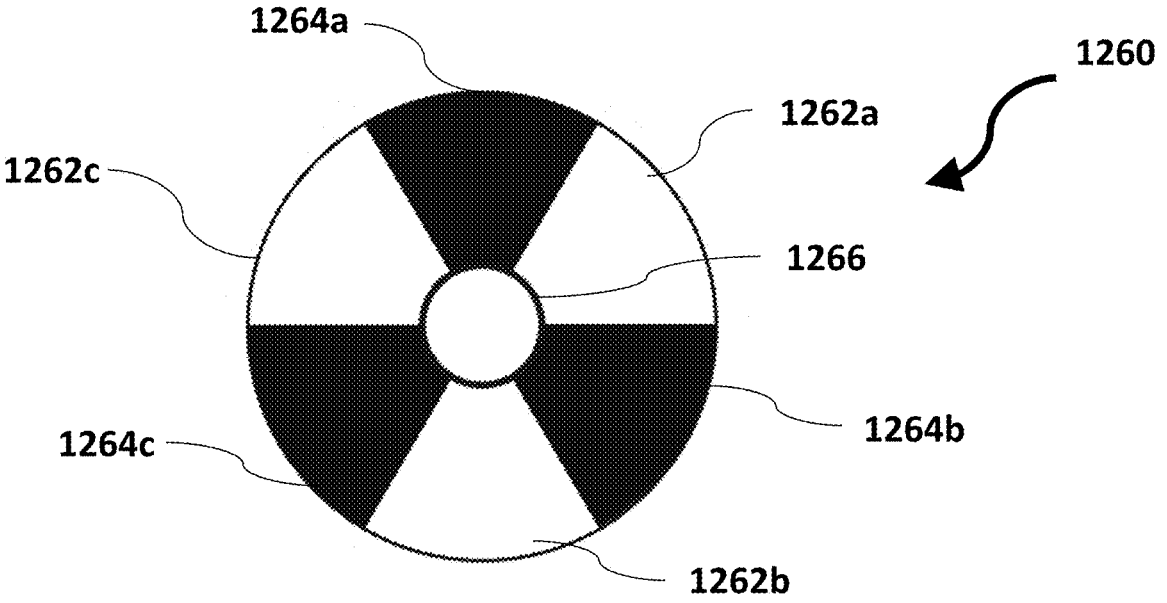

FIGS. 12A-D are schematic illustrations of various filters including an aperture to suppress a zeroth order portion, in accordance with various embodiments. FIG. 12A is an illustrative example of a filter 1200 including elements 1202*a*-*d* and 1204*a*-*d*. FIG. 12B is an illustrative example of filter 1220 including elements 1222*a*-*d* and 1224*a*-*d*. FIG. 12C is an illustrative example of filter 1240 including elements 1242*a*-*d* and 1244*a*-*d*. FIG. 12D is an illustrative example of filter 1260 including elements 1262*a*-*d* and 1264*a*-*d*. In some embodiments, each of filters 1200, 1220, 1240, and 1260 may include a central obscuration element. For example, filter 1200 may be used in a projection system PS of a lithographic apparatus, such as in FIG. 4A and/or 4B.

In some embodiments, elements 1202*a*-*d* of filter 1200 and elements 1222*a*-*d* of filter 1220 may be configured to be transmissive elements that allow incoming radiation to pass through. For example, first elements 1202*a*-*d* may allow first order portions to pass through and subsequently be directed by projection system PS to substrate W. In some embodiments, for a patterning device MA including 2D features 704 of FIG. 7A or 754 of FIG. 7B, elements 1204*a*-*d* of filter 1200 and elements 1224*a*-*d* of filter 1220 may be configured to be absorbing or reflecting elements that suppress interference between first order portions. For example, if elements 1204*a*-*d* are absorbing elements, interference of neighboring first order portions and/or higher order portions may be prevented by elements 1204*a*-*d* or 1224*a*-*d* absorbing light and preventing the light from propagating through projecting system PS and imaging substrate W. In some embodiments, elements 1204*a*-*d* may be configured as reflecting elements for suppressing interference between some of the first order portions and/or suppressing higher order portions form interfering with the first order portion. For example, if elements 1204*a*-*d* are reflecting elements, interference of the first order portions and/or higher order portions may be prevented from continuing through projection system PS to incident substrate W. In some embodiments, one or more collecting units may further be included within projection system PS proximate to filter 1200, e.g., including a reflecting elements, so as to collect the reflected radiation.

Filters 1200 and 1220 may each include eight evenly distributed portions. For example, filters 1200 and 1220 may be circular in shape (although not required), and may be divided in eight equally sized portions. For instance, each of elements 1202*a*-*d* and 1204*a*-*d* may cover 45-degrees of filter 1200, or $\frac{1}{8}^{th}$ of the area. Filters 1200 and 1120 may be employed when patterning device MA includes features such as 2D features 704 or 754. For example, 2D features 704 may result diffraction of four first order portions, and thus blocking interference between some of the four first order portions may be accomplished via elements 1204*a*-*d* of filter 1200 or elements 1224*a*-*d* of filter 1220. As an illustrative example, blocking elements 780*a*-*d* may be represented by a filter having a configuration similar to that of filters 1200 and/or 1220. Filters 1200 and 1220 may be substantially similar with the exception that filter 1220 may be rotated by an angle of $+/-\pi/8$.

Filters 1200 and 1220 may, in some embodiments, further include central obscuration elements 1206 and 1226, respectively. Central obscuration elements 1206 and 1226 may be included as a center of filters 1200 and 1220, and may be configured to suppress a zeroth order portion of radiation incident thereon. For example, filter 1200 may be configured to suppress a zeroth order portion of shaped radiation beam 411 such that first order portions are allowed to continue through projection system PS toward substrate W for imaging. In some embodiments, central obscuration elements 1206 and 1226 may include a central opening that may allow the zeroth order portion of shaped radiation beam 411 to pass through, while the first order portions reflect off of elements 1204*a-d* (alternatively, the first order portions may reflect off of elements 1202*a-d*). In some embodiments, a collection unit may be located on one side of filters 1200 and 1220 to collect the zeroth order portion passing through central obscuration elements 1206 or 1226 (e.g., in the scenario where central obscuration elements 1206 or 1226 correspond to openings that allow shaped radiation beam 411 to pass through). The collection units may prevent the zeroth order portion from being reintroduced within projection system PS, and causing unwanted interference with the first (or other) order portions intended to incident substrate W.

Filters 1240 and 1260 may each include six evenly distributed portions. For example, filters 1240 and 1260 may be circular in shape (although not required), and may be divided in six equally sized portions. For instance, each of elements 1242*a-d* and 1244*a-d* may cover 60-degrees of filter 1240, or ⅙$^{th}$ of the area. Filters 1240 and 1260 may be employed when patterning device MA includes features such as 2D features 804 or 854. For example, 2D features 804 may result diffraction of six first order portions, and thus blocking of some, e.g., three, of these six first order portions (e.g., +/−1, +/−1, +/−1), and thus suppressing some, e.g., three, of these six first order portions may be accomplished via elements 1244*a-d* of filter 1240 or elements 1264*a-d* of filter 1260. Filters 1240 and 1260 may be substantially similar with the exception that filter 1260 may be rotated by an angle of +/−π/6.

Similar to filters 1200 and 1220, filters 1240 and 1260 may, in some embodiments, include central obscuration elements 1246 and 1266, respectively. Central obscuration elements 1246 and 1266 may be included a center of filters 1240 and 1260, and may be configured to suppress a zeroth order portion of radiation incident thereon. For example, filter 1240 may be configured to suppress, a zeroth order portion of shaped radiation beam 411 such that first order portions are allowed to continue through projection system PS toward substrate W for imaging. In some embodiments, central obscuration elements 1246 and 1266 may include a central opening that may allow the zeroth order portion of shaped radiation beam 411 to pass through, while the first order portions reflect off of elements 1244*a-c* (alternatively, the first order portions may reflect off of elements 1242*a-c*). In some embodiments, a collection unit may be located on one side of filters 1240 and 1260 to collect the zeroth order portion passing through central obscuration elements 1246 or 1266 (e.g., in the scenario where central obscuration elements 1246 or 1266 correspond to openings that allow shaped radiation beam 411 to pass through). The collection units may prevent the zeroth order portion from being reintroduced within projection system PS, and causing unwanted interference with the first (or other) order portions intended to incident substrate W.

Figure 13:
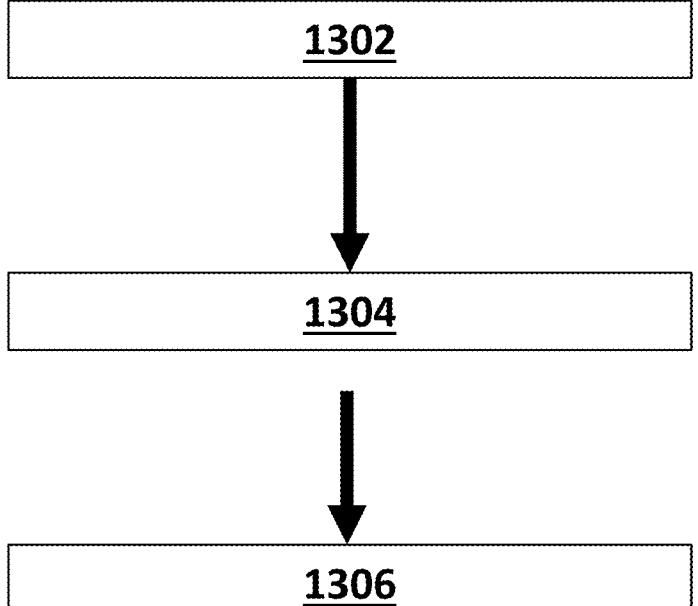
FIG. 13 is an illustrative flowchart of an exemplary process, in accordance with various embodiments.

FIG. 13 is an illustrative flowchart of an exemplary process, in accordance with various embodiments. Process 1300 may, in some embodiments, begin at step 1302. At step 1302, a radiation beam, output by a source, may be caused to be shaped by a patterning device including one or more 2D features. For example, radiation beam 21 may, upon diffracting off patterning device MA, be shaped in accordance with one or more 2D features, e.g., features 604, 654, 704, 754, 804, 854, and 904*a-c* located thereon. At step 1304, at least a zeroth order portion of the shaped radiation beam may be caused to be suppressed. For example, filter 410 or 450 may suppress the zeroth order portion of shaped radiation beam 411. For instance, the zeroth order portion may be suppressed by filters 1100-1160 of FIGS. 11A-D or filters 1200-1260 of FIGS. 12A-D. As another example, reflective element 503 may cause a zeroth order portion of radiation beam 511 to be suppressed. In yet another example, patterning device MA may correspond to a phase shift mask, which in turn may cause the zeroth order portion of the radiation beam to be suppressed. At step 1306, an unsuppressed portion of the radiation beam may be directed towards a substrate to form an image on the substrate according to the one or more 2D features. For example, the first order portions that are not suppressed by filter 410 or 450, reflective element 503, or the phase shift mask, may be directed through projection system PS toward substrate W to form an image in accordance with the features on patterning device MA.

As mentioned above, a patterning device, such as a phase shift mask (PSM), may be incorporated into an EUV lithographic apparatus, (e.g., EUV lithographic apparatus 100 of FIGS. 1 and 2), to form images on a substrate using first diffraction orders. In some embodiments, the PSM may suppress the zeroth order portion of an incident EUV radiation beam by applying a phase shift, e.g., 180-degrees, to a portion of the incident radiation beam, thereby making the incident radiation 180-degrees out of phase with respect to the other portion of the incident radiation beam. As a result, the zeroth diffraction order may be completely suppressed, and the first diffraction orders of the EUV radiation beam may remain, which may be used to form an image on the substrate. The phase shift mask may suppress the zeroth order portion of the incident radiation beam as a result of destructive interference of the radiation beam, while constructive interference of the incident radiation beam may increase the intensity of the first order portions used to form the desired image on the substrate. The first order portions having a higher intensity may result in improved contrast of features formed on the substrate. In some embodiments, the PSM may apply a phase shift to an incident radiation beam that is related to a type of feature to be printed. For example, for a PSM that includes 2D features, such as seen in FIGS. 6A-D and 7A-D above, a 0 and 180-degree phase shift may be used, whereas for a PSM that includes 2D features such as those seen in FIGS. 8A-D and 9A-B, a 0 and 180-degree phase shift or a 0-degree, 120-degree, and −120-degree phase shift may be used.

The phase shift mask described above may be referred to as a "hard" phase shift mask or hard PSM. Hard PSMs operate by applying a phase shift to the incident radiation beam, which results in suppression of the zeroth order portion of the incident radiation beam and an increase in the intensity of the first (or higher) order portions. The hard PSMs for the EUV range, e.g., 5-20 nm wavelengths, may provide a normalized image log-slope (NILS) gain when applied to periodic patterns. Hard PSMs may enable high normalized image-log slope (NILS) gain for the tightest of pitches, which increases CD uniformity, and may enable defect free printing of features on a substrate. Furthermore, another benefit of the hard PSM is that it's layout for periodic structures (e.g., for printing contact holes or dense lines) gives rise to frequency doubling. Frequency doubling allows for less dose to be used while still achieving a same intensity and yield.

However, to fabricate a hard PSM for the EUV range, modifications need to be made to a multi-layer mirror of the mask's absorber stack. Hard PSMs may obtain their phase shift properties from differences to the heights of the mask's topography. Such precise control of the mask's upper layer height is difficult to achieve with a high degree of accuracy, and is particular difficult for the EUV range. By modifying the multi-layer mirror(s), the fabrication process for the hard PSM increases in complexity, giving rise to reticle defects. Furthermore, because of these and other challenges associated with fabricating PSMs for the EUV range, repairing such hard PSMs will likely present additional, and unexpected, challenges.

Many of the challenges associated with obtaining hard PSMs for EUV ranges are not present in the case of binary masks and attenuated phase shift masks (PSMs) for EUV ranges. Attenuated PSMs may also be referred to herein interchangeably as attPSMs. A binary mask includes regions of transmission or reflection, depending on whether the mask is fabricated for the non-EUV range of the EUV range, respectively. An attenuated PSM, like that of a hard PSM, applies a phase shift to the incident radiation beam, however the phase shift may be applied to a portion of the incident radiation beam. The attenuated PSM may obtain its phase shifting as a result of the multi-layer stack in the absorber, making attenuated PSMs easier to fabricate with the necessary accuracy for the EUV range. Different from the hard PSM, because the attenuated PSM does fully absorb the light, the remaining part of the light may include a zeroth order portion. Although the zeroth order portion's amount is less than that of the binary mask, the remaining zeroth order portion may decrease the imaging contrast of the EUV lithographic apparatus resulting in an increase in defects to the printed features. This may be particular problematic as the pitches of the features to be printed reaches of the order of 10 nm (e.g., 8 nm half pitch lines and 11 nm half pitch contact holes). Furthermore, if the attenuated PSM has a same layout for periodic structures as that of the hard PSM, so as to decrease the needed dose, frequency doubling may also occur. However, because the attenuated PSM does not fully suppress the zeroth order portion, the zeroth order portion may reduce the contrast of the image being printed by interfering with the first (or higher) order portions.

In some embodiments, to achieve the results of a hard phase shift mask for the EUV range, an attenuated PSM may be used in conjunction with an obscuration located in a projection system of an EUV lithographic apparatus. In some embodiments, the obscuration may be a central obscuration, which may be centered with respect to an imaging lens of the EUV lithographic apparatus. The obscuration may be configured to suppress any zeroth order portion of an incident radiation beam remaining after being shaped by the attenuated PSM, such that first (or higher) order portions of the radiation beam may be used to print an image on a substrate. In some embodiments, a binary mask may be used instead of an attPSM, however because the binary mask diffracts most of the light into the zeroth order, a higher dose may be required. Furthermore, use of the attenuated PSM as compared to the binary mask may result in less zeroth order diffraction remaining. Additionally, by using a hard PSM pattern for the attenuated PSM, less dose may be needed due to frequency doubling. In some embodiments, when used with the obscuration to suppress the zeroth order diffraction resulting from patterning via an attenuated PSM, the net effect may be imaging as if a hard PSM was used.

Figure 14A:
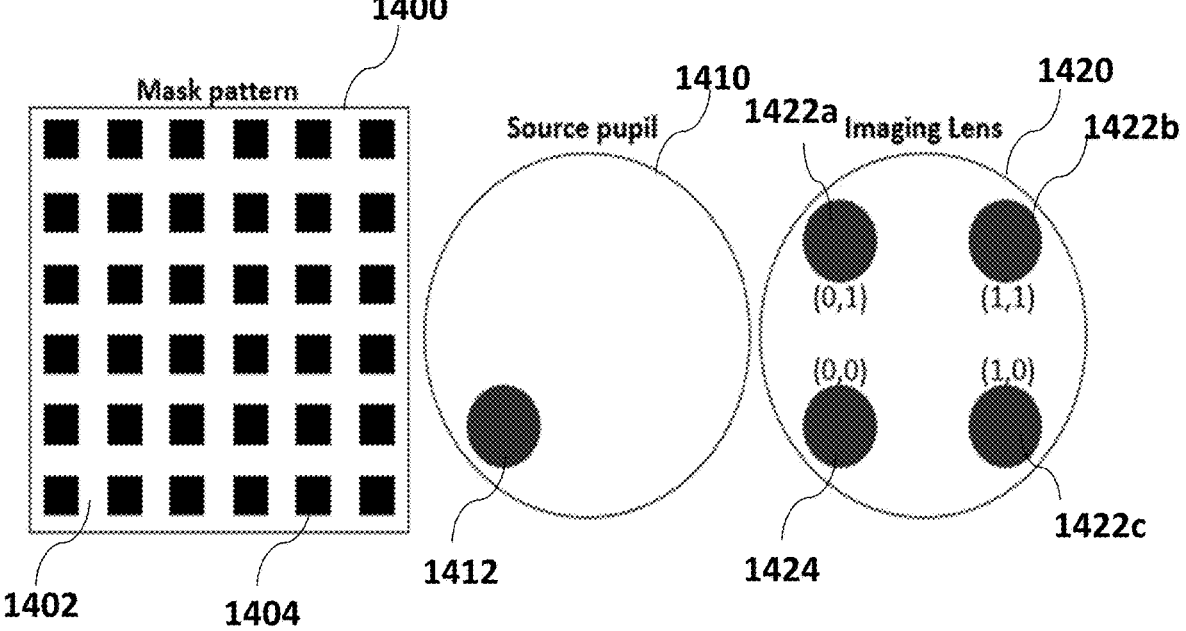
FIGS. 14A and 14B are schematic illustrations of an attenuated phase shift mask, a source pupil, and an imaging lens for printing of images on a substrate using a lithographic apparatus, in accordance with various embodiments.
Figure 14B:
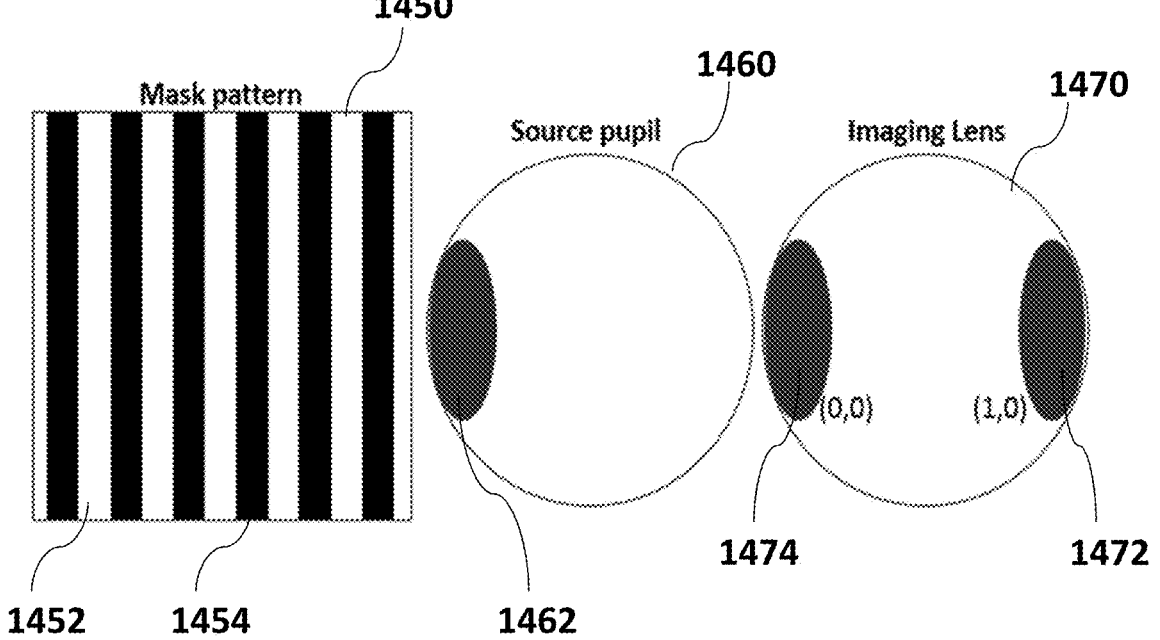

FIGS. 14A and 14B are schematic illustrations of an attenuated phase shift mask, a source pupil, and an imaging lens for printing images on a substrate using a lithographic apparatus, in accordance with various embodiments. In FIG. 14A, a patterning device 1400 is illustrated. Patterning device 1400, which may also be referred to as patterning device MA 1400, may be incorporated into a lithographic apparatus for printing features onto a substrate. For instance, patterning device 1400 may be placed on a patterning device support structure, such as support structure MT. Patterning device 1400 may include a pattern to be imparted to an incident radiation beam. The imparted pattern may shape the incident radiation beam to form the desired pattern on a target portion of a substrate. In some embodiments, patterning device 1400 may be an attenuated PSM. Alternatively, in some embodiments, patterning device 1400 may be a binary mask. As described herein, the radiation beam after being incident on a patterning device may be referred to interchangeably as a shaped radiation beam or a configured radiation beam. Furthermore, a radiation beam may also be referred to herein interchangeably as light or a light beam. In some embodiments, the radiation beam may be in the EUV range, e.g., 5-20 nm, however other wavelengths are possible. As an example, the EUV radiation beam may have a wavelength of 13.5 nm.

In some embodiments, patterning device 1400 may include first regions 1402 and second regions 1404. First regions 1402 may, in the EUV range, represent regions of reflection, whereas second regions 1404 may represent regions of partial reflection. Furthermore, second regions 1404 may represent regions where a phase shift may be applied to the incident radiation beam such that a portion of the incident radiation beam that is not absorbed by second region 1404 is phase shifted with respect to the radiation beam reflected by first regions 1402. By partial reflection, a small percentage of the radiation that is incident on second regions 1404 is allowed to reflect while also receiving a phase shift. The remaining radiation is absorbed and does not reflect, thereby not contributing to the radiation used to form an image on the substrate. As an example, the percentage of light reflected by second regions 1404 may be within the range of 6% to 20%. For example, second regions 1404 may allow for 10% of the incident light to be reflected while also receiving a phase shift, and where the remaining 90% of the incident light is absorbed. In some embodiments, the phase shift applied by second regions 1404 may be a 180-degree (e.g., $\pi$) phase shift. For a non-EUV environment, instead of reflective and partially reflective regions, patterning device 1400 may be an attPSM including transmissive and partially transmissive regions.

In some embodiments, the array, e.g., the pattern, of first regions 1402 and second regions 1404 on patterning device 1400 may characterize the image to be printed onto the substrate. For example, the array of regions 1402 and 1404 may form a pattern used to print contact holes on a substrate. In some embodiments, patterning device 1400 may include a pattern of dark regions (e.g., second regions 1404) that form a six by six array. When the radiation beam is incident on patterning device 1400, the radiation beam may reflect off of first regions 1402 and partially reflect off of second regions 1404. The radiation beam that is partially reflected by second regions 1404 may receive a, e.g., 180-degree, phase shift with respect to the radiation beam reflected by first regions 1402. The partially reflected and phase shifted radiation beam has a lower intensity due to the suppression applied by patterning device 1400, and therefore is not strong enough to print features on the substrate. However, the phase shifted light may decrease the intensity between the portions of the substrate that form the features as a result of destructive interference with the non-phase shifted light and may increase the intensity of the portions of the shaped radiation beam that form the features. As a result, the contrast of the features printed on the substrate may be increased. In some embodiments, patterning device 1400 may be used to print a six by six array of contact holes on a substrate, where each contact hole is formed at a location on the substrate corresponding to a location of each dark region, e.g., second regions 1404.

In some embodiments, source pupil 1410 may describe a view of a quadrupole light source, which may also be referred to herein interchangeably as a quasar light source, used to emit the radiation beam that may be patterned by patterning device 1400. Source pupil 1410 may include a pole 1412 representing a portion of the output illumination from an illuminator (e.g., illuminator IL) that conditions the radiation beam output by a source (e.g., source SO). In some embodiments, the source pupil may include four (4) poles that collectively form the radiation beam output by illuminator IL. For example, source pupil 1410 may include poles, each of which may be configured to output a radiation beam that will incident patterning device 1400, and be configured to form an image on a substrate, e.g., substrate W, in accordance with the pattern on patterning device 1400. For example, illuminator IL may condition the radiation beam such that the output radiation beam is a monopole source, a dipole source, a quasar or quadrupole source, or another type of source.

In some embodiments, imaging lens 1420 may describe a view of an imaging lens 1420 used to form an image on a substrate in accordance with a pattern of patterning device 1400. In some embodiments, imaging lens 1420 may be included within a projection system PS. In some embodiments, imaging lens 1420 may be located external to projection system PS, a distance from the substrate that the image is to be printed on. Imaging lens 1420 may be a final lens that the shaped radiation beam passes through before being incident on substrate W and may determine how the patterned radiation beam will form the desired image on substrate W. In some embodiments, a zeroth order portion 1424 of the shaped radiation beam and three first order portions 1422*a-c* of the shaped radiation beam may be incident on imaging lens 1420. Zeroth order portion 1424 may be referred to as the (0, 0) diffraction order, while the three first order portions 1422*a-c* may be referred to as the (0, 1), (1, 1), and (1, 0) diffraction orders, respectively. Due to patterning device 1400 being an attenuated PSM, the zeroth order portion of the shaped radiation beam is present at imaging lens 1420. Therefore, the contrast of the image to be printed on the substrate by the first order portions may decrease.

Similar to patterning device 1400 of FIG. 14A, patterning device 1450 of FIG. 14B may include a pattern of first regions 1452 and second regions 1454. In some embodiments, first regions 1452 and second regions 1454 may be substantially similar to first regions 1402 and second regions 1404, respectively, of patterning device 1400. However, different from patterning device 1400, first regions 1452 and second regions 1454 of patterning device 1450 may be arranged in a pattern of lines. In some embodiments, patterning device 1450 may be incorporated within an EUV lithographic apparatus, e.g., EUV lithographic apparatus of FIGS. 1 and 2, to print lines on a substrate. For example, the pattern of patterning device 1450 may be a series of lines, e.g., six second regions 1454 and 5 first regions 1452, with a small portion of first region 1452 being present on either edge of patterning device 1450.

Source pupil 1460 in FIG. 14B may include a pole 1462. In some embodiments, source pupil 1460 may be a monopole light source. Illuminator IL may be configured to condition the radiation beam such that a monopole source, e.g., pole 1462, is present via source pupil 1460. As a result of the light output by source pupil 1460 being incident on patterning device 1450, two diffraction orders may be incident on imaging lens 1470. The two diffraction orders may include a zeroth order 1474 and a first order 1472 (e.g., (0, 0) and (1, 0). Similar to FIG. 14A, the inclusion of the zeroth order portion within the shaped radiation beam at imaging lens 1470 may decrease the contrast of the image printed to the substrate. Therefore, it may be more difficult to print features for smaller pitches that are consistent and free, or substantially free, of defects.

Figure 15A:
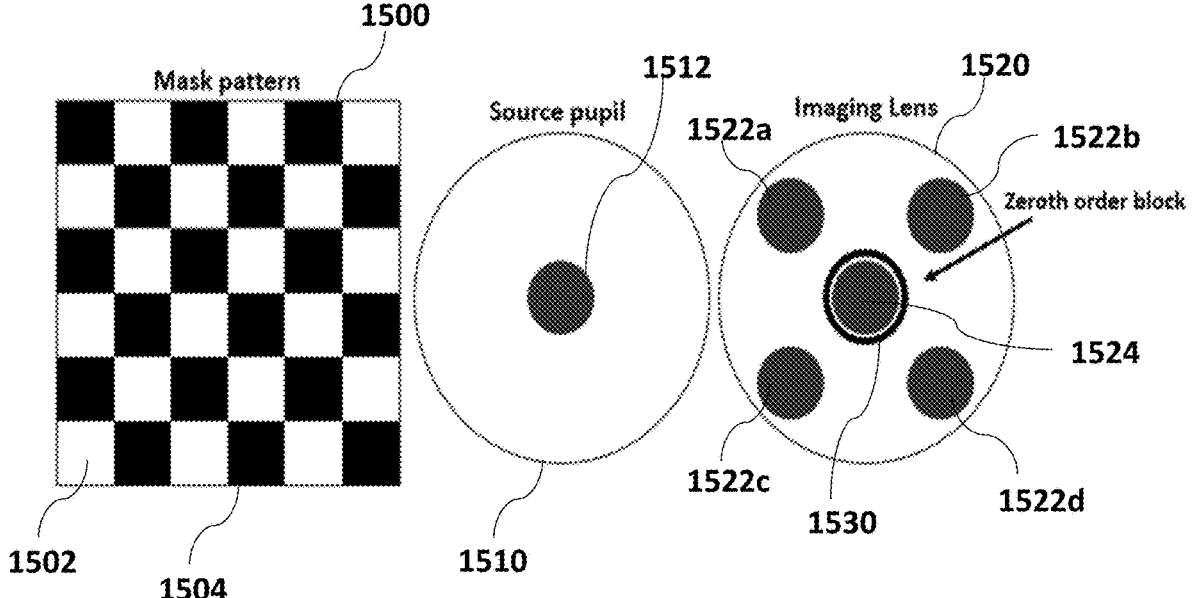
FIGS. 15A and 15B are schematic illustrations of an attenuated phase shift mask, a source pupil, and an imaging lens for printing of images on a substrate using a lithographic apparatus including zeroth order suppression, in accordance with various embodiments.
Figure 15B:
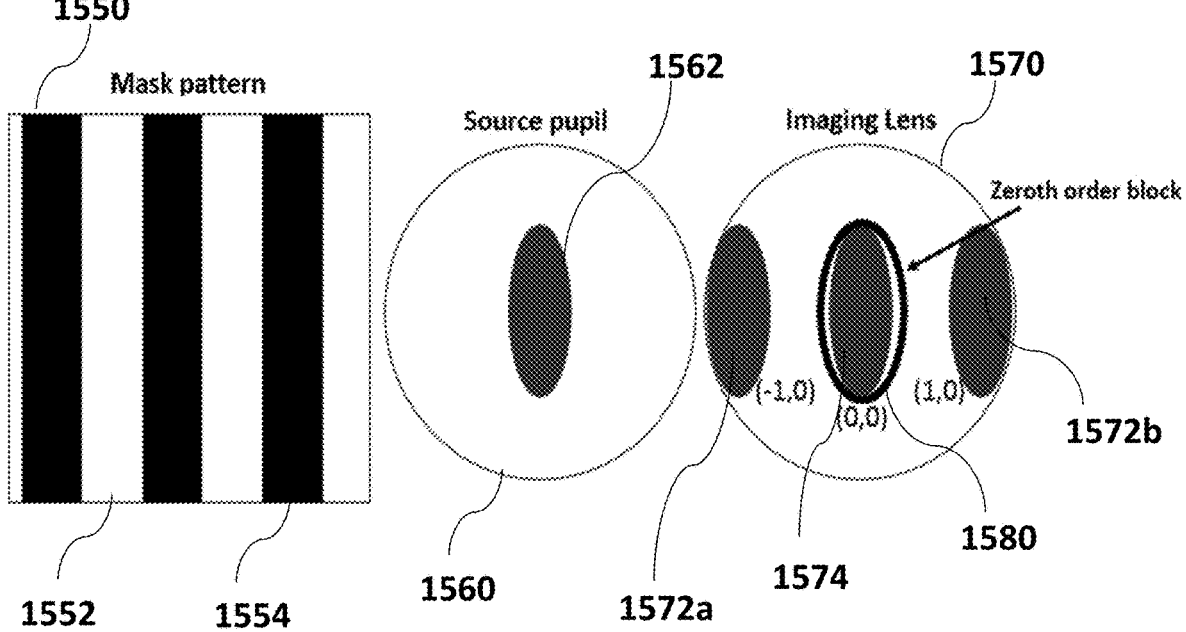

FIGS. 15A and 15B are schematic illustrations of an attenuated phase shift mask, a source pupil, and an imaging lens for printing of images on a substrate using a lithographic apparatus including zeroth order suppression, in accordance with various embodiments. In FIG. 15A, a patterning device 1500 is illustrated including a pattern of first regions 1502 and second regions 1504. In some embodiments, patterning device 1500 may be an attenuated phase shift mask for an EUV lithographic apparatus. In some embodiments, first regions 1502 may represent regions of reflection and second regions 1504 may represent regions of partial reflection, where light partially reflected by second regions 1504 may also be phase shifted. For example, second regions 1504 may have partially reflect between 5% and 35% of the incident light, and may also apply a 180-degree phase shift to the reflected light.

In some embodiments, the pattern of regions 1502 and 1504 for patterning device 1500 may be of a checkerboard-type. For example, each of regions 1502 and 1504 may be of a substantially same size and arranged in an alternating manner. The checkerboard-type pattern of patterning device 1500 is substantially similar to the pattern used to print contact holes for a hard PSM. With a hard PSM, the alternating pattern may correspond to regions of 0-degree phase shift and regions of 180-degree phase shift. In this example, all of the regions of the hard PSM may be reflective—in the EUV range—albeit certain regions are phase shifted and certain regions are not. The pattern of patterning device 1400 of FIG. 14A included a six by six array of second regions 1404 for producing a six by six array of contact holes on a substrate. For patterning device 1500, which may represent a portion of a continuous pattern, a six by six array is also employed, however instead of including a six by six array of second regions 1504, the array of patterning device 1500 may include includes six alternating first and second regions 1502 and 1504. For EUV range light, frequency doubling is known to occur, The frequency doubling allows for the wafer pitch to be half of the mask pitch. Therefore, a six by six array of contact holes may still be formed on the substrate using patterning device 1500. Furthermore, as a result of the frequency doubling, a dose improvement is obtained while achieving a same yield. In some embodiments, patterning device 1500 is designed such that less light is diffracted into the zeroth diffraction order. Therefore the impact on dose of the light is minimized as compared to a binary mask.

In some embodiments, source pupil 1510 may include a monopole source 1512. Differing from the monopole source described in FIG. 14B above, and different from the quadrupole source of FIG. 14A, monopole source 1512 may be located in a center of source pupil 1510. In some embodiments, source 1512 may be an EUV source, e.g., radiation output in the EUV wavelength range (e.g., 5-20 nm). The radiation beam, e.g., monopole source 1512, may be configured by illuminator IL and various optical elements to incident patterning device 1500. In some embodiments, some of the light reflected by regions 1502 and 1504 may be in the zeroth order. The amount of light reflected into the zeroth order by patterning device 1500 of the attenuated phase shift mask type may be less than if patterning device 1400 was used. However, some zeroth order light may still remain, which may reach imaging lens 1520 and decrease the contrast of the image formed on the substrate.

Imaging lens 1520 may represent an optical lens used to direct the shaped radiation beam, onto a substrate to print a desired image including one or more features. In some embodiments, imaging lens 1520 may have first order portions 1522*a-d* of the reflected radiation incident thereon. For example, four first order portions 1522*a-d*, corresponding to a (−1, 1), (1, 1), (1, −1), and (−1, −1) order portion of the diffracted radiation, may be incident on imaging lens 1520. Additionally, because some of the light in the zeroth diffraction order still remains after reflecting off of patterning device 1500, zeroth order portion 1524 may also incident imaging lens 1520.

In some embodiments, an obscuration 1530 may be included within projection system PS. In some embodiments, obscuration 1530 may be a central obscuration. For example, obscuration 1530 may be located in a center of imaging lens 1520. In some embodiments, obscuration 1530 may be referred to as a zeroth order block. The zeroth order block may be used to suppress zeroth order portion 1524 of the shaped radiation beam by blocking zeroth order portion 1524. In some embodiments, obscuration 1530 may be circular, however other shapes may be used, which are detailed below. In some embodiments, a size of obscuration 1530 may be adjustable. As an example, obscuration 1530 may be circular shaped and may be slightly larger than the size of zeroth order portion 1524 to ensure that zeroth order portion 1524 is suppressed. For example, obscuration 1530 may have a size between 5 and 30% of the size of imaging lens 1520.

In some embodiments, obscuration 1530 may be a central obscuration. In some embodiments, obscuration 1530 may be formed of an absorber material configured to absorb zeroth order portion 1524. Alternatively, obscuration 1530 may reflect zeroth order portion 1524 into a collection device while allowing first order portions 1522*a-d* to pass to imaging lens 1520. In some embodiments, obscuration 1530 may be positioned slightly above imaging lens 1520 such that zeroth order portion 1524 is blocked by obscuration 1530 while allowing first order portions 1522*a-d* to incident imaging lens 1520. In some embodiments, obscuration 1530 may be part of imaging lens 1520. In this scenario, obscuration 1530 may be part imaging lens 1520's material, and may be situated within imaging lens 1520 such that zeroth order portion 1524 enters imaging lens 1520 but does not interfere with first order portions 1522*a-d*. In some embodiments, the zeroth order block and central obscuration may be separate components, however the zeroth order block (e.g., the component to block out the zeroth diffraction order) may be placed near the central obscuration. This may be employed for lithographic apparatuses that already include a central obscuration, such as a high NA imaging lens system. In some embodiments, the zeroth order block may be located between a first reflective component after the patterning device and the final imaging lens (along the optical axis).

As a result of suppressing zeroth order portion 1524, EUV lithographic apparatus incorporating patterning device 1500 may function as a hard PSM. As mentioned above, hard PSM imaging requires complete suppression of the zeroth order of the shaped radiation beam. By combining the attenuated PSM, which diffracts less light into the zeroth order portion than a binary mask, with an obscuration to suppress the zeroth order portion, the resulting imaging is substantially equivalent to imaging using a hard PSM. Furthermore, by working in the EUV range, which causes frequency doubling, less dose may be needed to achieve a same yield while also improving NILS gain and lowering local CD uniformity ("LCDU").

In FIG. 15B, a patterning device 1550 is illustrated including a pattern of first regions 1552 and second regions 1554. In some embodiments, patterning device 1550 may be an attenuated phase shift mask for an EUV lithographic apparatus. In some embodiments, first regions 1552 may represent regions of reflection and second regions 1554 may represent regions of partial reflection, where light partially reflected by second regions 1504 may also be phase shifted. For example, second regions 1554 may have partially reflect between 5% and 25% of the incident light, and may also apply a 180-degree phase shift to the reflected light. In some embodiments, first and second regions 1552 and 1554 may be similar to first and second regions 1502 and 1504, and the previous description may apply.

In some embodiments, the pattern of regions 1552 and 1554 for patterning device 1550 may be lines. For example, each of regions 1552 and 1554 may be of a substantially same size and shape, e.g., elongated rectangles, and may be arranged in an alternating manner. Referring back to FIG. 14B, the pattern of patterning device 1450 included a six second regions 1454, with first regions 1452 in-between. The arrangement of the pattern of patterning device 1450 could be used to print six lines on a substrate. For patterning device 1550, six lines are also employed, however instead of including six instances of second region 1554 with instances of first regions 1552 in-between, the pattern includes three instances of first region 1552 and three instances of second region 1554 alternating. As mentioned above, frequency doubling may occur for the EUV system, which may result in double the pitch being printed on the substrate. Therefore, even though three instances of second region 1554 (and/or first region 1552) are included with the pattern of patterning device 1550, six lines may still be formed on the substrate using patterning device 1550. In particular, a line may be printed for each of first region 1552 and second region 1554.

In some embodiments, source pupil 1560 may include a monopole source 1562, which may be an ellipsoidal shape. The shape of monopole source 1562 may depend on the type of feature to be printed on the substrate and may be conditioned and shaped by illuminator IL. For example, to print contact holes, e.g., FIG. 15A, a small circular monopole source may be used. Differing from the monopole source, e.g., pole 1462 of FIG. 14B, monopole source 1562 may be located in a center of source pupil 1560. Monopole source 1562 may incident patterning device 1550, and the shaped radiation beam may be directed toward imaging lens 1570 to form an image on a substrate in accordance with the pattern on patterning device 1550.

In some embodiments, a zeroth order portion 1574 of the shaped radiation beam and first order portions 1572*a-b* of the shaped radiation beam may incident imaging lens 1570. For example, the zeroth order portion 1574 may refer to the (0, 0) diffraction order while first order portions 1572*a-b* may refer to the (−1, 0) and (1, 0) diffraction orders. As mentioned above with reference to FIG. 15A, if patterning device 1550 is of an attenuated phase shift mask type, then some of the reflected radiation included within the shaped radiation beam is of the zeroth diffraction order. However, in order to achieve the effects of hard phase shift mask imaging, the zeroth order portion may need to be completely suppressed.

In some embodiments, an obscuration 1580 may be included within projection system PS. In some embodiments, obscuration 1580 may be a central obscuration. For example, obscuration 1580 may be located in a center of imaging lens 1570. In some embodiments, obscuration 1580 may be referred to as a zeroth order block. The zeroth order block may be used to suppress zeroth order portion 1574 of the shaped radiation beam by blocking zeroth order portion 1574. In some embodiments, obscuration 1580 may be ellipsoidal in shape, however other shapes may be used, which are detailed below. In some embodiments, a size of obscuration 1580 may be adjustable. As an example, obscuration 1580 may be ellipsoidal shaped and may be slightly larger than the size of zeroth order portion 1574 to ensure that zeroth order portion 1574 is suppressed. For example, obscuration 1580 may have a size between 5 and 30% of the size of imaging lens 1570. Additional structural aspects, properties, and benefits of obscuration 1580 may be substantially similar to that of obscuration 1530 described above, and are not repeated here for brevity. In some embodiments, obscuration 1580 may be a central obscuration.

Figure 16A:
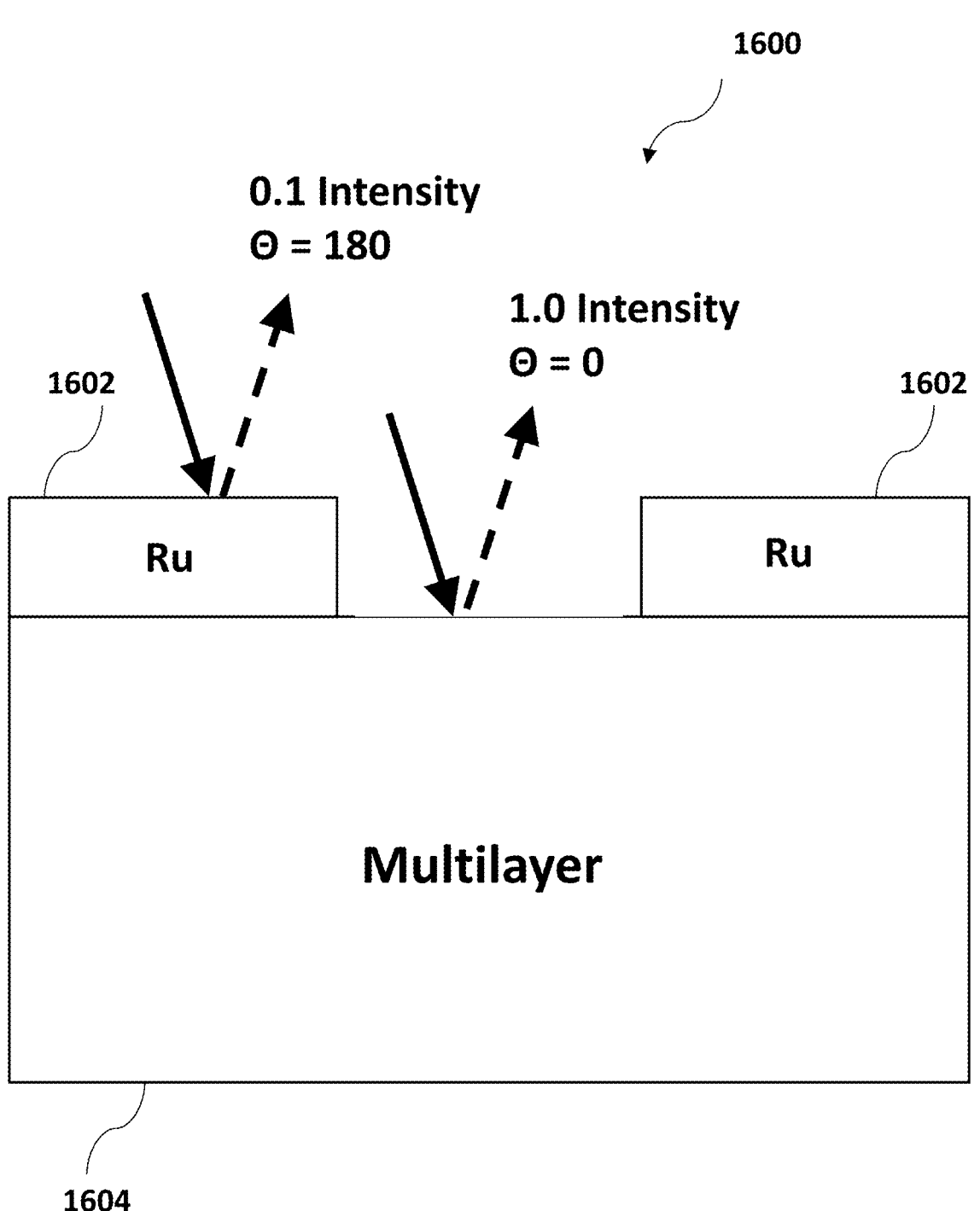
FIG. 16A is a schematic illustration of an exemplary attenuated phase shift mask (PSM), in accordance with various embodiments.

FIG. 16A is a schematic illustration of an exemplary attenuated phase shift mask (PSM), in accordance with various embodiments. Attenuated PSM 1600 may be incorporated within an EUV lithographic apparatus, such as EUV lithographic apparatus 100 of FIGS. 1 and 2, and may be used to form an image on a substrate. In some embodiments, attenuated PSM 1600 may be supported by a support structure, such as mask table MT, which is configured to receive and secure attenuated PSM 1600 and such that a radiation beam, e.g., EUV light, may incident attenuated PSM 1600. In some embodiments, a shaped radiation beam diffracting off attenuated PSM 1600 may be directed to projection system PS, which in turn may direct the shaped radiation to form an image on the substrate.

In some embodiments, attenuated PSM 1600 may be used for printing periodic patterns, non-periodic patterns, or both periodic and non-periodic patterns. In some embodiments, attenuated PSM 1600 may be a Ruthenium (Ru)-based attenuated PSM. In contrast to binary masks, which may be Tantalum (Ta)-based masks, use of an Ru-based attenuated PSM may improve NILS gain. In some embodiments, Ru-based attenuated PSM 1600 may include rounded corners, which may provide an improved dose gain with respect to Ru-based attenuated PSMs without rounded corners. For example, in standard, e.g., non-rounded corner attenuated PSMs, approximately 20% of the light intensity may be diffracted into orders that are used within the EUV lithographic apparatus's numerical aperture (NA), leaving the remaining approximately 80% of light lost. This may lead to an increase in dose being needed to supplement the lost light. By fabricating Ru-based attenuated PSM 1600 with rounded corners, much of the light that would otherwise be lost is preserved, leading to an improved dose gain. Details regarding an Ru-based attenuated PSM with rounded corners is described in greater detail with regard to FIG. 16B and commonly-assigned EP Application No. 19172160.4, filed on May 2, 2019, which is hereby incorporated by reference herein in its entirety.

Attenuated PSM 1600 may include a multilayer stack 1604 with an Ru-based layers 1602 on top. Ru-based layers 1602 may facilitate partial reflection and phase shifting of the incident radiation. In some embodiments, one or more additional elements may be included within Ru-based layers 1602. For example, the additional elements may be elements having a different refractive index and extinction coefficient.

In some embodiments, to obtain an optimum NILS, a refractive index of n=0.88 and an extinction coefficient of k=0.02 may be used. Furthermore, the thickness of Ru-based layers 1602 may be approximately 41 nm. Alternatively, a thickness of Ru-based layers 1602 may be approximately 35 nm. In some embodiments, multilayer stack 1604 may include a plurality of layers of mirrors formed of reflective elements that allow reflection of incident radiation beam. The number of layers included within multilayer stack 1604 may depend on the frequency of the EUV light used. In some embodiments, for a pure Ru absorber material, with n=0.88 and k=0.02, a 180-degree phase shift may be achieved for a thickness of 28 mm. In some embodiments, a different absorber material may be used, and the n and k values may also change. Additionally, for such a different absorber material, the thickness may need to change in order to obtain a 180-degree phase shift. For example, an absorber material having n=0.92 may have a thickness of approximately 42 nm.

In some embodiments, light incident on a surface of multilayer stack 1604 may be reflected at angle dependent on the angle of incidence. The incident light may be fully reflected and may receive no phase shift (e.g., θ=0-degrees). As described herein "fully reflective," may indicate that no incident light, or a small percentage of the incident light (e.g., less than 1%) is absorbed by multilayer stack 1604. In some embodiments, light incident on a surface of Ru-based layer 1602 may also be reflected at an angle dependent on the angle of incident. However, the incident light may be partially reflected and may also have a phase shift applied thereto (e.g., θ=180-degrees). The partial reflection may correspond to a percentage of the incident light reflecting off Ru-based layers 1602, with the remaining light not reflected (e.g., absorbed). For example, 10% of the light incident on Ru-based layers 1602 may be reflected, with the remaining 90% absorbed. This 10% reflected light may further receive the phase shift characterized by Ru-based layers 1602.

Figure 16B:
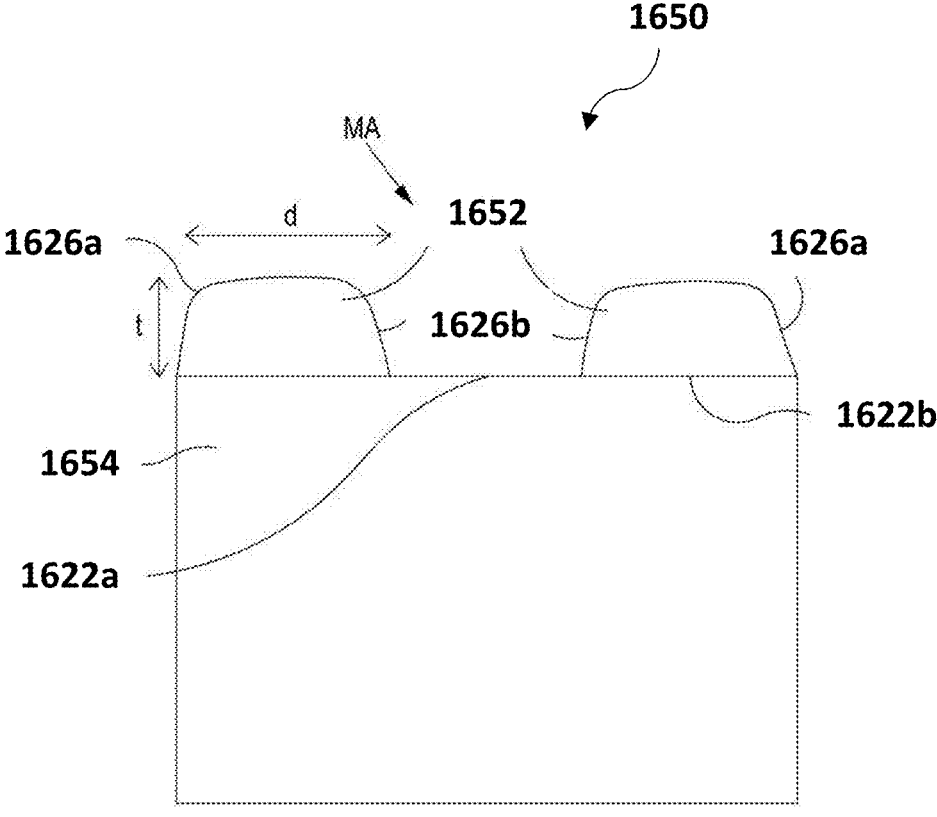
FIG. 16B is a schematic illustration of another exemplary attenuated PSM with rounded edges, in accordance with various embodiments.

FIG. 16B is a schematic illustration of another exemplary attenuated PSM with rounded edges, in accordance with various embodiments. In some embodiments, attenuated PSM 1650 may be substantially similar to attenuated PSM 1600 of FIG. 16A, however attenuated PSM 1650 may include rounded edges. Details regarding an Ru-based attenuated PSM with rounded corners is described in greater detail with regard to commonly-assigned EP Application No. 19172160.4, filed on May 2, 2019, which is hereby incorporated by reference herein in its entirety. In FIG. 16B, a cross-sectional side view of attenuated PSM 1650 is shown. As described herein, attenuated PSM 1650 may also be referred to as patterning device 1650 interchangeably. Phase shifting patterning device are photomasks that take advantage of the interference generated by phase differences to improve image resolution in photolithography. A phase shift patterning device relies on the fact that radiation passing through a transparent media (i.e., in this case being reflected from that media) will undergo a phase change as a function of its optical thickness. Attenuated PSM 1650, in some embodiments, may include a first component 1654 for reflecting radiation and a second component 1652 for reflecting radiation with a different phase with respect to the radiation reflected from the first component. The first component 1654 may include a standard multilayer mirror, e.g. alternating layers of molybdenum and silicon. The layers of the multilayer are not shown in FIG. 16B for simplicity. It will be appreciated that in other embodiments, the first component may have different numbers of layers and/or may comprise different materials.

Although embodiments directed to an attenuated phase shift patterning device are described, it will be appreciated that these embodiments are exemplary and the concept described is also applicable to other types of patterning devices. For example, other patterning devices called "binary masks" may be used. The name "binary" originates from the ideal picture where on the mask either all the radiation is absorbed (zero) or no light is absorbed (one). Patterning devices for EUV radiation may use tantalum as the base material. Second component 1652 may be in a different layer from first component 1654, i.e., second component 1652 may be located on first component 1654.

Second component 1652 may reflect a relatively small amount of radiation when compared with first component 1654. The radiation reflected from second component 1652 may not be strong enough to create a pattern on the substrate W, but it can interfere with the radiation coming from first component 1654, with the goal of improving the contrast on substrate W. The contrast may be considered to be the steepness, or sharpness, of the features formed in the image on substrate W.

As can be seen in FIG. 16B, second component 1652 covers a portion (hereinafter referred to as a covered portion 1622b) of first component 1654 except for an uncovered portion 1622a of the surface of first component 1654 which forms a pattern. Radiation reflected from uncovered portion 1622a generates the patterned radiation beam B' which forms a pattern in a target portion of substrate W in lithographic apparatus LA when in use. Covered portion 1622b and the uncovered portion 1622a together form a surface of first component 1654. Second component 1652 may be considered to surround uncovered portion 1622a of first component 1654, albeit that second component 1652 is in a different layer from the first component 1654 and so it is actually the covered portions 22b that surround uncovered portions 1622a of first component 1654. Second component 1652 may be considered to form a ring around uncovered portion 1622a of first component 1654. Although the area of uncovered portion 1622a of first component 1654 may be substantially a square or rectangle as viewed from above, in other embodiments, the uncovered portion may be any suitable shape and the second component may have a size and shape accordingly. The size of uncovered portion 1622a is related to the critical dimension (CD) of the feature to be printed on substrate W. On attenuated PSM 1650, the size of uncovered portion 1622a is the CD (on the substrate W) multiplied by the magnification factor in the lithographic apparatus LA. This may have a range of +/−30% (patterning device bias range). The magnification factor may be 4-8.

Second component 1652 covers covered portion 1622b of first component 1654 which extends a distance d from uncovered portion 1622a of first component 1654. The optimal width will be feature and pitch dependent.

Second component 1652 covers at least a portion (covered portion 22b) of a surface of first component 1654 and is configured to at least partially absorb the radiation incident on the second component 1652 and at least partially transmit the radiation incident on second component 1652 so as to give the radiation emerging from second component 1652 a phase shift relative to the radiation reflected off another portion (uncovered portion 22a) of first component 1654 not covered by second component 1652. Second component 1652 has a width d which corresponds to the extent in the direction (taken parallel to the surface of first component 1654) of covered portion 1622b of first component 1654. The width d is depicted as a double arrow in FIG. 16B.

Although a single uncovered portion 1622a is shown in FIG. 16B, (because FIG. 16B shows part of attenuated PSM 1650), it will be appreciated that the pattern may be formed of a plurality of uncovered portions 1622a.

The terms cover/covered/covering as used within this description is intended to mean that the covering component is in a position such that radiation is at least partially blocked from being incident on the portion of the covered component underneath the covering component. That is, covering may be taken to encompass covering where the covering component is in direct contact with the covered component or not, i.e. another component may or may not be located between the component that is covering and the component being covered.

In some embodiments, second component 1652 comprises the material Ruthenium (Ru) with a thickness t (shown as a double arrow in FIG. 16B). The thickness for Ru may preferably be 35 nm. The material Ru of second component 1652 may be considered to have replaced an absorbing material, e.g. a TaBN absorber, in a standard patterning device to form the attenuated PSM 1650. As will be appreciated, in other embodiments, different materials may be used instead of Ru. The thickness of the second component depends on the material composition, e.g. an alloy material containing Ru may require a different thickness from one containing only Ru. Typical thickness range for absorbers may be between 30 nm and 70 nm.

Attenuated PSM 1650 may be used in the lithographic apparatus LA by reflecting radiation from first component 1654 of the attenuated PSM 1650, and reflecting radiation from second component 1652 of the attenuated PSM 1650. More particularly, reflecting radiation from the pattern comprising uncovered portion 1622a of first component 1654 and generating patterned radiation beam B'. The effect of this is that the radiation reflected from second component 1652 has a different phase with respect to the radiation reflected from the first component 1654 and provides a pattern on the substrate W with increased contrast.

The second component 1652 has sidewalls 1626a, 1626b which are angled with respect to first component 1654. That is, they do not extend wholly perpendicularly to surface of first component 1654 as in a standard patterning device. The size of second component 1652 in the direction in which the distance d is taken decreases with increasing distance (thickness t) from first component 1654. Second component 1652 may be considered to have a rounded corner or a curve at substantially the furthest point of sidewalls 1626a, 1626b away from first component 1654. In some embodiments, the sidewalls may be completely curved (i.e. no straight sections) or one or more other parts of the sidewall may be curved.

Second component 1652 having the shape as shown in FIG. 16B (i.e. a more rounded shape as compared to a standard patterning device with straight sidewalls) limits the amount of radiation that is diffracted into higher orders. The Fourier transform of this more-rounded shape will contain substantially less of the high-frequency components. Thus, more radiation will be diffracted into the NA of the lithographic apparatus LA which will decrease the required dose of radiation. The shape of second component 1652 will reduce an intensity of the radiation diffracted into higher orders as compared to an intensity of the radiation diffracted by a standard patterning device (with sidewalls perpendicular to the corresponding first component).

This will improve throughput of the lithographic apparatus LA (i.e. the number of substrates W that pass through the lithographic apparatus LA in a particular time) when compared to the standard patterning device having a second component made of Ru with straight sidewalls extending perpendicular to the first component. Furthermore, attenuated PSM 1650 having second component 1652 will improve throughput and yield (i.e. measure of substrates without defects) when compared to the standard patterning device having a second component made of Ta with straight sidewalls. This is because with more radiation the features may be printed with better quality in the resist on substrate W.

Table 1 below compares the loss of photons for a standard 60 nm (thickness) Ta-based mask and a 35-nm (thickness) Ru-based attenuated phase shift mask (PSM). The Ru mask has a lower extinction coefficient and a thinner layer. Therefore, less radiation is lost upon a double pass through the mask absorber. The example here is given for dense contact holes (CHs) with 20% mask bias, so 10 that 72% of the mask area is covered by absorber material.

Additionally, a large fraction of radiation is lost, since only the 0th and 1st order are within the NA (numerical aperture) of the system. The second column of Table 1 shows the fraction of the radiation intensity that is distributed over orders that are outside the NA. This is larger for the Ru mask than for the Ta mask (more radiation goes into higher orders). 80% of the radiation goes into orders that are outside the NA for the Ru mask and therefore there would be a gain up to a factor 5 if all the radiation was diffracted within the NA. This is more than with the Ta mask where 70% of the radiation goes into orders that are outside the NA.

TABLE 1

|  | Comparison of loss of photons for standard 60 nm Ta-based mask and 35-nm Ru-based attenuated PSM for 20 nm dense CHs on low NA EUV. | |
| --- | --- | --- |
|  | Lost in double pass absorber, for 72% mask coverage | Lost in diffraction orders outside NA |
| Ta | 0.69 | 0.70 |
| Ru | 0.53 | 0.80 |

The amount of radiation diffracted into the −1 order (which may also be outside the NA for off-axis illumination) will never be substantially lower than the amount of radiation in the +1 order and therefore it is theoretically not possible to reduce the amount of radiation into orders outside the NA to 0. In a rough upper limit the amount of radiation in +1, 0, and −1 may be equal and thus 33% of the radiation would be discarded. In the situation with the standard Ru mask, 20% of the radiation was used (i.e. captured in the NA) whereas using attenuated PSM 1650 with the shape of second component 1652 means 67% of the radiation may be available for use. This means that the upper limit would give a dose gain of approximately factor 3 (i.e. 67% of the radiation being available for use is approximately 3×20% previously used). More generally, attenuated PSM 1650 provides a substantial gain in dose with respect to a standard patterning device with a second component made of Ru. It will be appreciated that the described shape of second component 1652 of attenuated PSM 1650 may also be used with patterning devices having second components made from materials other than Ru. For example, these may be second components made from Tantalum or other absorbers, such as high k absorbers of e.g. Nickel or Cobalt, and other attenuated phase shift patterning device materials like Rhodium.

The shape of second component 1652 may be formed by isotropic plasma etching (pressure higher), depositing layers on top of discrete chunks of conventionally made absorber material with sharp edges (the sharpness will disappear with the additional layers deposited on top), etch away the material in between the sinusoidal bumps, and/or ion gunning.

Figure 17:
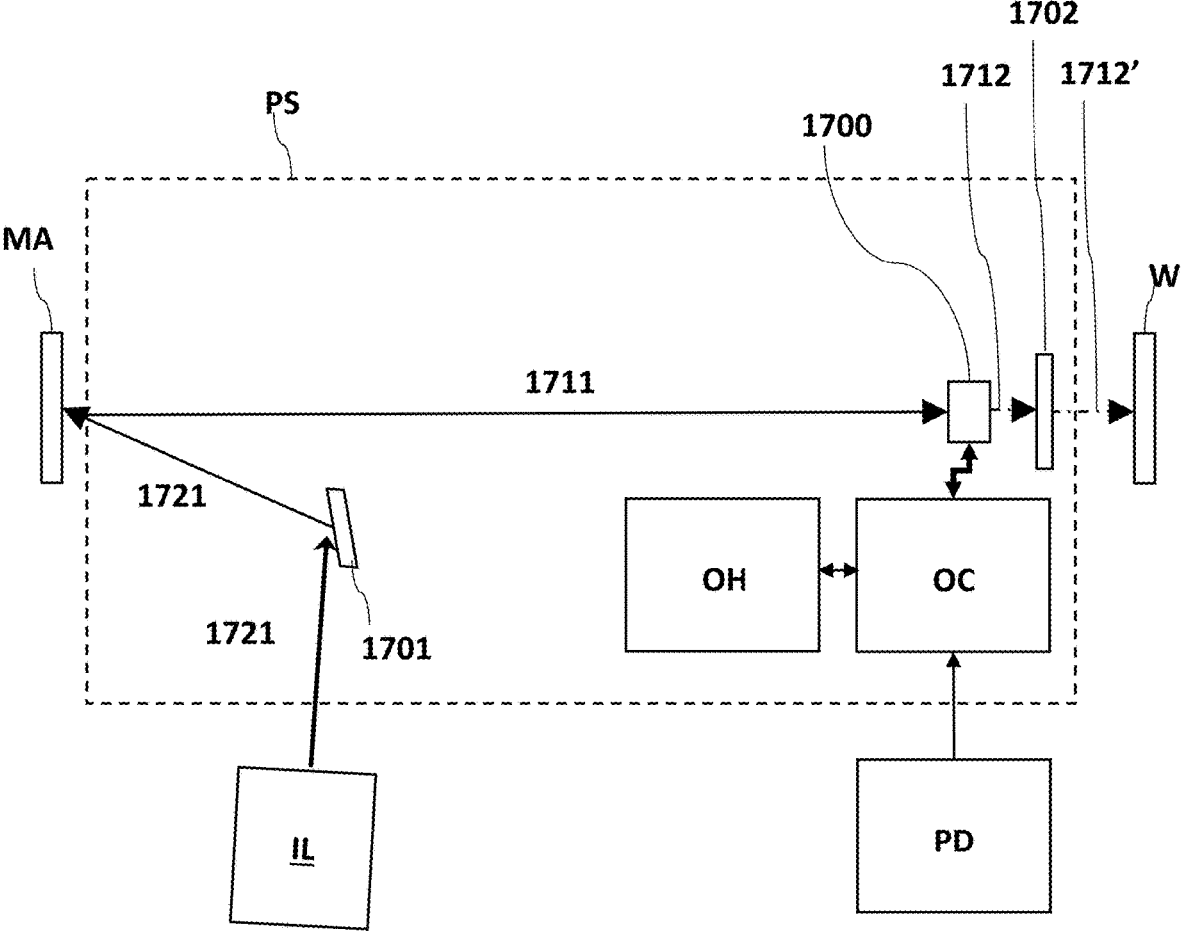
FIG. 17 is a detailed view of an example projection system that may be used within a lithographic apparatus, in accordance with various embodiments.

FIG. 17 is a detailed view of an example projection system that may be used within a lithographic apparatus, in accordance with various embodiments. In FIG. 17, an exemplary projection system PS is shown. Projection system PS may be included within an EUV lithographic apparatus, such as EUV lithographic apparatus 100. In some embodiments, the EUV lithographic apparatus may include an illuminator IL, which may be configured to condition a radiation beam 1721 generated and output from source SO. Radiation beam 1721 may be in the EUV frequency range, and may be referred to herein interchangeably as light 1721 or EUV radiation beam 1721. EUV radiation beam 1721 may be conditioned by illuminator IL and directed toward a reflective element 1701. EUV radiation beam 1721 may reflect off of reflective element 1701 and be directed towards patterning device MA. In some embodiments, EUV radiation beam 1721 may be the same or similar to radiation beam 21 of FIGS. 4A, 4B, and 5.

In some embodiments, patterning device MA may be one of patterning devices 1400, 1450, 1500, or 1550 described above. For example, patterning device MA may be patterning device 1500 of FIG. 15A. EUV radiation beam 1721 may be incident on patterning device MA, and shaped EUV radiation beam 1711 may diffract off of patterning device MA. In some embodiments, shaped EUV radiation beam 1711 may be referred to herein interchangeably as configured EUV radiation beam 1711. In some embodiments, shaped EUV radiation beam 1711 may be referred to herein interchangeably as phase shifted EUV radiation beam 1711. In some embodiments, shaped EUV radiation beam 1711 may be directed toward substrate W to form an image thereon in accordance with a pattern of patterning device MA. In some embodiments, patterning device MA may be an attenuated PSM. For example, patterning device MA may be an Ru-based attenuated PSM, such as attenuated PSM 1600 or 1650. In some embodiments, shaped EUV radiation beam 1711 may include a zeroth diffraction order along with higher diffraction orders.

In some embodiments, the present disclosure relates to a projection system PS, which may be included an EUV lithographic apparatus, such as EUV lithographic apparatus 100, and EUV lithographic apparatus 100 may be configured to form an image on a substrate, e.g., substrate W, by use of an EUV radiation beam, e.g., EUV radiation beam 1721. EUV radiation beam 1721 may be configured by a patterning device, e.g., patterning device MA, which may include a pattern of reflective regions and partially reflective regions, where the partially reflective regions are configured to suppress and apply a phase shift to a portion of EUV radiation beam 1721. For example, patterning device 1500 may include a pattern, e.g., a checkerboard pattern, of reflective regions, e.g., first regions 1502, and partially reflective regions, e.g., second regions 1504. As another example, patterning device 1550 may include a pattern, e.g., lines, of reflective regions, e.g., first regions 1552, and partially reflective regions, e.g., second regions 1554. The partially reflective regions, e.g., second regions 1504, 1554, may be configured to apply a phase shift, e.g., a 180-degree phase shift, to a portion of EUV radiation beam 1721 For example, the portion may correspond to the zeroth order portion of EUV radiation beam 1721, which may be referred to as shaped EUV radiation beam 1711. In some embodiments, shaped EUV radiation beam 1711 may be the same or similar to shaped radiation beam 411.

In some embodiments, projection system PS of FIG. 17 may include an obscuration 1700 configured to suppress the zeroth order portion of shaped EUV radiation beam 1711. Obscuration 1700 may be referred to in some embodiments as a "central obscuration." For instance, as described herein, obscuration 1700 may be referred to interchangeably as central obscuration 1700. In some embodiments, an unsuppressed portion of shaped EUV radiation beam 1711 may be directed via projection system PS, and after being suppressed by obscuration 1700, towards substrate W to form an image on substrate W. In some embodiments, the unsuppressed portion of shaped EUV radiation beam 1711 may be filtered radiation beam 1712, which may also be referred to as filtered EUV radiation beam 1712 interchangeably. For example, the unsuppressed portion of shaped EUV radiation beam 1711 may correspond to a first order portion of EUV radiation beam 1721. In this example, central obscuration 1700 may suppress any remaining components of the zeroth order portion of shaped EUV radiation beam 1711 after being configured by patterning device MA.

In some embodiments, the present disclosure relates to a method for forming an image on a substrate, e.g., substrate W, by use of an EUV radiation beam (e.g., EUV radiation beam 1721) configured by a patterning device, e.g., patterning device MA. Patterning device MA may include a pattern of reflective regions and partially reflective regions, where the partially reflective regions are configured to suppress and apply a phase shift to a portion of the EUV radiation beam. As another example, patterning device 1550 may include a pattern, e.g., lines, of reflective regions, e.g., first regions 1552, and partially reflective regions, e.g., second regions 1554. The partially reflective regions, e.g., second regions 1504, 1554, may be configured to apply a phase shift, e.g., a 180-degree phase shift, to a portion of EUV radiation beam 1721 For example, the portion may correspond to the zeroth order portion of EUV radiation beam 1721, which may be referred to as shaped EUV radiation beam 1711.

In some embodiments, the method may include an operation of receiving, by projection system PS, an unsuppressed portion of a phase shifted EUV radiation beam. For example, projection system PS may receive an unsuppressed portion of shaped EUV radiation beam 1711, which may be a phase shifted EUV radiation beam, after being incident on patterning device MA. The unsuppressed portion of shaped EUV radiation beam 1711 may be directed, by projection system PS, towards substrate W to form an image on substrate W. For example, an unsuppressed portion of shaped EUV radiation beam 1711 may correspond to a first order portion of EUV radiation beam 1721. In this example, central obscuration 1700 may suppress any remaining components of the zeroth order portion of shaped EUV radiation beam 1711 after being configured by patterning device MA.

Obscuration 1700 may vary in size and shape depending on the pattern of patterning device MA and the size of EUV radiation beam 1721. Furthermore, a location of obscuration 1700 within projection system PS, or elsewhere within the lithographic apparatus, may depend on patterning device MA and EUV radiation beam 1721. In some embodiments, a type, e.g., shape, of obscuration 1700 may be selected based on an image to be formed on substrate W. As described herein, a central obscuration may refer to a location of obscuration 1700 with respect to an imaging lens 1702 (e.g., imaging lens 1520, 1570 of FIGS. 15A and 15B). For example, a center of obscuration 1700 may be aligned with a center of imaging lens 1702. As another example, a center of obscuration 1700 may be aligned with zeroth order portion of shaped EUV radiation beam 1711. In some embodiments, obscuration 1700 may be arranged to be in a plane perpendicular to an optical axis of projection system PS (e.g., the projection optics included within projection system PS). In some embodiments, a type of obscuration 1700 may vary depending on the pattern of patterning device MA and/or EUV radiation beam 1721. For example, the type of obscuration 1700 may include a circular shaped obscuration, a rectangular shaped obscuration, a rectangular shaped obscuration rotated by an angle (e.g., an angle of 45-degrees), an ellipsoid shaped obscuration, an ellipsoid shaped obscuration rotated by an angle, a square obscuration, or a square obscuration rotated by an angle. Additional types of obscurations are also possible, and the aforementioned list is merely illustrative. In some embodiments, obscuration 1700 may be formed using one or more mechanical devices with parts that are moveable relative to one another. For example, obscuration 1700 may be formed using overlapping disks or other objects such that the zeroth order portion of shaped EUV radiation beam 1711 is suppressed.

In FIG. 17, a configuration of projection system PS may include obscuration 1700 placed at a location proximate to imaging lens 1702. In some embodiments, a configuration of projection system PS may include obscuration 1700 placed at a location proximate to patterning device MA (e.g., earlier in the optical path) as opposed to being placed closer to imaging lens 1702. This may result in a lower thermal load being received by the reflective components (e.g., mirrors) within projection system PS. As the features to be imaged onto a substrate decrease in size, thermal load on the mirrors may increase thereby causing deformation of the projection optics. Placing obscuration 1700 earlier in the optical path of shaped EUV radiation beam 1711 may reduce the effects of the thermal load on the projection optics. Furthermore, in some embodiments, a configuration of projection system PS may include obscuration 1700 placed at a location between patterning device MA and imaging lens 1702, along the optical axis of shaped EUV radiation beam 1711.

In some embodiments, projection system PS may include an obscuration controller OC. Obscuration controller OC may be a sub-system of projection system PS that is configured to select a type of obscuration to be used as obscuration 1700. For example, obscuration controller OC may select obscuration 1700 from obscuration holder OH. Obscuration holder OH may be configured to store different types of central obscurations that may be used within projection system PS. In some embodiments, in addition to or instead of obscuration controller OC, obscuration 1700 may be placed within projection system PS via one or more mechanical devices. The mechanical devices may be controlled by obscuration controller OC and/or may be manually controlled such that obscuration 1700 is formed in a desired shape. In some embodiments, the selection and loading of obscuration 1700 may be performed manually. For example, In some embodiments, upon loading of patterning device MA into EUV lithographic apparatus 100, instructions may be sent to obscuration controller OC from a processing device PD. Processing device PD may be a sub-system of projection system PS. The instructions may indicate a selection of a type of obscuration to be used within projection system PS. In response to receiving the instructions, obscuration controller OC may retrieve the desired type of obscuration from obscuration holder OH and load the obscuration that is selected at a position within projection system PS so as to block the zeroth order portion of shaped EUV radiation beam 1711. In some embodiments, obscuration controller OC may be a robotic device, such as a robotic arm, capable of moving in a plurality of directions and angles to retrieve the selected obscuration and insert the selected obscuration into a designated location within projection system PS. In some embodiments, obscuration controller OC may be configured to adjust a location of obscuration 1700 within projection system PS. For example, obscuration 1700 may be placed proximate patterning device MA, proximate imaging lens 1702, at a midpoint between patterning device MA and imaging lens 1702, or at different locations along an optical axis of the projection optics of projection system PS. The location of obscuration 1700 may depend on, for example and without limitation, the shape of EUV radiation beam 1721, the dose of EUV radiation beam 1721, the type and pattern of patterning device MA, the shape and size of obscuration 1700, and/or the image to be formed on substrate W. In some embodiments, processing device PD may be a computing device including one or more processors, memory, and I/O interfaces, allowing for control of different aspects of EUV lithographic apparatus 100. For example, processing device PD may be the same as or similar to computing system 2100 of FIG. 21, or may be a component of computing system 2100. In some embodiments, the size and shape of obscuration 1700, as well as the location of obscuration 1700 within projection system PS, may be determined via simulations and calculations, and the results of which may be programed to processing device PD and/or computing system 2100.

In some embodiments, processing device PD may be programmed with computer program instructions that, when executed, cause processing device PD to determine the size and shape of obscuration 1700. For example, software stored within memory of processing device PD may effectuate operations including determining a type and a size of obscuration to be used within projection system PS based on the use case. Some embodiments may include obscuration 1700 being programmable and adjustable via the software so as to accommodate different diffraction patterns. For example, processing device PD may calculate a diffraction pattern to be used for a particular use case, e.g., to print lines, contact holes, etc., and may calculate or receive instructions regarding an obscuration configuration to be used for the calculated diffraction pattern. Processing device PD may provide instructions to obstruction controller OC to cause obstruction 1700 to be adjusted to accommodate the diffraction pattern, e.g., the mask, suppressing the desired portions. For example, processing device PD may determine that the patterning device to be used within projection system PS is the same or similar to patterning device 1500. Processing device PD may determine a type of obscuration to be used, e.g., obscuration 1530, as well as a size of the obscuration, based on the determined patterning device, and further may provide instructions to obscuration controller OC to cause obscuration 1700 to adjust to the desired shape and size (e.g., the size and shape of obscuration 1530).

In addition to selecting the type of obscuration from obscuration holder OH, obscuration controller OC may further be configured to modify the type of central obscuration to be used within projection system PS. For example, to print a desired image on substrate W, two different patterning devices, e.g., patterning device 1500 and patterning device 1550, may be needed. In this example, because the type of patterning device needs to change, the type of obscuration may also need to change in order to maintain suppression of the zeroth order diffracted light. Therefore, obscuration controller OC may be configured to modify the type of obscuration used within projection system PS accordingly. For example, if contact holes were intended to be printed on substrate W, then obscuration controller OC may select and place a circular shaped obscuration within projection system PS (e.g., at a position of central obscuration 1700). If at a later time, lines are to be printed on substrate W, then obscuration controller OC may cause the circular shaped obscuration to be removed, and may select and place an ellipsoid shaped obscuration within central obscuration PS. In some embodiments, processing device PD may also be in communication with illuminator IL to modify the shape and other characteristics of output EUV radiation beam 1721 depending on the features to be printed on substrate W.

In some embodiments, obscuration controller OC may be configured to adjust a size of obscuration 1700 after it has been placed within projection system PS. Obscuration controller OC may include a sizing mechanism that allows a size of central obscuration 1700 to be increased or decreased depending on EUV radiation beam 1721 and patterning device MA. For example, obscuration 1700 may encompass an area of approximately 5% of the area of the imaging lens (e.g., imaging lens 1520, 1570). In some embodiments, the size of the obscuration may be adjusted from a first size, e.g., 5%, to a second size, e.g., 20%. The range of sizes for obscuration 1700 may be between 5% and 30% of the total area of the pupil plane. For example, the size of central obscuration 1700 may be between 5% and 30% of the imaging lens.

In some embodiments, shaped EUV radiation beam 1711 may be directed towards obscuration 1700. Obscuration 1700 may suppress the zeroth order portion of shaped EUV radiation beam 1711. For example, obscuration 1700 may block the zeroth order portion of shaped EUV radiation beam 1711. After suppressing the zeroth order portion, filtered radiation beam 1712 may be directed towards substrate W to form an image on substrate W. In some embodiments, filtered radiation beam 1712 may include higher order diffracted light, such as first order light. For example, filtered radiation beam 1712 may include first order portions of shaped EUV radiation beam 1711, and may be used to form an image on substrate W.

In some embodiments, obscuration 1700 may be formed of an absorber material. The absorber may absorb the zeroth order portion of shaped EUV radiation beam 1711 preventing the zeroth order portion from propagating further within projection system PS. In some embodiments, obscuration 1700 may include an aperture that allows the zeroth order portion of shaped EUV radiation beam 1711 to be directed to an absorber or a collection device. The higher order portions of shaped EUV radiation beam 1711 may not be captured by the aperture and may pass toward imaging lens 1702. In some embodiments, obscuration 1700 may include a reflective element that reflects the zeroth order portion of shaped EUV radiation beam 1711 and directs the reflected zeroth order portion toward an absorber or a collection device to prevent the zeroth order portion from reaching imaging lens 1702.

In some embodiments, filtered radiation beam 1712 may be focused or directed towards substrate W via imaging lens 1702. For instance, imaging lens 1702 may receive filtered radiation beam 1712 from obscuration 1700. Filtered radiation beam 1712, for example, may have the zeroth order portion of shaped EUV radiation beam 1711 suppressed such that the first order portions (or higher-order portions) will be used to form an image on substrate W. Imaging lens 1702 may direct and focus filtered radiation beam 1712, resulting in focused radiation beam 1712', which in turn may incident substrate W. For example, focused radiation beam 1712' may form the image on substrate W.

In some embodiments, obscuration controller OC may also be configured to control a size, shape, and/or location of filter 410, 450 of FIGS. 4A and 4B, respectively. For instance, obscuration controller OC may adjust a shape of filter 410 or 450 to be a circular shaped obscuration, an ellipsoid shaped obscuration, a rectangular shaped obscuration, a diamond shaped obscuration, an angled ellipsoid shaped obscuration, an angled rectangular shaped obscuration, or any other shaped obscuration. As another example, obscuration controller OC may be configured to adjust a size of filter 410, 450. For example, filter 410, 450 may be adjusted to have a size between 5% and 30% of the size of an aperture stop in a pupil plane of the projection optics of projection system PS. Furthermore, obscuration controller OC may be configured to place filter 410, 410 at a first position (e.g., the position of filter 410 within FIG. 4A) or at a second position (e.g., the position of filter 450 within FIG. 4B), or at a different location along the path of shaped radiation beam 411, depending on an illumination mode used to illuminate patterning device MA.

Figure 18A:
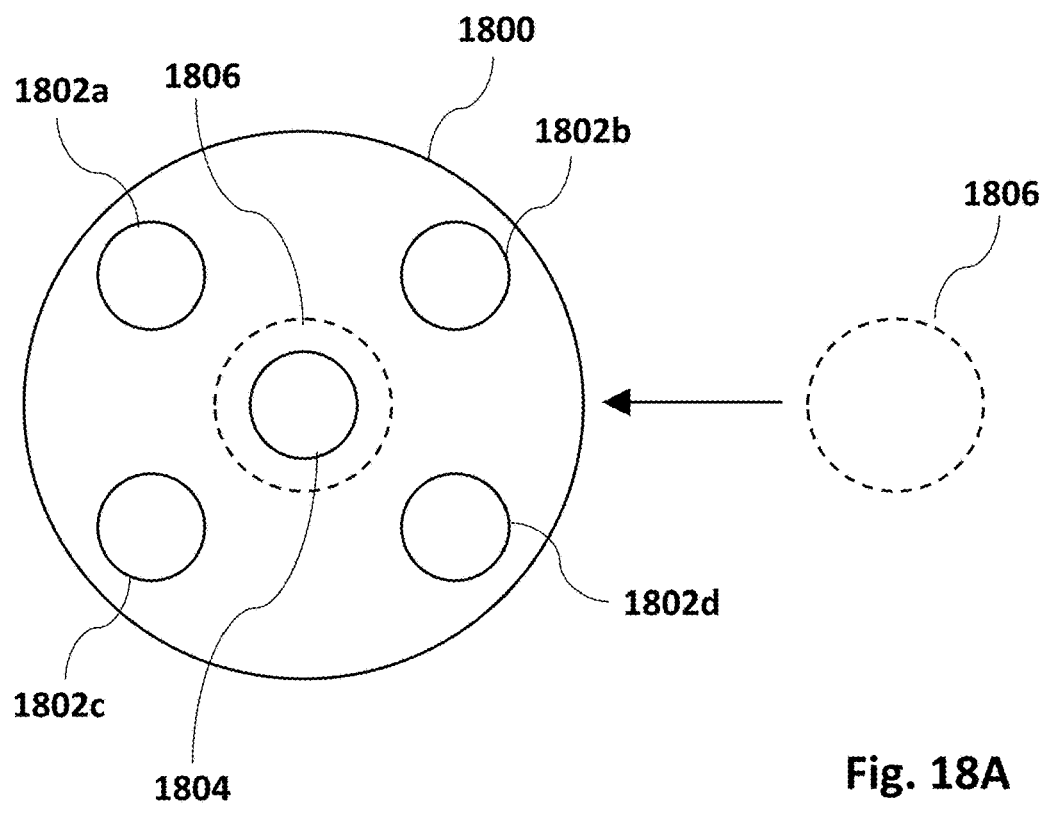
FIGS. 18A-18F are schematic illustrations of an imaging lens for printing contact holes and lines, respectively, on a substrate, using a lithographic apparatus including different obscurations, in accordance with various embodiments.

FIGS. 18A-F are schematic illustrations of an imaging lens for printing contact holes and lines, respectively, on a substrate, using a lithographic apparatus including different obscurations, in accordance with various embodiments. FIG. 18A includes various illustrative examples of different types of obscurations that may be used to suppress a zeroth order portion of a shaped radiation beam. In particular, the various examples of FIG. 18A may correspond to a patterning device, such as patterning device 1500, which may be used to print contact holes on a substrate. However, the obscurations described in the foregoing examples may be used for other features to be printed on a substrate.

Imaging lens 1800 may include zeroth order portion 1804 and first order portions 1802*a-d*. Zeroth order portion 1804 and first order portions 1802*a-d* may be substantially similar to zeroth order portion 1524 and first order portions 1522*a-d* of FIG. 15A, and the previous description may apply. In some embodiments, to improve contrast at small pitches, for EUV range lithographic apparatuses incorporating an attenuated PSM, e.g., patterning device 1500, suppression of zeroth order portion 1804 may be needed. As a result of using an attenuated PSM and suppressing a remaining zeroth order portion of a shaped radiation beam, hard PSM imaging may effectively be obtained.

In some embodiments, a circular shaped obscuration 1806 may be used to suppress zeroth order portion 1804. Circular shaped obscuration 1806 may be larger in size than zeroth order portion 1804. For example, if zeroth order portion 1804 is 4% of the size of imaging lens 1800, then circular shaped obscuration 1806 may be 5% or larger of the size of imaging lens 1800. In some embodiments, circular shaped obscuration 1806 may be placed above imaging lens 1800 to block zeroth order portion 1804 from reaching imaging lens 1800. For example, obscuration controller OC of FIG. 17 may retrieve circular shaped obscuration 1806 from obscuration holder OH, and may place circular shaped obscuration 1806 at a location within projection system PS such that circular shaped obscuration 1806 is centered with respect to imaging lens 1800 and aligned with an optical axis of the projection optics within projection system PS. Alternatively, circular shaped obscuration 1806 may be integrated within imaging lens 1800 such that zeroth order portion 1804 is suppressed within imaging lens 1800.

Figure 18B:
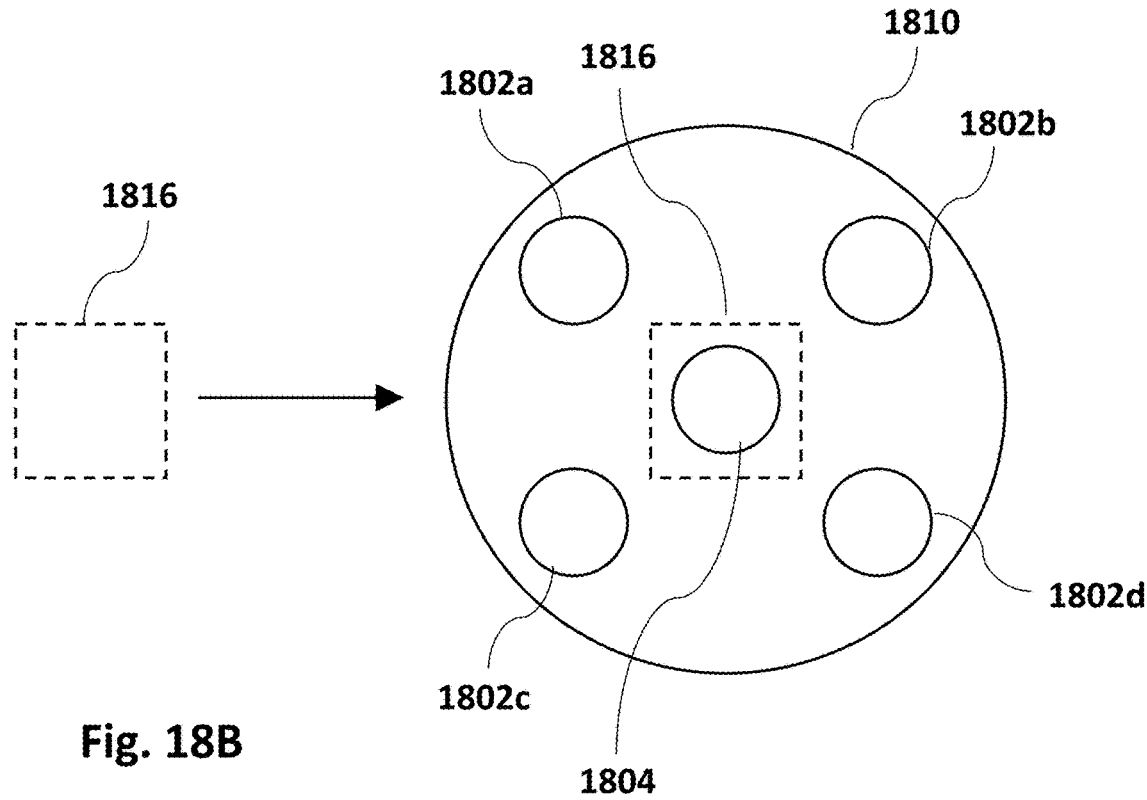

Imaging lens 1810 of FIG. 18B may similarly include zeroth order portion 1804 and first order portions 1802*a-d*. However, in some embodiments, imaging lens 1810 may include a square shaped obscuration 1816. Square shaped obscuration 1816 may have a larger size than zeroth order portion 1804 so as to suppress zeroth order portion 1804. Furthermore, square shaped obscuration 1816 may also be placed at a center of imaging lens 1810 and may be aligned with the optical axis of the projection optics within projection system PS. In some embodiments, squared shaped obscuration 1816 may be located above imaging lens 1810 (so that the shaped radiation beam passes square shaped obscuration 1816 prior to being incident on imaging lens 1810) or may be integrated within imaging lens 1810. In some embodiments, obscuration controller OC may be configured to retrieve square shaped obscuration 1816 from obscuration holder OH, and place square shaped obscuration 1816 within projection system PS to suppress zeroth order portion 1804. Furthermore, in some embodiments, obscuration controller OC may be configured to modify the type of obscuration, e.g., by switching from circular shaped obscuration 1806 to square shaped obscuration 1816, or vice versa.

Figure 18C:
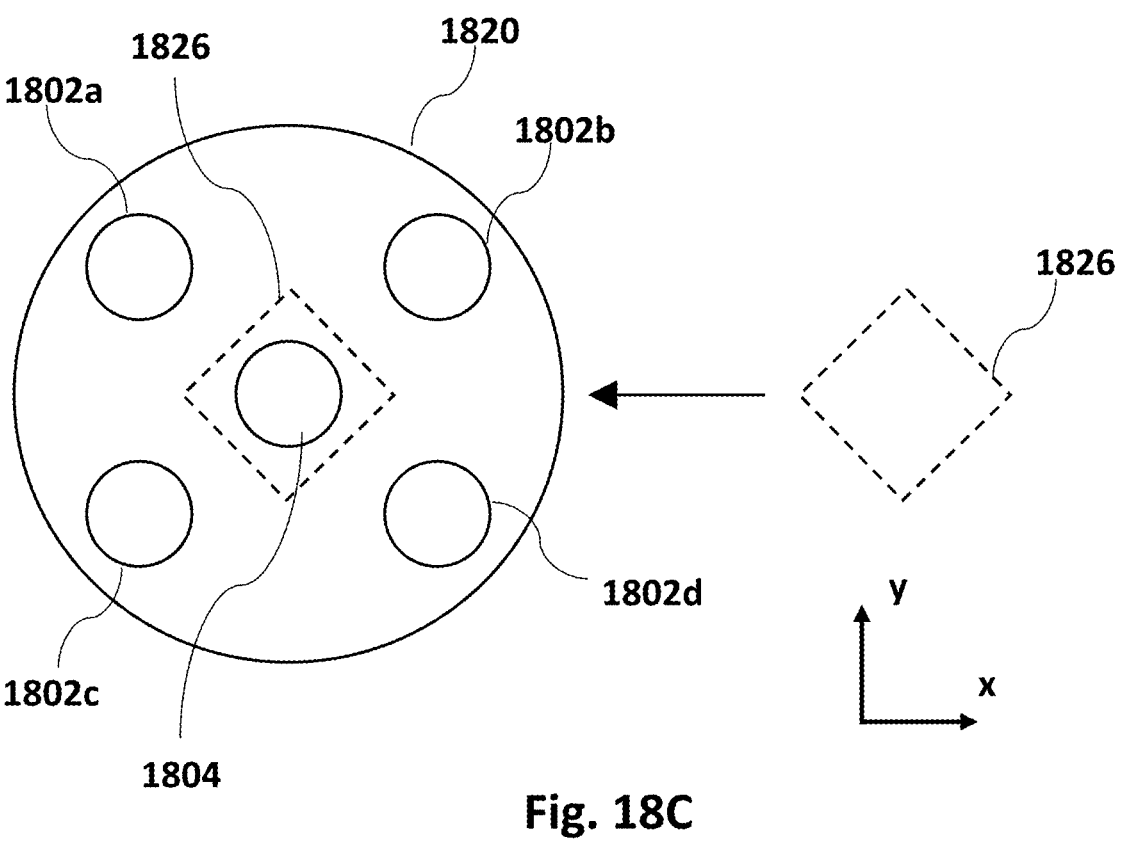

Imaging lens 1820 of FIG. 18C may similarly include zeroth order portion 1804 and first order portions 1802*a-d*. However, in some embodiments, imaging lens 1820 may include an angled square shaped obscuration 1826. Angled square shaped obscuration 1826 may be oriented at an angle, e.g., 45-degrees with respect to an x-y axis of imaging lens 1820, where the z-axis corresponds to the optical axis of the projection optics within projection system PS. In some embodiments, angled square shaped obscuration 1826 may be referred to as a diamond shaped obscuration. Similar to square shaped obscuration 1816, angled square shaped obscuration 1826 may have a larger size than zeroth order portion 1804 so as to suppress zeroth order portion 1804. Furthermore, angled square shaped obscuration 1826 may also be placed a center of imaging lens 1820, and either be located above imaging lens 1820 (so that the shaped radiation beam passes the central obscuration, i.e., angled square shaped obscuration 1826, prior to being incident on imaging lens 1820) or may be integrated within imaging lens 1820, and may be aligned with the optical axis as described above. In some embodiments, obscuration controller OC may be configured to retrieve angled square shaped obscuration 1826 from obscuration holder OH, and place angled square shaped obscuration 1826 within projection system PS to suppress zeroth order portion 1804. Furthermore, in some embodiments, obscuration controller OC may be configured to modify the type of obscuration, e.g., by switching from circular shaped obscuration 1806 or square shaped obscuration 1816 to angled square shaped obscuration 1826, or vice versa.

Figure 18D:
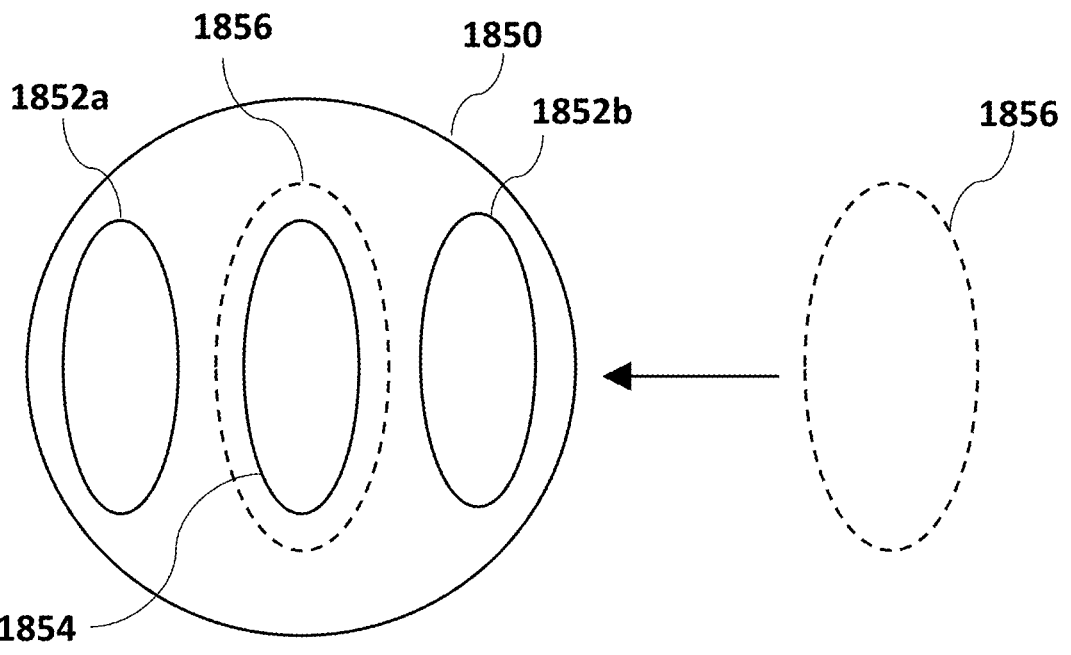
Figures 18E, 18F:
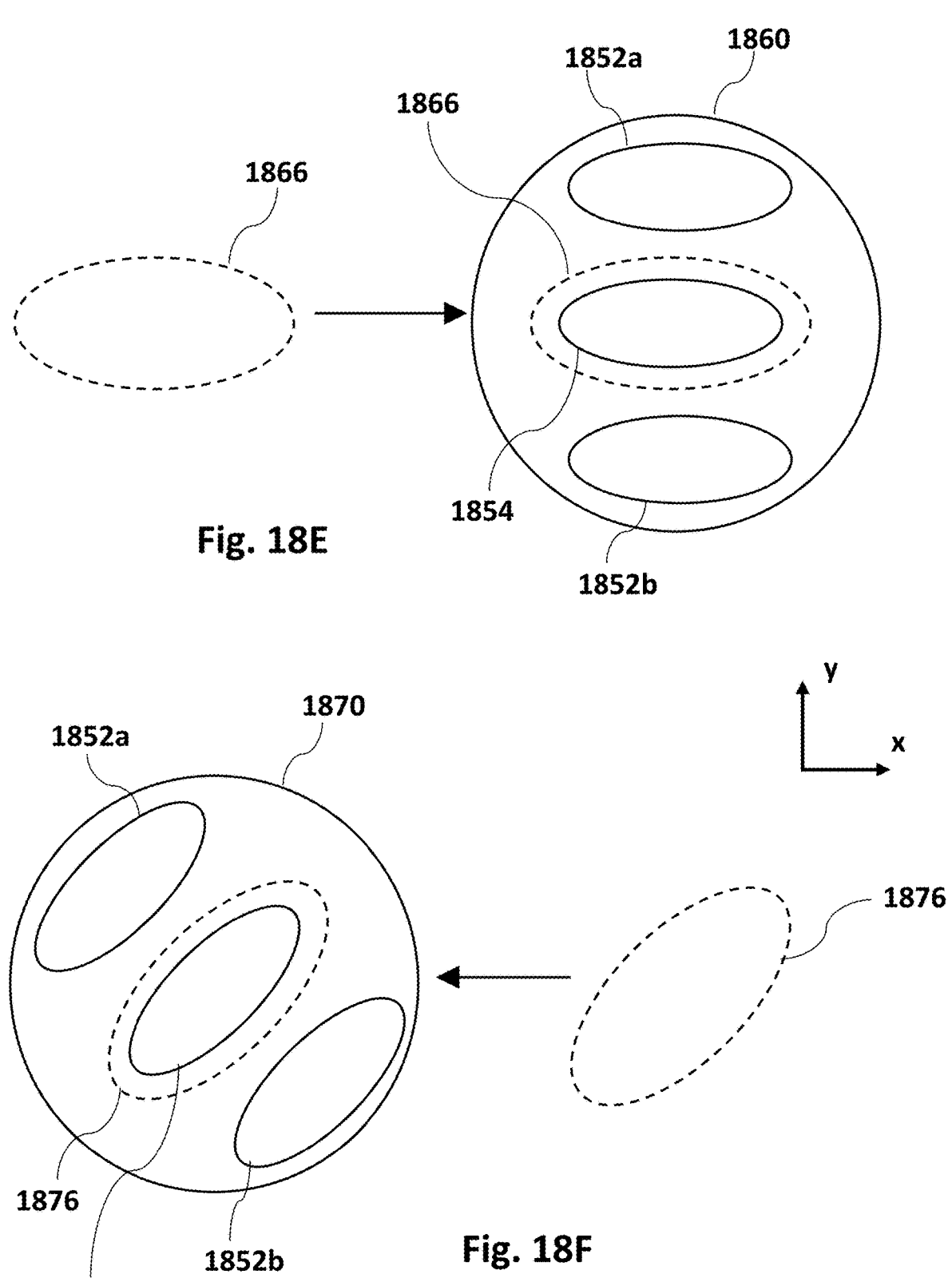

FIGS. 18D-F include various additional illustrative examples of different types of obscurations that may be used to suppress a zeroth order portion of a shaped radiation beam. In particular, the various examples of FIGS. 18D-F may correspond to a patterning device, such as patterning device 1550, which may be used to print lines on a substrate. However, the obscurations described in the foregoing examples may be used for other features to be printed on a substrate.

Imaging lens 1850 of FIG. 18D may include zeroth order portion 1854 and first order portions 1852a and 1852b. Zeroth order portion 1854 and first order portions 1852a and 1852b may be substantially similar to zeroth order portion 1574 and first order portions 1572a and 1572b of FIG. 15B, and the previous description may apply. In some embodiments, to improve contrast at small pitches, for EUV range lithographic apparatuses incorporating an attenuated phase shift mask, e.g., patterning device 1550, suppression of zeroth order portion 1854 may be needed. As a result of using an attenuated PSM and suppressing a remaining zeroth order portion of a shaped radiation beam, hard PSM imaging may effectively be obtained.

In some embodiments, an ellipsoid shaped obscuration 1856 may be used to suppress zeroth order portion 1854. Ellipsoid shaped obscuration 1856 may be larger in size than zeroth order portion 1854. For example, if zeroth order portion 1854 is 8% of the size of imaging lens 1850, then ellipsoid shaped obscuration 1856 may be 10% or larger of the size of imaging lens 1850. In some embodiments, ellipsoid shaped obscuration 1856 may be placed above imaging lens 1850 to block zeroth order portion 1854 from reaching imaging lens 1850. For example, obscuration controller OC of FIG. 17 may retrieve ellipsoid shaped obscuration 1856 from obscuration holder OH, and may place ellipsoid shaped obscuration 1856 at a location within projection system PS such that ellipsoid shaped obscuration 1856 is centered with respect to imaging lens 1850, and may be aligned with respect to the optical axis of the projection optics of projection system PS. Alternatively, ellipsoid shaped obscuration 1856 may be integrated within imaging lens 1850 such that zeroth order portion 1854 is suppressed within imaging lens 1850.

Imaging lens 1860 of FIG. 18E may similarly include zeroth order portion 1854 and first order portions 1852a and 1852b. However, in some embodiments, imaging lens 1860 may include an angled ellipsoid shaped obscuration 1866. Angled ellipsoid shaped obscuration 1866 may be oriented at an angle, e.g., 90-degrees with respect to an x-y axis of imaging lens 1860. Similar to ellipsoid shaped obscuration 1856, angled ellipsoid shaped obscuration 1866 may have a larger size than zeroth order portion 1854 so as to suppress zeroth order portion 1854. Furthermore, angled ellipsoid shaped obscuration 1866 may also be placed a center of imaging lens 1860 and may be aligned with the optical axis. In some embodiments, angled ellipsoid shaped obscuration 1866 may be located above imaging lens 1860 (so that the shaped radiation beam passes angled ellipsoid shaped obscuration 1866 prior to being incident on imaging lens 1860) or may be integrated within imaging lens 1860. In some embodiments, obscuration controller OC may be configured to retrieve angled ellipsoid shaped obscuration 1866 from obscuration holder OH, and place angled ellipsoid shaped obscuration 1866 within projection system PS to suppress zeroth order portion 1854. Furthermore, in some embodiments, obscuration controller OC may be configured to modify the type of obscuration, e.g., by switching from ellipsoid shaped obscuration 1856 to angled ellipsoid shaped obscuration 1866, or vice versa.

Imaging lens 1870 of FIG. 18F may be substantially similar to imaging lens 1850 and 1860. However, in some embodiments, imaging lens 1870 may include an angled ellipsoid shaped obscuration 1876, which is angled slightly off-axis. For example, angled ellipsoid shaped obscuration 1876 may be oriented at 45-degrees with respect to an x-y axis of imaging lens 1870. Furthermore, angled ellipsoid shaped obscuration 1876 may be aligned with a z-axis corresponding to the optical path of the projection optics of projection system PS. Similar to ellipsoid shaped obscuration 1856 and angled ellipsoid shaped obscuration 1866, angled ellipsoid shaped obscuration 1876 may have a larger size than zeroth order portion 1854 so as to suppress zeroth order portion 1854.

Figure 19A:
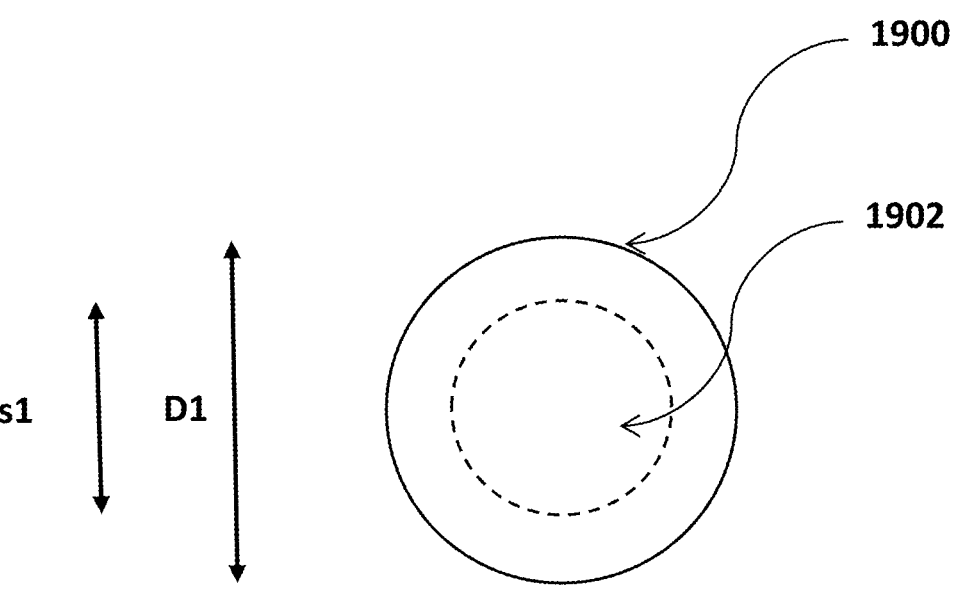
FIGS. 19A and 19B are schematic illustrations of example obscuration having an adjustable size, in accordance with various embodiments.
Figure 19B:
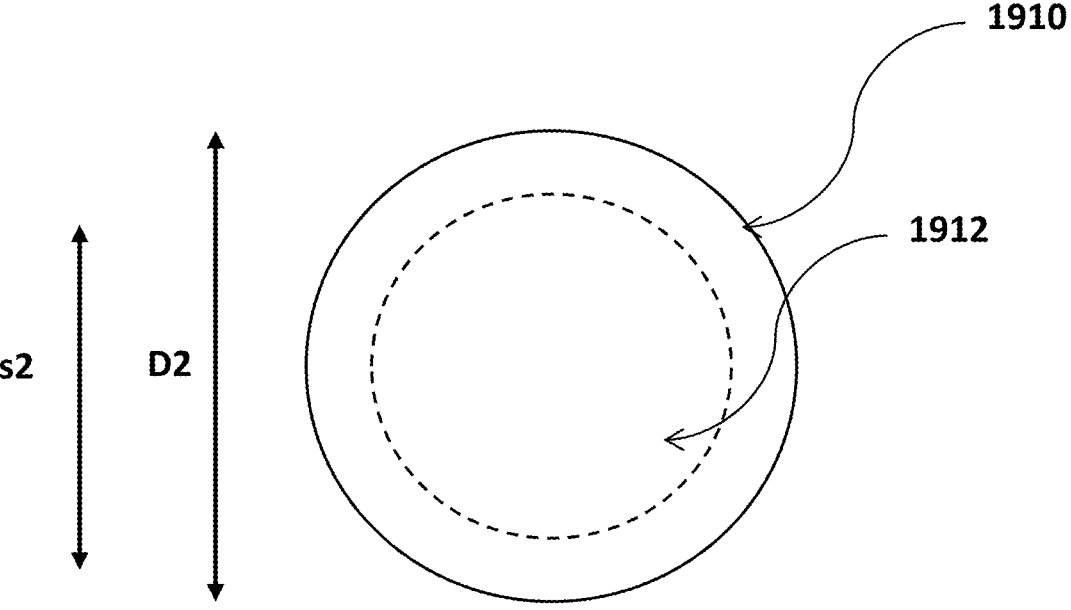

FIGS. 19A and 19B are schematic illustrations of example obscuration having an adjustable size, in accordance with various embodiments. In some embodiments, a central obscuration used within EUV lithographic apparatus 100 may be adjustable so as to accommodate different sized (or shaped) zeroth order portions of a shaped radiation beam. In some embodiments, the obscuration may be a permanent or semi-permanent fixture within projection system PS. For example, the obscuration may be situated proximate a side of an imaging lens (e.g., imaging lens 1520 or 1570) such that the shaped radiation beam, after reflecting off of a patterning device, will reach the obscuration before reaching the imaging lens. This may allow the obscuration to suppress a zeroth order portion of the shaped radiation beam by blocking the zeroth order portion. In some embodiments, the obscuration may be referred to as a central obscuration, and may be aligned with an optical axis of projection optics located within projection system PS.

In some embodiments, a first obscuration 1900 of FIG. 19A may be used within projection system PS. First obscuration 1900 may be a circular shaped central obscuration having a diameter D1. In some embodiments, first obscuration 1900 may be capable of suppressing a zeroth order portion of shaped radiation beam having a diameter that is smaller than diameter D1. For example, zeroth order portion 1902 of a shaped radiation beam that has been reflected by a patterning device, e.g., patterning device 1500, may have a diameter s1. In this example, s1 may be smaller than D1, allowing first obscuration 1900 to completely block all of zeroth order portion 1902 such that no zeroth order diffraction light reaches the imaging lens.

In some embodiments, a second obscuration 1910 of FIG. 19B may be used within projection system PS. Similar to first obscuration 1900, second obstruction 1910 may also be a circular shaped central obscuration having a diameter D2. In some embodiments, diameter D2 may be larger than diameter D1. Therefore, second obscuration 1910 may be capable of suppressing a zeroth order portion 1912 of shaped radiation beam having a diameter s2 that is smaller than diameter D2, but larger than diameter D1.

In some embodiments, first obscuration 1900 and second obscuration 1910 may be interchanged within projection system PS by obscuration controller OC. For instance, if a different patterning device MA is used by EUV lithographic apparatus 100, or if a portion of patterning device MA includes a region that is of a different size than another region that is scanned, obscuration controller OC may be capable of switching from one of first obscuration 1900 to second obscuration 1910, or vice versa. In some embodiments, a similar principle may be applied for obscurations of differing shapes. For example, different sized square shaped obscurations or ellipsoid shaped obscurations may also be used within projection system PS, and obscuration controller OC may be configured to adjust a size of the obscuration based on the image that is to be formed on the substrate, as indicated by the pattern on patterning device MA. In some embodiments, the size of the central obscuration, e.g., first obscuration 1900 and second obscuration 1910, may encompass a certain percentage of the pupil plane. For example, the imaging lens has a size, e.g., in terms of an area, and the central obscuration that is used within EUV lithographic apparatus 100 may range between 5% of the size of the imaging lens (e.g., pupil plane) and 30% of the imaging lens. In some embodiments, one or more mechanical components, e.g., disks, may be used to adjust a size of obscurations 1900 or 1910. The one or more mechanical components may be controlled by a device, such as obscuration controller OC, or may be manually configured, to form obscurations 1900 and 1910. For example, overlapping thin absorber plates may be used to form a shape of obscurations 1900 and 1910, and the arrangement of the overlapping plates may be controlled by obscuration controller OC or may be configured manually.

In some embodiments, processing device PD may receive an instruction to modify the size of the obscuration used within projection system PS. For example, processing device PD may obtain, either prior to scanning or during scanning, a mapping of the pattern of patterning device MA, indicating the sizes and shapes of the different regions on patterning device MA. Based on the sizes and shapes, processing device PD may determine which obscuration or obscurations should be used to ensure that the zeroth order portion of the shaped radiation beam is suppressed. Furthermore, based on the sizes and shapes of the different regions, and the image to be formed on the substrate, obscuration controller OC may be configured to adjust the size of the obscuration. For example, obscuration controller OC may adjust an arrangement of overlapping plates to modify a size of the obscuration used to accommodate for different shaped zeroth order portions.

Figure 20:
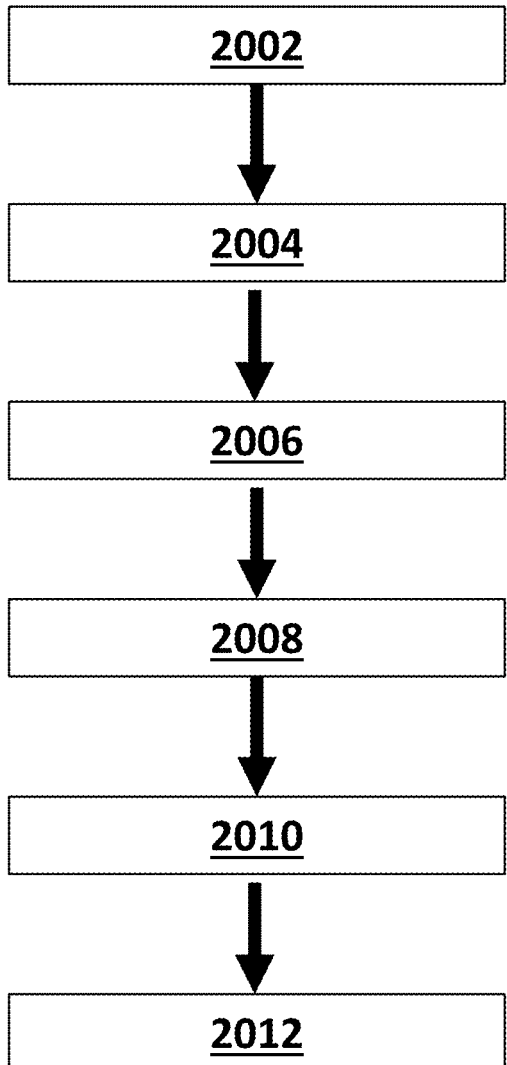
FIG. 20 is an illustrative flowchart of an exemplary process, in accordance with various embodiments.

FIG. 20 is an illustrative flowchart of an exemplary process, in accordance with various embodiments. In some embodiments, process 2000 may begin at step 2002. At step 2002, an extreme ultraviolet (EUV) radiation beam may be generated. In some embodiments, EUV radiation beam may be generated by source SO, as seen and described with reference to FIGS. 1 and 2. The EUV radiation beam, also referred to herein interchangeably as EUV light, may be in the EUV wavelength range. For example, the EUV radiation beam may have a wavelength between 5-20 nm. In some embodiments, the EUV radiation beam, e.g., EUV radiation beam 1721, may be conditioned via illuminator IL, which may include a source pupil. For example, the source pupil may be a monopole source pupil, a dipole source pupil a quasar or quadrupole source pupil, etc. In some embodiments, the source pupil type may depend on the pitch of the feature(s) to be printed on the substrate. In some embodiments, illuminator IL may output EUV radiation beam 1721, and may direct EUV radiation beam 1721 towards projection system PS. Projection system PS may receive EUV radiation beam 1721, and direct EUV radiation beam 1721 towards patterning device MA via reflective element 1701. In some embodiments, projection system PS may be included within an EUV lithographic apparatus, such as EUV lithographic apparatus 100.

At step 2004, a phase shift may be applied to a portion of the EUV radiation beam. In some embodiments, after being conditioned by illuminator IL including the source pupil, the EUV radiation beam may be directed toward a patterning device MA via one or more optical components, e.g., mirrors. Patterning device MA, in some embodiments, may be an attenuated phase shift mask (PSM), also referred to herein interchangeably as an attPSM. For example, lithographic apparatus 100 of FIGS. 1 and 2 may use patterning device 1500 or 1550 to shape the incident EUV radiation beam. In some embodiments, lithographic apparatus 100 may include a patterning device support structure MT, which may receive and hold patterning device 1500 or 1550 (or a different patterning device). Patterning device support structure MT may secure patterning device 1500 or 1550 such that the patterning device remains stabilized and secure while being scanned by the EUV radiation beam.

In some embodiments, for an attenuated PSM, patterning device MA may be configured to suppress some of the EUV radiation beam. For example, patterning device 1500 may include a pattern of reflective regions, e.g., first regions 1502, and partially reflective regions, e.g., second regions 1504. The reflective regions, e.g., first regions 1502, may be configured to reflect the incident EUV radiation beam without any (or a minimal amount of) absorption. For instance, each light region, e.g., first regions 1502, may be designed to reflect approximately 100% of the incident EUV radiation. The partially reflective regions, e.g., second regions 1504, may be configured to partially reflect the incident EUV radiation beam. For example, each dark region, e.g., second regions 1504, may reflect between 5-20% of the incident EUV radiation (e.g., 10% reflection). The remaining percentage of the incident EUV radiation may be absorbed by a material that is used to form a top layer of the attenuated PSM (e.g., Ru). Furthermore, second regions 1504 may be configured to apply a phase shift to the reflected EUV radiation beam. For example, the phase shift may be a 180-degree phase shift.

As mentioned above the zeroth order portion may decrease the contrast of the image formed on the substrate, reducing lithographic apparatus 100's ability to print features having small pitches having improved source mask optimization (SMO), increased NILS, and lowered LCDU. Patterning device MA may shape the incident EUV radiation beam in accordance with the pattern. For patterning devices of the attenuated PSM type, a smaller portion of the shaped EUV radiation beam may include a zeroth order portion (e.g., zeroth diffraction order) of the shaped radiation beam as compared to a binary mask. However, in contrast to a hard PSM, the shaped EUV radiation beam formed after the EUV radiation beam is incident on the attenuated PSM, e.g., patterning device 1500, may include a zeroth order portion. Furthermore, in contrast to a hard PSM, the attenuated PSM may include regions that partially absorb the incident EUV radiation beam. However, in some embodiments, the pattern of the attenuated PSM may be the same as that of a hard PSM. For example, patterning device 1500 may be an attenuated PSM having a checkerboard pattern for printing contact holes. If a hard PSM were to be used to print contact holes, the hard PSM would also have a checkboard pattern, whereas a binary mask would have a pattern similar to that of patterning device 1400. In some embodiments, patterning device MA may also be configured to suppress a portion of EUV radiation beam 1721. For example, patterning device MA may suppress some of the zeroth order portion of shaped EUV radiation beam 1711.

At step 2006, a zeroth order portion of the phase shifted EUV radiation beam may be suppressed. In some embodiments, the zeroth order portion may be suppressed by an obscuration. For example, projection system PS may include an obscuration that may be used to suppress the zeroth order portion of the phase shifted and shaped EUV radiation beam. In some embodiments, the obscuration may be configured to block the zeroth order portion such that no amount of the zeroth order portion reaches the imaging lens and subsequently is not used to form the image on the substrate. In some embodiments, a shape of the obscuration may depend on the pattern on the attenuated PSM. For example, for a checkboard pattern (e.g., patterning device 1500) used to print contact holes on a substrate, a circular shaped obscuration, a rectangular shaped obscuration, a rectangular shaped obscuration rotated by an angle, a square shaped obscuration, or a square shaped obscuration rotated by an angle may be used. In some embodiments, a size of the obscuration may also depend on the pattern of the attenuated PSM. For example, the obscuration may have a size between 5-30% of the size of the pupil plane, e.g., the imaging lens, of EUV lithographic apparatus 100.

At step 2008, an unsuppressed portion of the phase shifted EUV radiation beam may be directed towards a substrate to form an image on the substrate. For instance, the unsuppressed portion may be directed via projection system PS towards substrate PS. In some embodiments, projection system PS may include one or more optical elements (e.g., lenses, reflective elements, etc.) that direct the phase shifted EUV radiation beam, after the zeroth order portion of the phase shifted EUV radiation beam has been suppressed by the obscuration, toward substrate W. In some embodiments, the unsuppressed portion of the phase shifted EUV radiation beam may include one or more first diffraction order portions (e.g., +1/−1, +1/+1, −1/+1, −1/−1), which may be used to print features on substrate W in accordance with the pattern of patterning device MA. In some embodiments, the unsuppressed portion of the phase shifted EUV radiation beam may further include one or more higher diffraction order portions (e.g. second or third diffraction orders).

At step 2010, a type of obscuration used may be modified. The type of obscuration used, e.g., a shape of the central obscuration, may depend on the image to be formed on the substrate and/or the pattern on the patterning device that the light is shaped by. For example, for a checkboard pattern, e.g., patterning device 1500, a type of obscuration used may include a circular shaped obscuration, a rectangular shaped obscuration, a rectangular shaped obscuration rotated by an angle, a square shaped obscuration, or a square shaped obscuration rotated by an angle. As another example, for a pattern of lines, e.g., patterning device 1550, a type of obscuration used may include a rectangular shaped obscuration, a rectangular shaped obscuration rotated by an angle, an ellipsoid shaped obscuration, or an ellipsoid shaped obscuration rotated by an angle. In some embodiments, depending on the pattern on the patterning device or if a patterning device is changed such that a different patterning device having a different pattern is used, the type of obscuration used may also be modified. In some embodiments, obscuration controller OC may be configured to place a particular obscuration within projection system PS to suppress the zeroth order portion of the phase shifted EUV radiation beam. Obscuration controller OC may receive an instruction from processing device PD indicating which type of obscuration is to be used for a particular patterning device. Furthermore, obscuration controller OC may receive additional instructions from processing device PD indicating whether the type of obscuration is to be changed. If so, obscuration controller OC may retrieve the desired obscuration from obscuration holder OH and insert the obscuration at the appropriate location (e.g., in front of the imaging lens) within projection system PS to suppress, e.g., block, the zeroth order portion.

At step 2012, a size of the obscuration may be adjusted. In some embodiments, obscuration controller OC may be configured to adjust the size of the obscuration in addition to being configured to modify the type of obscuration. For example, obscuration controller OC may cause the size of the obscuration to be adjusted such that the central obscuration has a size between 5 and 30% of the size of the imaging lens. In some embodiments, obscuration controller OC may be configured to select a different sized obscuration based on the pattern of patterning device MA as well as the size of the features to be printed. For example, processing device PD may generate and send an instruction to obscuration controller OC indicating that a different sized obscuration may be needed. In response, obscuration controller OC may obtain a size insert or a different obscuration from obscuration holder OH to cause the size of the obscuration used within projection system PS to be modified. In some embodiments, obscuration controller OC may be configured to adjust one or more mechanical components to cause the size of the obscuration to be adjusted. Further still, in some embodiments, a location of the obscuration within projection system PS, or elsewhere within lithographic apparatus 100, may be modified. For example, obscuration controller OC may be configured to adjust a location of obscuration 1700 to be proximate to patterning device MA, proximate imaging lens 1702, or at a different location along an optical axis of shaped EUV radiation beam 1711.

Figure 21:
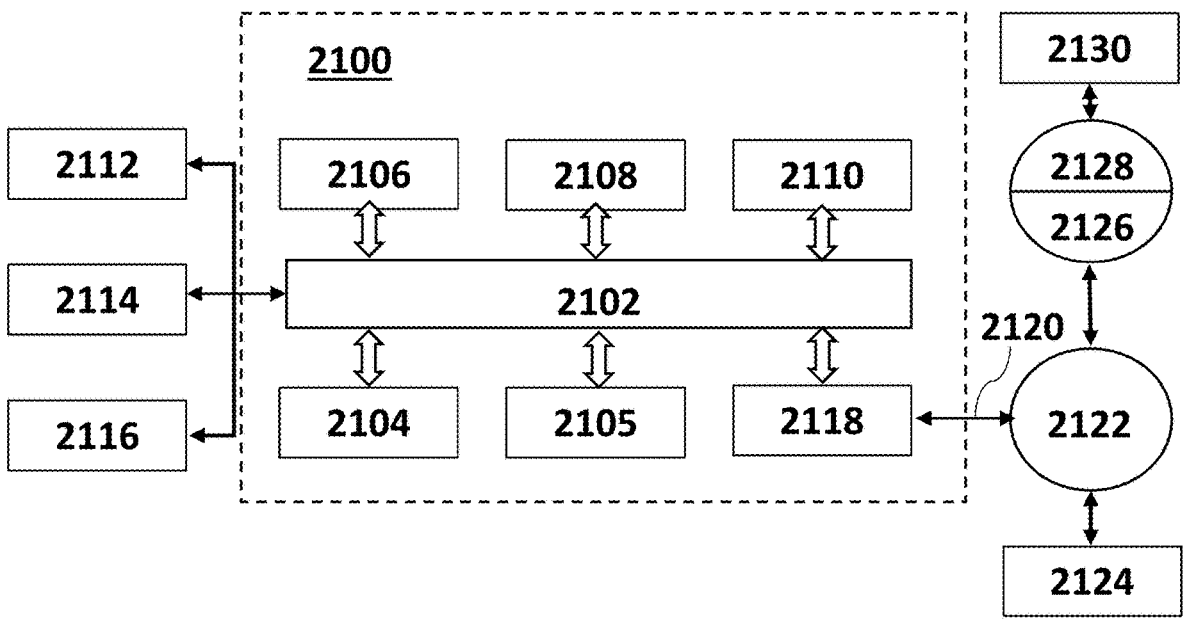
FIG. 21 is an illustrative computing system capable of being used in conjunction with one or more aspects of a lithographic apparatus, in accordance with various embodiments.

FIG. 21 is a block diagram that illustrates a computer system 2100 which can assist in implementing methods and flows disclosed herein. In some embodiments, processing device PD of FIG. 17 may be computer system 2100. Alternatively, processing device PD may be a component of computer system 2100 and/or may be controlled by computer system 2100. Furthermore, obscuration controller OC may be configured to receive instructions from computer system 2100 in addition to or instead of processing device PD.

Computer system 2100 includes a bus 2102 or other communication mechanism to communicate information, and a processor 2104 (or multiple processors 2104 and 2105) coupled with bus 2102 to process information. Computer system 2100 may also include a main memory 2106, such as a random access memory (RAM) or other dynamic storage device, coupled to bus 2102 to store or supply information and instructions to be executed by processor 2104. Main memory 2106 may be used to store or supply temporary variables or other intermediate information during execution of instructions to be executed by processor 2104. Computer system 2100 may further include a read only memory (ROM) 2108 or other static storage device coupled to bus 2102 to store or supply static information and instructions for processor 2104. A storage device 2110, such as a magnetic disk or optical disk, may be provided and coupled to bus 2102 to store or supply information and instructions.

Computer system 2100 may be coupled via bus 2102 to a display 2112, such as a cathode ray tube (CRT) or flat panel or touch panel display, to display information to a computer user. An input device 2114, including alphanumeric and other keys, may be coupled to bus 2102 to communicate information and command selections to processor 2104. Another type of user input device may be cursor control 2116, such as a mouse, a trackball, or cursor direction keys, to communicate direction information and command selections to processor 2104 and to control cursor movement on display 2112. This input device typically has two degrees of freedom in two axes, a first axis (e.g., x) and a second axis (e.g., y), that allows the device to specify positions in a plane. A touch panel (screen) display may also be used as an input device.

According to an embodiment, portions of a process described herein may be performed by computer system 2100 in response to processor 2104 executing one or more sequences of one or more instructions contained in main memory 2106. Such instructions may be read into main memory 2106 from another computer-readable medium, such as storage device 2110. Execution of the sequences of instructions contained in main memory 2106 causes processor 2104 to perform the process steps described herein. One or more processors in a multi-processing arrangement may be employed to execute the sequences of instructions contained in main memory 2106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 2104 for execution. Such a medium may take many forms, including but not limited to, non-volatile media, volatile media, and transmission media. Non-volatile media include, for example, optical or magnetic disks, such as storage device 2110. Volatile media include dynamic memory, such as main memory 2106.

Transmission media include coaxial cables, copper wire and fiber optics, including the wires that comprise bus 2102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 2104 for execution. For example, the instructions may initially be borne on a disk or memory of a remote computer. The remote computer can load the instructions into its dynamic memory and send the instructions over a communications path. Computer system 2100 can receive the data from the path and place the data on bus 2102. Bus 2102 carries the data to main memory 2106, from which processor 2104 retrieves and executes the instructions. The instructions received by main memory 2106 may optionally be stored on storage device 2110 either before or after execution by processor 2104.

Computer system 2100 may include a communication interface 2118 coupled to bus 2102. Communication interface 2118 provides a two-way data communication coupling to a network link 2120 that is connected to a network 2122. For example, communication interface 2118 may provide a wired or wireless data communication connection. In any such implementation, communication interface 2118 sends and receives electrical, electromagnetic or optical signals that carry digital data streams representing various types of information.

Network link 2120 typically provides data communication through one or more networks to other data devices. For example, network link 2120 may provide a connection through network 2122 to a host computer 2124 or to data equipment operated by an Internet Service Provider (ISP) 2126. ISP 2126 in turn provides data communication services through the worldwide packet data communication network, now commonly referred to as the "Internet" 2128. Network 2122 and Internet 2128 both use electrical, electromagnetic or optical signals that carry digital data streams. The signals through the various networks and the signals on network link 2120 and through communication interface 2118, which carry the digital data to and from computer system 2100, are exemplary forms of carrier waves transporting the information.

Computer system 2100 can send messages and receive data, including program code, through the network(s), network link 2120, and communication interface 2118. In the Internet example, a server 2130 might transmit a requested code for an application program through Internet 2128, ISP 2126, network 2122 and communication interface 2118. One such downloaded application may provide for the code to implement a method herein, for example. The received code may be executed by processor 2104 as it is received, or stored in storage device 2110, or other non-volatile storage for later execution. In this manner, computer system 2100 may obtain application code in the form of a carrier wave.

The concepts disclosed herein may simulate or mathematically model any generic imaging system for imaging sub wavelength features, and may be especially useful with emerging imaging technologies capable of producing wavelengths of an increasingly smaller size, and is particularly useful with EUV lithography. EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multilayer IC, so that the term substrate used herein may also refer to a substrate that already contains multiple processed layers.

In the present document, the terms "radiation" and "beam" as used herein encompass all types of electromagnetic radiation, including ultraviolet radiation (e.g., with a wavelength of about 365, about 248, about 193, about 157 or about 126 nm) and extreme ultra-violet (EUV) radiation (e.g., having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g., a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In an embodiment, there is provided a lithographic apparatus including a patterning device comprising one or more two-dimensional (2D) features, wherein the patterning device is configured to shape a radiation beam output from a source; and a projection system configured to: suppress at least a zeroth order portion of the shaped radiation beam, and direct an unsuppressed portion of the shaped radiation beam towards a substrate to form an image on the substrate according to the one or more 2D features.

In an embodiment, the projection system comprises a filter that suppresses the zeroth order portion.

In an embodiment, the filter comprises a central obscuration configured to suppress the zeroth order portion by blocking the zeroth order portion.

In an embodiment, the one or more 2D features comprise a diamond-like shape.

In an embodiment, the filter further includes: a distribution of blocking elements arranged to suppress interference between first order portions of the shaped radiation beam.

In an embodiment, the distribution of blocking elements comprises absorbers or reflective elements, and a number of blocking elements included in the distribution is related to a symmetry of a unit cell comprising the one or more 2D features.

In an embodiment, the filter comprises a reflective filter including a central aperture that suppresses the zeroth order portion by: reflecting the unsuppressed portion, directing the unsuppressed portion to the substrate, and preventing the zeroth order portion from imaging the substrate.

In an embodiment, the projection system includes a central obscuration configured to suppress the zeroth order portion by blocking the zeroth order portion.

In an embodiment, the projection system includes a filter comprising a distribution of blocking elements configured to suppress interference between first order portions of the shaped radiation beam.

In an embodiment, the projection system includes: a first reflective element proximate the patterning device; and a second reflective element proximate the substrate, wherein the first reflective element and the second reflective element each include an aperture along an axis associated with the zeroth order portion such that the central obscuration blocks the zeroth order portion.

In an embodiment, the patterning device includes a phase shift mask configured to apply a phase shift to the radiation beam such that the shaped radiation beam includes the zeroth order portion shifted to the first order portions.

In an embodiment, the one or more 2D features comprise a diamond-like shape, the phase-shift mask comprises a 0-degree and 180 degree phase shift and is configured to suppress the zeroth order portion.

In an embodiment, the projection system further includes a filter configured to suppress interference between first order portions of the shaped radiation beam, wherein an intensity of the shaped EUV radiation beam with the zeroth order suppressed and the interference between the first order portions suppressed is increased by a factor of four relative to the lithographic apparatus absent the filter.

In an embodiment, the projection system further includes a filter configured to suppress interference between first order portions of the shaped radiation beam, the one or more 2D features are arranged in a honeycomb-like pattern, the phase shift mask comprises one of: (i) a 0 degree and 180 degree phase shift, or (ii) a 0 degree, 120 degree, and −120 degree phase shift, and the phase shift mask is configured to suppress the zeroth order portion.

In an embodiment, an intensity of the shaped EUV radiation beam with the zeroth order suppressed and the interference between the first order portions suppressed is increased by a factor of eight relative to the lithographic apparatus absent the filter.

In an embodiment, the radiation beam is configured by the source to have a wavelength in the extreme ultraviolet (EUV) range; and the lithographic apparatus comprises an EUV lithographic apparatus.

In an embodiment, the projection system is formed in a Schwarzschild-like optical design and functions as a 2D interferometric printer.

Furthermore, there is provided a method including causing a radiation beam, output by a source, to be shaped by a patterning device comprising one or more two-dimensional (2D) features; causing, via a projection system, at least a zeroth order portion of the shaped radiation beam to be suppressed; and directing, via the projection system, an unsuppressed portion of the shaped radiation beam towards a substrate to form an image on the substrate according to the one or more 2D features.

In an embodiment, the method further includes receiving the radiation beam output by the source, wherein the radiation beam has a wavelength in the extreme ultraviolet (EUV) range, and wherein the shaped radiation beam comprises a shaped EUV radiation beam.

Furthermore, there is provided a projection system included within an extreme ultraviolet (EUV) lithographic apparatus including: a filter configured to suppress at least a zeroth order portion of a shaped EUV radiation beam, wherein an EUV radiation beam output from a source is shaped via one or more two-dimensional (2D) features of a patterning device to form the shaped EUV radiation beam; and one or more reflective elements configured to directed an unsuppressed portion of the shaped EUV radiation beam towards a substrate to form an image on the substrate according to the one or more 2D features.

In the present disclosure, combination and sub-combinations of disclosed elements constitute separate embodiments. For example, the combination of elements may include an extreme ultraviolet (EUV) lithographic apparatus including a projection system. Further, in a sub-combination, the projection system may suppress a zeroth order portion of a configured EUV radiation beam and direct an unsuppressed portion of the configured EUV radiation beam towards a substrate to form an image on the substrate. In another sub-combination, the projection system may include a central obscuration. In another sub-combination, the EUV lithographic apparatus may include a patterning device support structure configured to support a patterning device.

In an embodiment, there is provided a lithographic apparatus configured to project, via a radiation beam, a pattern of a patterning device onto a substrate, wherein the patterning device is configured to shape the radiation beam in accordance with the pattern, the lithographic apparatus comprising: a projection system configured to: suppress a zeroth order portion of a shaped radiation beam, and direct an unsuppressed portion of the shaped radiation beam to a substrate.

In an embodiment, the projection system comprises a filter that suppresses the zeroth order portion.

In an embodiment, the filter comprises an obscuration configured to suppress the zeroth order portion by blocking the zeroth order portion.

In an embodiment, the lithographic apparatus further comprises: a sub-system configured to control at least one of: a size of the obscuration, a shape of the obscuration, and a location of the obscuration relative to the projection system.

In an embodiment, the obscuration is configured to block between 5% and 30% of an area of an aperture stop in a pupil plane of projection optics of the projection system.

In an embodiment, the filter further comprises: a distribution of blocking elements arranged to suppress interference between first order portions of the shaped radiation beam.

In an embodiment, the distribution of blocking elements comprises absorbers or reflective elements, and a number of blocking elements included in the distribution is related to a symmetry of a unit cell comprising the one or more 2D features.

In an embodiment, the filter comprises a reflective filter including a central aperture that suppresses the zeroth order portion by: reflecting the unsuppressed portion, directing the unsuppressed portion to the substrate, and preventing the zeroth order portion from imaging the substrate.

In an embodiment, the projection system comprises: a first reflective element proximate the patterning device; and a second reflective element proximate the substrate, wherein the first reflective element and the second reflective element each include an aperture along an axis associated with the zeroth order portion such that an obscuration blocks the zeroth order portion.

In an embodiment, the radiation beam is an extreme ultraviolet radiation (EUV) beam.

In an embodiment, the projection system is formed in a Schwarzschild-like optical design and functions as a 2D interferometric printer.

In an embodiment, there is provided a method for projecting, via a radiation beam, a pattern of a patterning device onto a substrate, wherein the patterning device is configured to shape the radiation beam in accordance with the pattern, the method comprising: causing, via a projection system, a zeroth order portion of a shaped radiation beam to be suppressed; and directing, via the projection system, an unsuppressed portion of the shaped radiation beam towards a substrate to form an image on the substrate.

In an embodiment, the projection system comprises an obscuration, causing the zeroth order portion to be suppressed comprises: blocking, using the obscuration, the zeroth order portion.

In an embodiment, causing the zeroth order portion to be suppressed comprises: orienting the obscuration such that the obscuration is positioned in a path of the shaped radiation beam.

In an embodiment, the method further comprises: adjusting at least one of a size of the obscuration, a shape of the obscuration, or a location of the obscuration relative to a path of the shaped radiation beam based on an illumination mode used.

In an embodiment, the projection system comprises a filter, causing the zeroth order portion to be suppressed comprises: filtering the shaped radiation beam such that the zeroth order portion is suppressed.

In an embodiment, the filter further comprises a distribution of blocking elements arranged, the method further comprises: causing interference between first order portions of the shaped radiation beam to be suppressed using the distribution of blocking elements.

In an embodiment, wherein the filter comprises a reflective filter including a central aperture, causing the zeroth order portion to be suppressed comprises: reflecting the unsuppressed portion; directing the unsuppressed portion to the substrate; and preventing the zeroth order portion from imaging the substrate.

In an embodiment, a two-dimensional (2D) pattern of the patterning device is to be projected onto the substrate; the 2D pattern comprises a topography that has a periodicity; and a projection of the 2D pattern onto the substrate has double the periodicity.

In an embodiment, there is provided a projection system incorporated within a lithographic apparatus configured to project, via a radiation beam, a pattern of a patterning device onto a substrate, wherein the patterning device is configured to shape the radiation beam in accordance with the pattern, wherein the projection system comprises a filter configured to suppress a zeroth order portion of a shaped radiation beam, wherein an unsuppressed portion of the shaped radiation beam to is directed towards a substrate to form an image on the substrate.

In an embodiment, the filter comprises a central obscuration configured to suppress the zeroth order portion of the shaped radiation beam by blocking the zeroth order portion of the shaped radiation beam.

In an embodiment, the projection system further comprises an obscuration controller configured to modify a type of the central obscuration used by the projection system.

In an embodiment, the obscuration controller is further configured to: adjust a size of the central obscuration based on the image to be formed on the substrate.

In an embodiment, the size of the central obscuration used within the projection system is between 5% and 30% of a pupil plane of the lithographic apparatus.

In an embodiment, the projection system further comprises an obscuration holder configured to store different types of filters to be used within the projection system for suppressing the zeroth order portion of the shaped radiation beam.

In an embodiment, there is provided an extreme ultraviolet (EUV) lithographic apparatus for forming an image on a substrate by use of an EUV radiation beam that is shaped by a patterning device comprising a pattern of reflective regions and partially reflective regions, wherein the partially reflective regions are configured to suppress and apply a phase shift to a portion of the EUV radiation beam, the EUV lithographic apparatus comprising: a projection system configured to: suppress a zeroth order portion of a configured EUV radiation beam, and direct an unsuppressed portion of the shaped EUV radiation beam towards a substrate to form an image on the substrate.

In an embodiment, wherein the projection system comprises: a central obscuration configured to suppress the zeroth order portion of the configured EUV radiation beam by blocking the zeroth order portion of the shaped EUV radiation beam.

In an embodiment, the EUV lithographic apparatus further comprises: an obscuration controller configured to modify a type of the central obscuration used by the projection system.

In an embodiment, the type of the central obscuration comprises one of: a circular shaped obscuration, a rectangular shaped obscuration, the rectangular shaped obscuration rotated by an angle, an ellipsoid shaped obscuration, a square shaped obscuration, or the square shaped obscuration rotated by an angle.

In an embodiment, the type of central obscuration used within the projection system is selected based on the image to be formed on the substrate.

In an embodiment, the obscuration controller is further configured to: adjust a size of the central obscuration based on the image to be formed on the substrate.

In an embodiment, at least some of the shaped EUV radiation beam is in the zeroth order such that the projection system is configured to cause the image to be formed on the substrate using one or more non-zeroth order portions of the shaped EUV radiation beam.

In an embodiment, there is provided an extreme ultraviolet (EUV) lithographic apparatus, comprising: a patterning device support structure configured to support a patterning device comprising a pattern of reflective regions and partially reflective regions, wherein the patterning device is configured to shape an EUV radiation beam to form a shaped EUV radiation beam, and wherein the partially reflective regions are configured to suppress and apply a phase shift to a portion of the shaped EUV radiation beam; and a projection system configured to: suppress a zeroth order portion of the shaped EUV radiation beam, and direct an unsuppressed portion of the shaped EUV radiation beam towards a substrate to form an image on the substrate.

In an embodiment, the projection system comprises: a central obscuration configured to suppress the zeroth order portion of the shaped EUV radiation beam by blocking the zeroth order portion of the shaped EUV radiation beam.

In an embodiment, the EUV lithographic apparatus further comprises: an obscuration controller configured to modify a type of the central obscuration used by the projection system.

In an embodiment, the type of the central obscuration comprises one of: a circular shaped obscuration, a rectangular shaped obscuration, the rectangular shaped obscuration rotated by an angle, an ellipsoid shaped obscuration, a square shaped obscuration, or the square shaped obscuration rotated by an angle.

In an embodiment, the type of central obscuration used within the projection system is selected based on the image to be formed on the substrate.

In an embodiment, the obscuration controller is further configured to: adjust a size of the central obscuration based on the image to be formed on the substrate.

In an embodiment, the size of the central obscuration used within the projection system is between 5% and 30% of a pupil plane of the EUV lithographic apparatus.

In an embodiment, at least some of the shaped EUV radiation beam is in the zeroth order such that the projection system is configured to cause the image to be formed on the substrate using one or more non-zeroth order portions of the shaped EUV radiation beam.

In an embodiment, there is provided a projection system included within an extreme ultraviolet (EUV) lithographic apparatus where the projection system is configured to suppress a zeroth order portion of a configured EUV radiation beam, and direct an unsuppressed portion of the configured EUV radiation beam towards a substrate to form an image on the substrate.

In an embodiment, the EUV lithographic apparatus that the projection system is included within forms an image on a substrate by use of an EUV radiation beam configured by a patterning device comprising a pattern of reflective regions and partially reflective regions, where the partially reflective regions are configured to suppress and apply a phase shift to a portion of the EUV radiation beam.

In an embodiment, the projection system comprises a central obscuration configured to suppress the zeroth order portion of the configured EUV radiation beam by blocking the zeroth order portion of the configured EUV radiation beam.

In an embodiment, the central obscuration used by the projection system is capable of being modified via an obscuration controller.

In an embodiment, the type of the central obscuration includes one of: a circular shaped obscuration, a rectangular shaped obscuration, the rectangular shaped obscuration rotated by an angle, an ellipsoid shaped obscuration, a square shaped obscuration, or the square shaped obscuration rotated by an angle.

In an embodiment, the type of central obscuration used within the projection system is selected based on the image to be formed on the substrate.

In an embodiment, the obscuration controller is configured to adjust a size of the central obscuration based on the image to be formed on the substrate.

In an embodiment, the size of the central obscuration used within the projection system is between 5% and 30% of a pupil plane of the EUV lithographic apparatus.

In an embodiment, at least some of the configured EUV radiation beam is in the zeroth order such that the projection system is configured to cause the image to be formed on the substrate using one or more non-zeroth order portions of the configured EUV radiation beam.

In an embodiment, the configured radiation beam is received from a patterning device support structure configured to support a patterning device including a pattern of reflective regions and partially reflective regions, where the patterning device is configured to shape the EUV radiation beam to form the configured EUV radiation beam, and where the partially reflective regions are configured to suppress and apply a phase shift to a portion of the configured EUV radiation beam.

In an embodiment, there is provided a method for receiving, by a projection system, an unsuppressed portion of a phase shifted extreme ultraviolet (EUV) radiation beam; and directing, by the projection system, the unsuppressed portion of the phase shifted EUV radiation beam towards a substrate to form an image on the substrate.

In an embodiment, the unsuppressed portion of the phase shifted EUV radiation beam is received in response to a zeroth order portion of the phase shifted EUV radiation beam being suppressed.

In an embodiment, an EUV radiation beam is generated and a phase shift is applied to a portion of the EUV radiation beam, and the zeroth order portion of the phase shifted EUV radiation beam is suppressed subsequent to the phase shift being applied to the portion of the EUV radiation beam.

In an embodiment, the projection system includes a central obscuration, where the zeroth order portion of the phase shifted EUV radiation beam is suppressed by blocking, via the central obscuration, the zeroth order portion of the phase shifted EUV radiation beam.

In an embodiment, where the projection system comprises an obscuration controller, the method includes modifying a type of central obscuration within the projection system based on the image to formed on the substrate, wherein the type of the central obscuration comprises one of: a circular shaped obscuration, a rectangular shaped obscuration, the rectangular shaped obscuration rotated by an angle, an ellipsoid shaped obscuration, a square shaped obscuration, or the square shaped obscuration rotated by an angle.

In an embodiment, the method includes adjusting, via the obscuration controller, a size of the central obscuration, where the size of the central obscuration is between 5% and 30% of a pupil plane of an EUV lithographic apparatus within which the projection system is included.

In an embodiment, there is provided a method comprising: generating an extreme ultraviolet (EUV) radiation beam; applying a phase shift to a portion of the EUV radiation beam; suppressing a zeroth order portion of the phase shifted EUV radiation beam; and directing, via a projection system, an unsuppressed portion of the phase shifted EUV radiation beam towards a substrate to form an image on the substrate.

In an embodiment, the projection system comprises a central obscuration, and causing the zeroth order portion of the phase shifted EUV radiation beam to be suppressed comprises: blocking, via the central obscuration, the zeroth order portion of the phase shifted EUV radiation beam.

In an embodiment, the method further comprises: modifying, via an obscuration controller of the projection system, a type of the central obscuration used within the projection system based on the image to formed on the substrate, wherein the type of the central obscuration comprises one of: a circular shaped obscuration, a rectangular shaped obscuration, the rectangular shaped obscuration rotated by an angle, an ellipsoid shaped obscuration, a square shaped obscuration, or the square shaped obscuration rotated by an angle.

In an embodiment, the method further comprises: adjusting, via the obscuration controller, a size of the central obscuration, wherein the size of the central obscuration used within the projection system is between 5% and 30% of a pupil plane of an EUV lithographic apparatus comprising the projection system.

The embodiments may further be described using the following clauses:

1. A lithographic apparatus, comprising:
   a patterning device comprising one or more two-dimensional (2D) features, wherein the patterning device is configured to shape a radiation beam output from a source;
   a projection system configured to:
      suppress at least a zeroth order portion of the shaped radiation beam, and
      direct an unsuppressed portion of the shaped radiation beam towards a substrate to form an image on the substrate according to the one or more 2D features.

2. The lithographic apparatus of clause 1, wherein the projection system comprises a filter that suppresses the zeroth order portion.

3. The lithographic apparatus of clause 2, wherein the filter comprises a central obscuration configured to suppress the zeroth order portion by blocking the zeroth order portion.

4. The lithographic apparatus of clause 3, wherein the one or more 2D features comprise a diamond-like shape.

5. The lithographic apparatus of clause 3, wherein the filter further comprises: a distribution of blocking elements arranged to suppress interference between first order portions of the shaped radiation beam.

6. The lithographic apparatus of clause 5, wherein the distribution of blocking elements comprises absorbers or reflective elements, and a number of blocking elements included in the distribution is related to a symmetry of a unit cell comprising the one or more 2D features.

7. The lithographic apparatus of clause 2, wherein the filter comprises a reflective filter including a central aperture that suppresses the zeroth order portion by:
   reflecting the unsuppressed portion,
   directing the unsuppressed portion to the substrate, and
   preventing the zeroth order portion from imaging the substrate.

8. The lithographic apparatus of clause 1, wherein the projection system comprises: a central obscuration configured to suppress the zeroth order portion by blocking the zeroth order portion.

9. The lithographic apparatus of clause 8, wherein the projection system comprises: a filter comprising a distribution of blocking elements configured to suppress interference between first order portions of the shaped radiation beam.

10. The lithographic apparatus of clause 8, wherein the projection system comprises:
    a first reflective element proximate the patterning device; and
    a second reflective element proximate the substrate, wherein the first reflective element and the second reflective element each include an aperture along an axis associated with the zeroth order portion such that the central obscuration blocks the zeroth order portion.

11. The lithographic apparatus of clause 10, wherein the patterning device comprises:
    a phase shift mask configured to apply a phase shift to the radiation beam such that the shaped radiation beam includes the zeroth order portion shifted to the first order portions.

12. The lithographic apparatus of clause 11, wherein the one or more 2D features comprise a diamond-like shape, the phase shift mask comprises a 0-degree and 180-degree phase shift and is configured to suppress the zeroth order portion.

13. The lithographic apparatus of clause 12, wherein the projection system further comprises:
    a filter configured to suppress interference between first order portions of the shaped radiation beam, wherein an intensity of the shaped radiation beam with the zeroth order suppressed and the interference between the first order portions suppressed is increased by a factor of four relative to the lithographic apparatus absent the filter.

14. The lithographic apparatus of clause 11, wherein the one or more 2D features are arranged in a honeycomb-like pattern, the phase shift mask comprises one of: (i) a 0-degree and 180-degree phase shift, or (ii) a 0-degree, 120-degree, and −120-degree phase shift, and the phase shift mask is configured to suppress the zeroth order portion.

15. The lithographic apparatus of clause 14, further comprising:
    a filter configured to suppress interference between first order portions of the shaped radiation beam, wherein an intensity of the shaped radiation beam with the zeroth order suppressed and the interference between the first order portions suppressed is increased by a factor of eight relative to the lithographic apparatus absent the filter.

16. The lithographic apparatus of clause 1, wherein:

the radiation beam is configured by the source to have a wavelength in the extreme ultraviolet (EUV) range; and the lithographic apparatus comprises an EUV lithographic apparatus.

17. The lithographic apparatus of clause 1, wherein the projection system is formed in a Schwarzschild-like optical design and functions as a 2D interferometric printer.

18. A method, comprising:

causing a radiation beam, output by a source, to be shaped by a patterning device comprising one or more two-dimensional (2D) features;

causing, via a projection system, at least a zeroth order portion of the shaped radiation beam to be suppressed; and directing, via the projection system, an unsuppressed portion of the shaped radiation beam towards a substrate to form an image on the substrate according to the one or more 2D features.

19. The method of clause 18, further comprising:

receiving the radiation beam output by the source, wherein the radiation beam has a wavelength in the extreme ultraviolet (EUV) range, and wherein the shaped radiation beam comprises a shaped EUV radiation beam.

20. A projection system included within an extreme ultraviolet (EUV) lithographic apparatus, comprising:

a filter configured to suppress at least a zeroth order portion of a shaped EUV radiation beam, wherein an EUV radiation beam output from a source is shaped via one or more two-dimensional (2D) features of a patterning device to form the shaped EUV radiation beam; and one or more reflective elements configured to directed an unsuppressed portion of the shaped EUV radiation beam towards a substrate to form an image on the substrate according to the one or more 2D features.

21. A lithographic apparatus configured to project, via a radiation beam, a pattern of a patterning device onto a substrate, wherein the patterning device is configured to shape the radiation beam in accordance with the pattern, the lithographic apparatus comprising:

a projection system configured to:

suppress a zeroth order portion of a shaped radiation beam, and direct an unsuppressed portion of the shaped radiation beam to a substrate.

22. The lithographic apparatus of clause 21, wherein the projection system comprises a filter that suppresses the zeroth order portion.

23. The lithographic apparatus of clause 22, wherein the filter comprises an obscuration configured to suppress the zeroth order portion by blocking the zeroth order portion.

24. The lithographic apparatus of clause 23, further comprising:

a sub-system configured to control at least one of: a size of the obscuration, a shape of the obscuration, and a location of the obscuration relative to the projection system.

25. The lithographic apparatus of clause 23, wherein the obscuration is configured to block between 5% and 30% of an area of an aperture stop in a pupil plane of projection optics of the projection system.

26. The lithographic apparatus of clause 23, wherein the filter further comprises:

a distribution of blocking elements arranged to suppress interference between first order portions of the shaped radiation beam.

27. The lithographic apparatus of clause 26, wherein the distribution of blocking elements comprises absorbers or reflective elements, and a number of blocking elements included in the distribution is related to a symmetry of a unit cell comprising the one or more 2D features.

28. The lithographic apparatus of clause 22, wherein the filter comprises a reflective filter including a central aperture that suppresses the zeroth order portion by:

reflecting the unsuppressed portion, directing the unsuppressed portion to the substrate, and preventing the zeroth order portion from imaging the substrate.

29. The lithographic apparatus of clause 21, wherein the projection system comprises:

a first reflective element proximate the patterning device; and a second reflective element proximate the substrate, wherein the first reflective element and the second reflective element each include an aperture along an axis associated with the zeroth order portion such that an obscuration blocks the zeroth order portion.

30. The lithographic apparatus of clause 21, wherein the radiation beam is an extreme ultraviolet radiation (EUV) beam.

31. The lithographic apparatus of clause 21, wherein the projection system is formed in a Schwarzschild-like optical design and functions as a 2D interferometric printer.

32. A method for projecting, via a radiation beam, a pattern of a patterning device onto a substrate, wherein the patterning device is configured to shape the radiation beam in accordance with the pattern, comprising:

causing, via a projection system, a zeroth order portion of a shaped radiation beam to be suppressed; and directing, via the projection system, an unsuppressed portion of the shaped radiation beam towards a substrate to form an image on the substrate.

33. The method of clause 32, wherein the projection system comprises an obscuration, causing the zeroth order portion to be suppressed comprises:

blocking, using the obscuration, the zeroth order portion.

34. The method of clause 33, wherein causing the zeroth order portion to be suppressed comprises:

orienting the obscuration such that the obscuration is positioned in a path of the shaped radiation beam.

35. The method of clause 34, further comprising:

adjusting at least one of a size of the obscuration, a shape of the obscuration, or a location of the obscuration relative to a path of the shaped radiation beam based on an illumination mode used.

36. The method of clause 32, wherein the projection system comprises a filter, causing the zeroth order portion to be suppressed comprises:

filtering the shaped radiation beam such that the zeroth order portion is suppressed.

37. The method of clause 36, wherein the filter further comprises a distribution of blocking elements arranged, the method further comprises:

causing interference between first order portions of the shaped radiation beam to be suppressed using the distribution of blocking elements.

38. The method of clause 36, wherein the filter comprises a reflective filter including a central aperture, causing the zeroth order portion to be suppressed comprises: reflecting the unsuppressed portion;

directing the unsuppressed portion to the substrate; and preventing the zeroth order portion from imaging the substrate.

39. The method of clause 38, wherein:

a two-dimensional (2D) pattern of the patterning device is to be projected onto the substrate;

the 2D pattern comprises a topography that has a periodicity; and a projection of the 2D pattern onto the substrate has double the periodicity.

40. A projection system incorporated within a lithographic apparatus configured to project, via a radiation beam, a pattern of a patterning device onto a substrate, wherein the patterning device is configured to shape the radiation beam in accordance with the pattern, wherein the projection system comprises a filter configured to suppress a zeroth order portion of a shaped radiation beam, wherein an unsuppressed portion of the shaped radiation beam is directed towards a substrate to form an image on the substrate.

41. The projection system of clause 40, wherein the filter comprises a central obscuration configured to suppress the zeroth order portion of the shaped radiation beam by blocking the zeroth order portion of the shaped radiation beam.

42. The projection system of clause 41, further comprising:

an obscuration controller configured to modify a type of the central obscuration used by the projection system.

43. The projection system of clause 42, wherein the obscuration controller is further configured to:

adjust a size of the central obscuration based on the image to be formed on the substrate.

44. The projection system of clause 43, wherein the size of the central obscuration used within the projection system is between 5% and 30% of a pupil plane of the lithographic apparatus.

45. The projection system of clause 40, further comprising:

an obscuration holder configured to store different types of filters to be used within the projection system for suppressing the zeroth order portion of the shaped radiation beam.

46. An extreme ultraviolet (EUV) lithographic apparatus for forming an image on a substrate by use of an EUV radiation beam that is shaped by a patterning device comprising a pattern of reflective regions and partially reflective regions, wherein the partially reflective regions are configured to suppress and apply a phase shift to a portion of the EUV radiation beam, the EUV lithographic apparatus comprising:

a projection system configured to:

suppress a zeroth order portion of a shaped EUV radiation beam, and direct an unsuppressed portion of the shaped EUV radiation beam towards a substrate to form an image on the substrate.

47. The EUV lithographic apparatus of clause 46, wherein the projection system comprises: a central obscuration configured to suppress the zeroth order portion of the shaped EUV radiation beam by blocking the zeroth order portion of the shaped EUV radiation beam.

48. The EUV lithographic apparatus of clause 47, further comprising:

an obscuration controller configured to modify a type of the central obscuration used by the projection system.

49. The EUV lithographic apparatus of clause 48, wherein the type of the central obscuration comprises one of: a circular shaped obscuration, a rectangular shaped obscuration, the rectangular shaped obscuration rotated by an angle, an ellipsoid shaped obscuration, a square shaped obscuration, or the square shaped obscuration rotated by an angle.

50. The EUV lithographic apparatus of clause 48, wherein the type of central obscuration used within the projection system is selected based on the image to be formed on the substrate.

51. The EUV lithographic apparatus of clause 48, wherein the obscuration controller is further configured to:

adjust a size of the central obscuration based on the image to be formed on the substrate.

52. The EUV lithographic apparatus of clause 51, wherein the size of the central obscuration used within the projection system is between 5% and 30% of a pupil plane of the EUV lithographic apparatus.

53. The EUV lithographic apparatus of clause 46, wherein at least some of the shaped EUV radiation beam is in the zeroth order such that the projection system is configured to cause the image to be formed on the substrate using one or more non-zeroth order portions of the shaped EUV radiation beam.

54. An extreme ultraviolet (EUV) lithographic apparatus, comprising:

a patterning device support structure configured to support a patterning device comprising a pattern of reflective regions and partially reflective regions, wherein the patterning device is configured to shape an EUV radiation beam to form a shaped EUV radiation beam, and wherein the partially reflective regions are configured to suppress and apply a phase shift to a portion of the shaped EUV radiation beam; and a projection system configured to:

suppress a zeroth order portion of the shaped EUV radiation beam, and direct an unsuppressed portion of the shaped EUV radiation beam towards a substrate to form an image on the substrate.

55. The EUV lithographic apparatus of clause 54, wherein the projection system comprises: a central obscuration configured to suppress the zeroth order portion of the shaped EUV radiation beam by blocking the zeroth order portion of the shaped EUV radiation beam.

56. The EUV lithographic apparatus of clause 55, further comprising:

an obscuration controller configured to modify a type of the central obscuration used by the projection system.

57. The EUV lithographic apparatus of clause 56, wherein the type of the central obscuration comprises one of: a circular shaped obscuration, a rectangular shaped obscuration, the rectangular shaped obscuration rotated by an angle, an ellipsoid shaped obscuration, a square shaped obscuration, or the square shaped obscuration rotated by an angle.

58. The EUV lithographic apparatus of clause 57, wherein the type of central obscuration used within the projection system is selected based on the image to be formed on the substrate.

59. The EUV lithographic apparatus of clause 57, wherein the obscuration controller is further configured to:

adjust a size of the central obscuration based on the image to be formed on the substrate.

60. The EUV lithographic apparatus of clause 59, wherein the size of the central obscuration used within the projection system is between 5% and 30% of a pupil plane of the EUV lithographic apparatus.

61. The EUV lithographic apparatus of clause 54, wherein at least some of the shaped EUV radiation beam is in the zeroth order such that the projection system is configured to cause the image to be formed on the substrate using one or more non-zeroth order portions of the shaped EUV radiation beam.

62. A method, comprising:

generating an extreme ultraviolet (EUV) radiation beam;

applying a phase shift to a portion of the EUV radiation beam;

suppressing a zeroth order portion of the phase shifted EUV radiation beam; and directing, via a projection system, an unsuppressed portion of the phase shifted EUV radiation beam towards a substrate to form an image on the substrate.

63. The method of clause 62, wherein the projection system comprises a central obscuration, causing the zeroth order portion of the phase shifted EUV radiation beam to be suppressed comprises:

blocking, via the central obscuration, the zeroth order portion of the phase shifted EUV radiation beam.

64. The method of clause 63, further comprising:

modifying, via an obscuration controller of the projection system, a type of the central obscuration used within the projection system based on the image to formed on the substrate, wherein the type of the central obscuration comprises one of: a circular shaped obscuration, a rectangular shaped obscuration, the rectangular shaped obscuration rotated by an angle, an ellipsoid shaped obscuration, a square shaped obscuration, or the square shaped obscuration rotated by an angle.

65. The method of clause 64, further comprising:

adjusting, via the obscuration controller, a size of the central obscuration, wherein the size of the central obscuration used within the projection system is between 5% and 30% of a pupil plane of an EUV lithographic apparatus comprising the projection system.

Aspects of the invention can be implemented in any convenient form. For example, an embodiment may be implemented by one or more appropriate computer programs which may be carried on an appropriate carrier medium which may be a tangible carrier medium (e.g., a disk) or an intangible carrier medium (e.g., a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g., within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to cost constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

The invention claimed is:

1. A projection system for a lithographic apparatus, the projection system configured to project a radiation beam shaped by a patterning device along an optical path onto a substrate and the projection system comprising a filter configured to suppress a zeroth order portion of the shaped radiation beam, wherein an unsuppressed portion of the shaped radiation beam is directed towards a substrate to form an image on the substrate, wherein the filter comprises a central obscuration configured to suppress the zeroth order portion of the shaped radiation beam and the central obscuration is configurable within the projection system to different non-circular shapes or different sizes while the filter is in the optical path.

2. The projection system of claim 1, wherein the central obscuration is configured to suppress the zeroth order portion of the shaped radiation beam by blocking the zeroth order portion of the shaped radiation beam.

3. The projection system of claim 1, further comprising an obscuration controller configured to modify the shape or size of the central obscuration used by the projection system.

4. The projection system of claim 3, wherein the obscuration controller is further configured to adjust a size of the central obscuration based on the image to be formed on the substrate.

5. The projection system of claim 3, wherein the size of the central obscuration used within the projection system is between 5% and 30% of a pupil plane of the lithographic apparatus.

6. The projection system of claim 1, further comprising a holder configured to store different types of filters to be used within the projection system for suppressing the zeroth order portion of the shaped radiation beam.

7. An extreme ultraviolet (EUV) projection system for forming an image on a substrate by use of an EUV radiation beam that is shaped by a patterning device, the EUV projection system comprising:

a plurality of reflective elements, wherein at least one reflective element of the plurality of reflective elements system comprises an aperture to pass radiation therethrough, and wherein:

the aperture is arranged to pass the shaped EUV radiation beam therethrough and subsequently to receive therein a zeroth order portion of the shaped EUV radiation beam to suppress the zeroth order portion, while the at least one reflective element is configured to direct the unsuppressed portion of the shaped EUV radiation beam towards the substrate, or a reflecting element is located in an optical path of the shaped EUV radiation beam from the at least reflective element towards the substrate, the zeroth order portion suppressed at the reflecting element while the unsuppressed portion of the shaped EUV radiation beam passes the reflecting element towards the substrate.

8. The EUV projection system of claim 7, comprising a central obscuration configured to suppress the zeroth order portion of the shaped EUV radiation beam by blocking the zeroth order portion of the shaped EUV radiation beam.

9. The EUV projection system of claim 8, further comprising an obscuration controller configured to modify a type of the central obscuration used by the projection system.

10. The EUV projection system of claim 9, wherein the type of the central obscuration comprises: a circular shaped obscuration, a rectangular shaped obscuration, the rectangular shaped obscuration rotated by an angle, an ellipsoid shaped obscuration, a square shaped obscuration, or the square shaped obscuration rotated by an angle.

11. The EUV projection system of claim 9, wherein the obscuration controller is further configured to adjust a size of the central obscuration based on the image to be formed on the substrate.

12. The EUV projection system of claim 8, wherein the size of the central obscuration used within the projection system is between 5% and 30% of a pupil plane of the EUV projection system.

13. The EUV projection system of claim 7, wherein at least some of the shaped EUV radiation beam is in the zeroth order such that the projection system is configured to cause the image to be formed on the substrate using one or more non-zeroth order portions of the shaped EUV radiation beam.

14. An extreme ultraviolet (EUV) lithographic apparatus, comprising:

a patterning device support structure configured to support a patterning device comprising a pattern of reflective regions and partially reflective regions, wherein the patterning device is configured to shape an EUV radiation beam to form a shaped EUV radiation beam, and wherein the patterning device comprises an attenuated phase shift mask (PSM) having a hard PSM pattern; and a projection system configured to:

suppress a zeroth order portion of the shaped EUV radiation beam, and direct an unsuppressed portion of the shaped EUV radiation beam towards a substrate to form an image on the substrate.

15. The EUV lithographic apparatus of claim 14, wherein the projection system comprises a central obscuration configured to suppress the zeroth order portion of the shaped EUV radiation beam by blocking the zeroth order portion of the shaped EUV radiation beam.

16. The EUV lithographic apparatus of claim 15, further comprising an obscuration controller configured to modify a type of the central obscuration used by the projection system.

17. The EUV lithographic apparatus of claim 16, wherein the obscuration controller is further configured to adjust a size of the central obscuration based on the image to be formed on the substrate.

18. The EUV lithographic apparatus of claim 15, wherein the size of the central obscuration used within the projection system is between 5% and 30% of a pupil plane of the EUV lithographic apparatus.

19. The EUV lithographic apparatus of claim 14, wherein at least some of the shaped EUV radiation beam is in the zeroth order such that the projection system is configured to cause the image to be formed on the substrate using one or more non-zeroth order portions of the shaped EUV radiation beam.

20. A method, comprising:

generating an extreme ultraviolet (EUV) radiation beam;

applying a phase shift to a portion of the EUV radiation beam using a patterning device comprising an attenuated phase shift mask (PSM) having a hard PSM pattern;

suppressing a zeroth order portion of the phase shifted EUV radiation beam; and directing, via a projection system, an unsuppressed portion of the phase shifted EUV radiation beam towards a substrate to form an image on the substrate.

* * * * *